United States Patent
Callahan et al.

(10) Patent No.: US 9,268,883 B2
(45) Date of Patent: *Feb. 23, 2016

(54) USER INTERFACE FOR PRESENTING INFORMATION ABOUT A PRODUCT STRUCTURE FOR A PRODUCT

(75) Inventors: Sean M. Callahan, Bellevue, WA (US); Carl A. Pearson, Kirkland, WA (US); John Terry Monahan, Seattle, WA (US)

(73) Assignee: THE BOEING COMPANY, Chicago, IL (US)

( * ) Notice: Subject to any disclaimer, the term of this patent is extended or adjusted under 35 U.S.C. 154(b) by 298 days.

This patent is subject to a terminal disclaimer.

(21) Appl. No.: 13/445,227

(22) Filed: Apr. 12, 2012

(65) Prior Publication Data

US 2014/0157194 A1    Jun. 5, 2014

Related U.S. Application Data

(63) Continuation-in-part of application No. 12/714,270, filed on Feb. 26, 2010.

(51) Int. Cl.
*G06F 17/30* (2006.01)
*G06F 17/50* (2006.01)
*G06Q 10/06* (2012.01)

(52) U.S. Cl.
CPC .......... *G06F 17/50* (2013.01); *G06F 17/30292* (2013.01); *G06Q 10/06* (2013.01)

(58) Field of Classification Search
CPC ............................. G06F 17/2241; G06F 17/227
USPC .......................................................... 715/234
See application file for complete search history.

(56) References Cited

U.S. PATENT DOCUMENTS

| | | | |
|---|---|---|---|
| 6,094,654 A * | 7/2000 | Van Huben et al. | |
| 7,038,677 B2 | 5/2006 | Callahan | |
| 7,085,776 B2 | 8/2006 | Callahan | |
| 7,945,589 B1 * | 5/2011 | Weiss et al. | 707/795 |
| 2007/0033204 A1 | 2/2007 | Callahan | |
| 2009/0070368 A1 | 3/2009 | Callahan | |
| 2009/0327879 A1 * | 12/2009 | Ferragut et al. | 715/256 |
| 2010/0011302 A1 * | 1/2010 | Stein et al. | 715/753 |

OTHER PUBLICATIONS

Callahan, "Extended Generic Product Structure: An Information Model for Representing Product Families," Journal of Computing and Information Science in Engineering; vol. 6, Issue 3; Sep. 2006; 68 pages.

* cited by examiner

*Primary Examiner* — Scott Baderman
*Assistant Examiner* — Seung Jung
(74) *Attorney, Agent, or Firm* — Yee & Associates, P.C.

(57) ABSTRACT

A method and apparatus for managing variations in a product structure for a product comprising a data manager and a visualizer. The data manager is configured to manage variations in the product structure using a model. The model includes a group of master objects having a primary hierarchical organization and a group of configuration objects having a number of secondary hierarchical organizations. Each secondary hierarchical organization in the number of secondary hierarchical organizations is associated with the primary hierarchical organization and configured to represent a variant of the product. A number of configuration objects in a secondary hierarchical organization represents a number of variations in the product structure for the product. The visualizer is configured to visually present, in a graphical user interface, information for an object selected from one of a master object in the group of master objects and a configuration object in the group of configuration objects.

19 Claims, 29 Drawing Sheets

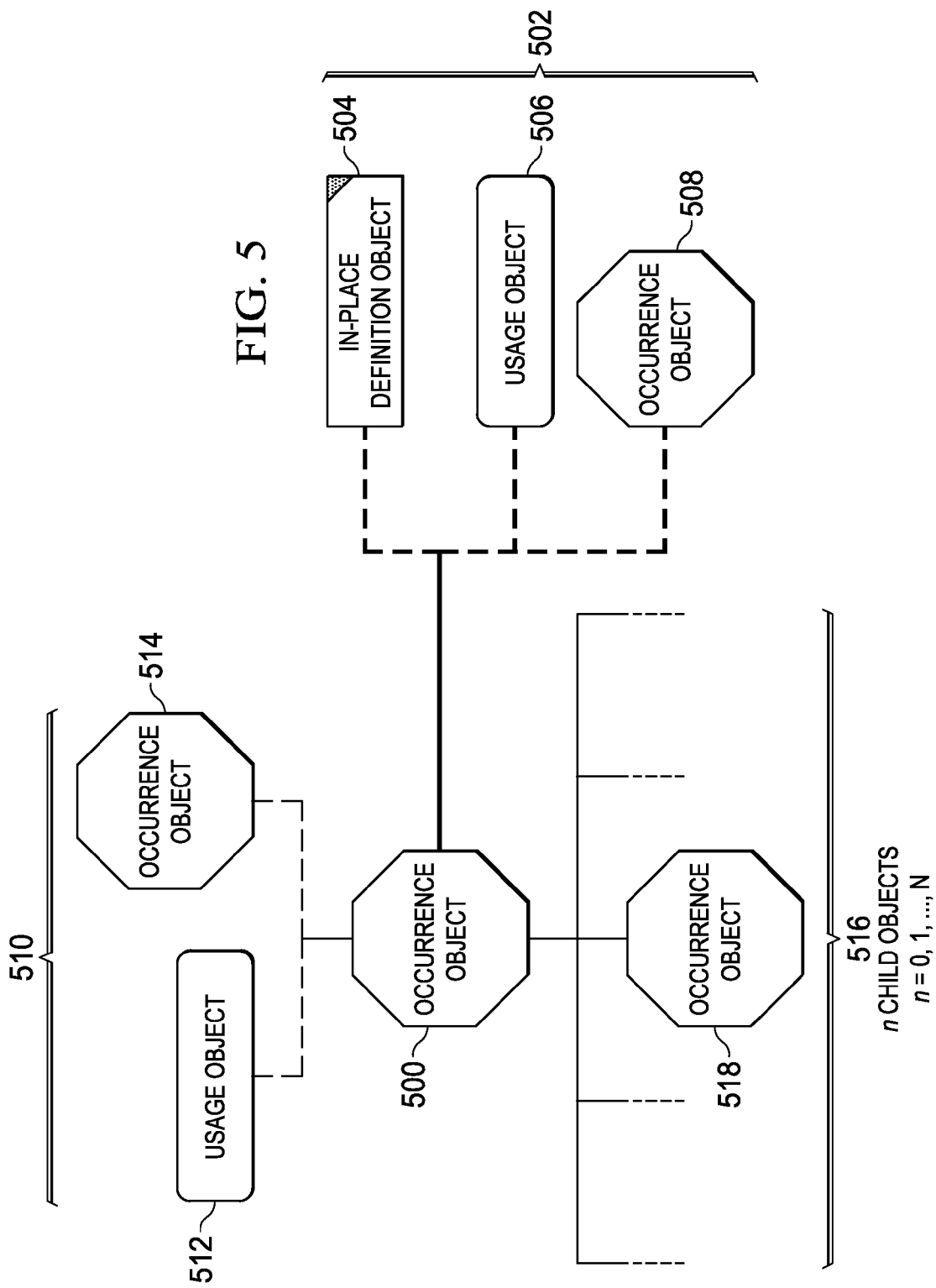

FIG. 29

| MV Usage::System 1802 | 1804 12B-A | 12B-B | Type 1806 | Lvl 1808 | Status 1810 |
|---|---|---|---|---|---|
| TwelveBrick | 12B-A | 12B-B | Mechanical | 0 | top |
| Upper::SixBrick | NH::6B-A | H::6B-B | Mechanical Usg | 1 | modified |
| Occ1_Upper::TwoBrick | Occ1_NH::2B-A | Occ1_H::2B-B | Mechanical Occ | 2 | modified |
| Occ2_Left::Brick | Occ2_NH::1B_NH | Occ2_H::1B-H | Mechanical Occ | 3 | modified |
| Occ2_Right::Brick | Occ2_NH::1B_NH | Occ2_NH::1B_NH | Mechanical Occ | 3 | same |
| Occ1_TopTwoBrick | Occ1::TB | Occ1::TB | In-Place Design Occ | 2 | same |
| Occ1_TopLeft::Brick | Occ1_NH::1B_NH | Occ1_NH::1B_NH | Mechanical Occ | 3 | same |
| Occ1_TopRight::Brick | Occ1_NH::1B_NH | Occ1_NH::1B_NH | Mechanical Occ | 3 | same |
| Occ1_Lower::TwoBrick | Occ2_NH::2B-A | Occ2_NH::2B-A | Mechanical Occ | 2 | same |
| Occ2_Left::Brick | Occ1_NH::1B_NH | Occ1_NH::1B_NH | Mechanical Occ | 3 | same |
| Occ2_Right::Brick | Occ2_NH::1B_NH | Occ2_NH::1B_NH | Mechanical Occ | 3 | same |
| Lower::SixBrick | NH::6B-A | NH::6B-A | Mechanical Usg | 1 | same |
| Occ1::TopTwoBrick | Occ1::TB | Occ1::TB | In-Place Design Occ | 2 | same |
| Occ1_TopLeft::Brick | Occ1_NH::1B_NH | Occ1_NH::1B_NH | Mechanical Occ | 3 | same |
| Occ1_TopRight::Brick | Occ1_NH::1B_NH | Occ1_NH::1B_NH | Mechanical Occ | 3 | same |
| Occ1_Lower::TwoBrick | Occ1_NH::2B-A | Occ1_NH::2B-A | Mechanical Occ | 2 | same |
| Occ2_Left::Brick | Occ1_NH::1B_NH | Occ1_NH::1B_NH | Mechanical Occ | 3 | same |
| Occ2_Right::Brick | Occ2_NH::1B_NH | Occ2_NH::1B_NH | Mechanical Occ | 3 | same |

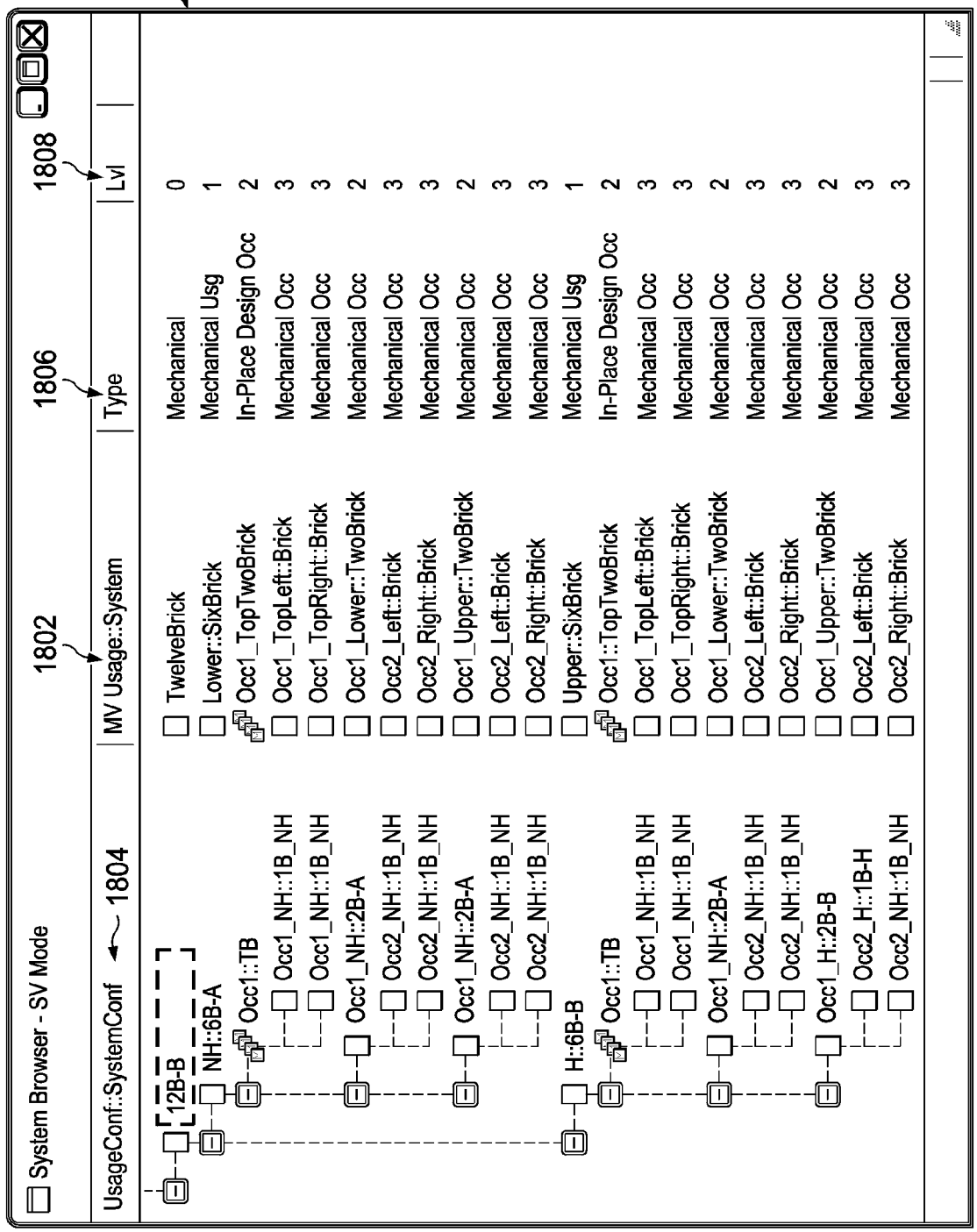

FIG. 33A

| TERMS | DESCRIPTIONS |
|---|---|
| PRODUCT | ANY ITEM THAT HAS BEEN PRODUCED BY LABOR OR EFFORT OR ANY ITEM THAT RESULTS FROM AN ACT OR PROCESS |
| TANGIBLE PRODUCT | ANY PHYSICAL OBJECT THAT CAN BE PERCEIVED BY TOUCH |
| INTANGIBLE PRODUCT | ANY ITEM THAT CAN BE PERCEIVED ONLY INDIRECTLY AND NOT BY TOUCH |
| LEAF COMPONENT | A COMPONENT THAT DOES NOT HAVE ANY SUB-COMPONENTS |
| ASSEMBLY COMPONENT | A COMPONENT MADE UP OF TWO OR MORE SUB-COMPONENTS |
| SUB-ASSEMBLY COMPONENT | AN ASSEMBLY COMPONENT THAT IS PART OF ANOTHER ASSEMBLY COMPONENT |
| PRODUCT STRUCTURE | A LOGICAL HIERARCHICAL DECOMPOSITION OF A PRODUCT WITH RESPECT TO THE COMPONENTS THAT MAKE UP THE PRODUCT |
| MODEL | A COMPUTER-BASED REPRESENTATION OF A PRODUCT |
| CONFIGURATION | A PARTICULAR IMPLEMENTATION FOR A COMPONENT |
| MASTER OBJECT | AN OBJECT BELONGING TO A MASTER CLASS |
| DEFINITION OBJECT | A MASTER OBJECT BELONGING TO A DEFINITION CLASS |
| USAGE OBJECT | A MASTER OBJECT BELONGING TO A USAGE CLASS |
| OCCURRENCE OBJECT | A MASTER OBJECT BELONGING TO AN OCCURRENCE CLASS |
| CONFIGURATION OBJECT | AN OBJECT BELONGING TO A CONFIGURATION CLASS |
| DEFINITION CONFIGURATION OBJECT | A CONFIGURATION OBJECT BELONGING TO A DEFINITION CONFIGURATION CLASS |
| USAGE CONFIGURATION OBJECT | A CONFIGURATION OBJECT BELONGING TO A USAGE CONFIGURATION CLASS |
| OCCURRENCE CONFIGURATION OBJECT | A CONFIGURATION OBJECT BELONGING TO AN OCCURRENCE CONFIGURATION CLASS |
| INSTANTIATION | A USAGE OR AN OCCURRENCE OF AN OBJECT |
| HIERARCHICAL STRUCTURE | A REPRESENTATION OF AN ARRANGEMENT OF ITEMS IN WHICH THE ITEMS ARE REPRESENTED AS BEING ABOVE, BELOW, OR AT THE SAME LEVEL AS ONE ANOTHER |
| ROOT OBJECT | AN OBJECT AT THE TOPMOST LEVEL IN A HIERARCHICAL STRUCTURE |
| PARENT OBJECT | AN OBJECT HAVING ONE OR MORE CHILD OBJECTS AT A LEVEL IN A HIERARCHICAL STRUCTURE THAT IS ONE LEVEL BELOW THE LEVEL OF THE OBJECT |
| CHILD OBJECT | AN OBJECT HAVING ONE OR MORE PARENT OBJECTS AT A LEVEL IN A HIERARCHICAL STRUCTURE THAT IS ONE LEVEL ABOVE THE LEVEL OF THE OBJECT |

FIG. 33B

| TERMS | DESCRIPTIONS |
|---|---|
| MAIN STRUCTURE | A HIERARCHCIAL STRUCTURE |
| ASSOCIATED STRUCTURE | A HIERARCHICAL STRUCTURE ASSOCIATED WITH THE MAIN STRUCTURE IN WHICH AN OBJECT IN THE MAIN STRUCTURE IS AN INSTANTIATION OF THE ROOT OBJECT OF THE ASSOCIATED STRUCTURE |
| HIERARCHICAL ORGANIZATION | AN ORGANIZATION OF OBJECTS COMPRISING A MAIN STRUCTURE AND A NUMBER OF ASSOCIATED STRUCTURES |
| PRIMARY HIERARCHICAL ORGANIZATION | AN ORGANIZATION OF MASTER OBJECTS COMPRISING A MAIN STRUCTURE AND A NUMBER OF ASSOCIATED SUBSTRUCTURES |
| SECONDARY HIERARCHICAL ORGANIZATION | AN ORGANIZATION OF CONFIGURATION OBJECTS COMPRISING A MAIN STRUCTURE AND A NUMBER OF ASSOCIATED STRUCTURES |
| STRUCTURAL LINK | A LINK BETWEEN TWO OBJECTS THAT INDICATES THAT ONE OF THE OBJECTS IS THE CHILD OBJECT OF THE OTHER OBJECT |
| PRIMARY STRUCTURAL LINK | A STRUCTURAL LINK BETWEEN TWO MASTER OBJECTS IN A PRIMARY HIERARCHICAL ORGANIZATION |
| SECONDARY STRUCTURAL LINK | A STRUCTURAL LINK BETWEEN TWO CONFIGURATION OBJECTS IN A PRIMARY HIERARCHICAL ORGANIZATION |
| INSTANCE LINK | A LINK BETWEEN TWO OBJECTS THAT INDICATES THAT ONE OBJECT IS AN INSTANTIATION OF THE OTHER OBJECT |
| PRIMARY INSTANCE LINK | AN INSTANCE LINK BETWEEN TWO MASTER OBJECTS |
| SECONDARY INSTANCE LINK | AN INSTANCE LINK BETWEEN TWO CONFIGURATION OBJECTS |

USER INTERFACE FOR PRESENTING INFORMATION ABOUT A PRODUCT STRUCTURE FOR A PRODUCT

CROSS-REFERENCE TO RELATED APPLICATION

This application is a continuation-in-part of U.S. patent application Ser. No. 12/714,270, filed Feb. 26, 2010, entitled "User Interface and Method for Displaying Representation of a System Modeled According to a Plurality of Structural Elements", which is incorporated herein by reference.

BACKGROUND INFORMATION

1. Field

The present disclosure relates generally to managing a model of a product structure for a product and, in particular, to a method and apparatus for using the model to manage and present information about variations in the product structure for the product.

2. Background

A product may be any item that has been produced by labor or effort or any item that results from an act or process. Oftentimes, different variants of a product may be designed and produced. Variants of a product may differ in one or more properties with respect to the design for the product. Oftentimes, computer software, such as, for example, computer-aided design (CAD) programs, may be used to manage the designs of products. For example, computer-aided design models may be used to manage the designs of complex products. A complex product may comprise, for example, without limitation, thousands to millions of components.

As the number of components that make up a product increases, managing the different possible variations in the design for that product may become more difficult. In particular, managing the different variations in the design for a complex product may take more time, effort, resources, and/or processing power than desired.

For example, with some currently available computer-aided design programs for modeling the design of a product, adding a variation to the design of a complex product in a model may require adding redundant data to the model for the design of the complex product. For example, capturing a modification to the design of the complex product in the model may require copying and/or duplicating more data than just the data associated with the modification.

This type of redundancy of data within the model may increase the amount of time, effort, and cost needed to manage the model relative to a desired amount of time, effort, and cost, respectively. Therefore, it would be desirable to have a method and apparatus that takes into account at least some of the issues discussed above as well as possibly other issues.

SUMMARY

In one illustrative embodiment, a product management system for managing variations in a product structure for a product comprising a data manager and a visualizer. The data manager is configured to manage the variations in the product structure for the product using a model. The model includes a group of master objects having a primary hierarchical organization and a group of configuration objects having a number of secondary hierarchical organizations. Each secondary hierarchical organization in the number of secondary hierarchical organizations is associated with the primary hierarchical organization and is configured to represent a variant of the product. A number of configuration objects in a secondary hierarchical organization represents a number of variations in the product structure for the product. The visualizer is configured to visually present, in a graphical user interface, information for an object selected from one of a master object in the group of master objects and a configuration object in the group of configuration objects.

In another illustrative embodiment, an apparatus for managing variations in a product structure for a product comprises a data manager and a visualizer. The data manager is configured to manage the variations in the product structure for the product using a model. The model includes a group of master objects having a primary hierarchical organization and a group of configuration objects having a number of secondary hierarchical organizations associated with the primary hierarchical organization. A master object in the group of master objects is selected from one of a definition object, a usage object, and an occurrence object. A configuration object in the group of configuration objects is selected from one of a definition configuration object, a usage configuration object, and an occurrence configuration object. The configuration object is a configuration corresponding to the master object in the group of master objects. The visualizer is configured to visually present information for an object selected from one of the master object and the configuration object in a graphical user interface.

In yet another illustrative embodiment, a computer-implemented method for managing variations in a product structure for a product is provided. A model of the product structure for the product is received at a processor. The model includes a group of master objects having a primary hierarchical organization and a group of configuration objects having a number of secondary hierarchical organizations. Each secondary hierarchical organization in the number of secondary hierarchical organizations is associated with the primary hierarchical organization and is configured to represent a variant of the product. A number of configuration objects in a secondary hierarchical organization represents a number of variations in the product structure for the product. Information for an object selected from one of a master object in the group of master objects and a configuration object in the group of configuration objects is displayed in a graphical user interface on the display system using the processor in conjunction with a display system.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives, and features thereof will best be understood by reference to the following detailed description of an illustrative embodiment of the present disclosure when read in conjunction with the accompanying drawings, wherein:

FIG. 5 is an illustration of an occurrence object in the form of a block diagram in accordance with an illustrative embodiment;

FIGS. 19-31 are illustrations of a graphical user interface in accordance with an illustrative embodiment;

FIGS. 33A and 33B are tables of terms and descriptions for the terms in accordance with an illustrative embodiment.

DETAILED DESCRIPTION

Figure 1:
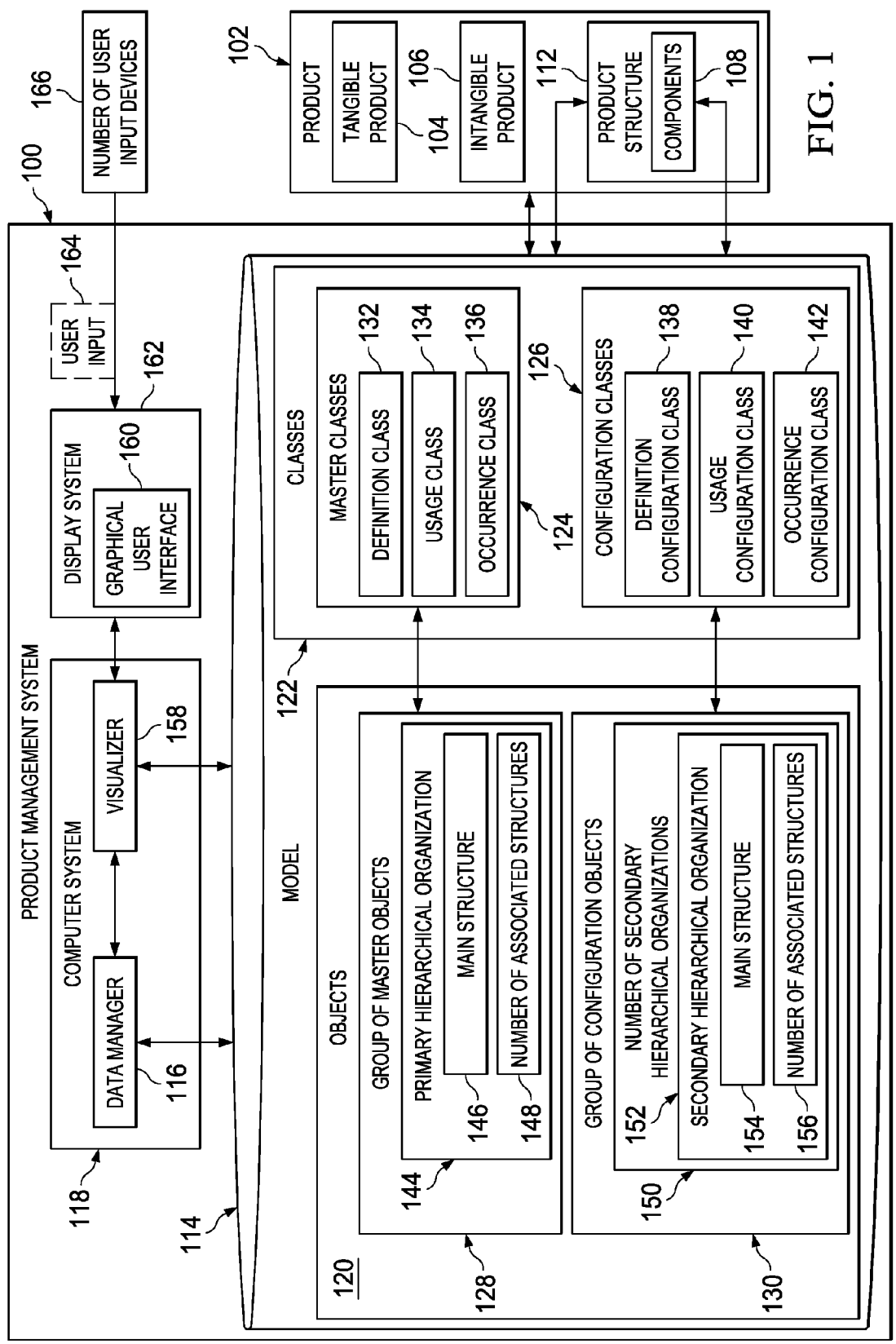
FIG. 1 is an illustration of a product management system in the form of a block diagram in accordance with an illustrative embodiment.

The different illustrative embodiments recognize and take into account different considerations. For example, the different illustrative embodiments recognize and take into account that some currently available computer-aided design (CAD) programs for modeling the design of a complex product may not allow the sharing of common data between variants of a product.

For example, in some cases, with some currently available computer-aided design (CAD) programs, a model of the design for a product may be created for each variant of the product. These programs may not allow data that is common between these models to be shared. Consequently, the amount of data that may need to be stored to capture the different possible variations in the design for a product may require more processing power, data storage, and/or other computer resources than desired.

Further, managing the associations between redundant data and the different variations in the design for a product may require more time and effort than desired. Additionally, the existence of redundant data may make it more difficult than desired to understand the differences between design variants. Consequently, this increase in difficulty and the complexity added by the redundant data may lead to undesired inconsistencies when forming a product. Reworking the product to correct these undesired inconsistencies may be more expensive than desired.

The different illustrative embodiments recognize and take into account that a model that is capable of capturing different possible variations in the design for a product may be desirable. In particular, the different illustrative embodiments recognize and take into account that it may be desirable to have a model that is capable of capturing these different variations without increasing the amount of redundant data in the model more than desired.

Thus, the illustrative embodiments may provide an organization schema for representing variants of a product in a manner that minimizes storage requirements and processing power. For example, in the past, one technique for storing multiple variations of a product was to store a complete schematic for each variant of the product. This old technique may have been used even for minor variations among embodiments of the product.

In an extreme example, even though the only difference between two aircraft is a single pump or actuator, an entire aircraft schematic may have been saved for both aircraft system designs. A first complete aircraft systems schematic may have been saved for a first aircraft and a second complete aircraft systems schematic may have been saved for a second aircraft, when the only difference between the two aircraft system schematics was a single different pump or actuator. As a result, most of the same data may be redundantly saved twice, thereby using storage space undesirably and making it difficult to understand what has changed between the two system design configurations.

However, when using this old technique for storing hundreds of variants of a product that may include hundreds of thousands or even millions of components, the amount of storage space and processing power used to store, compare, and manipulate variations among product schemas may become undesirable due to vast redundancies in stored data. The illustrative embodiments address this issue, and other issues, by providing an organization schema for representing variations in a product using a minimum amount of storage space.

The different illustrative embodiments recognize and take into account that a model that supports sharing of product data between the designs of completely configured variants within a family of products may be desirable. The different illustrative embodiments provide a model that allows data that is common between different variations of a product structure for a product to be shared by different representations of the components for the components in the product. The model allows design data for the product to be shared across a plurality of levels in the hierarchy for the product structure for the product.

Thus, the illustrative embodiments may minimize or eliminate redundant data when representing multiple variations in a product. Further, the different illustrative embodiments may provide a model that may be used to accurately identify and present the differences between product design configurations without using redundant data. In this manner, understanding of the differences between product design configurations may be increased. In particular, an operator may be able to more easily find and understand the differences between product designs using the model provided in the different illustrative embodiments.

For example, in the model provided by the different illustrative embodiments, adding a representation of a change in one component in a sub-assembly to the model does not require that all of the objects representing the components in the sub-assembly be duplicated in the model. This feature is a feature of the completely configured model and is provided without the use of any filtering mechanisms. The model recognizes an overall organization for the product structure for the product that may act as a template for the different variants of the product. In this manner, data sharing between representations of the different variants of the product may be maximized.

Further, the model provided by the different illustrative embodiments may be used for different abstractions of the product structure for the product. These abstractions may include, for example, without limitation, a geometric design, a logical systems design, or some other suitable type of abstraction. The model achieves data scalability for hierarchical product structures such that the amount of new data added to a model to add a representation of a new variant for a product may be proportional to the amount of design change required for the new variant. These different abstractions may be achieved by sub-classing or typing the classes.

Thus, the different illustrative embodiments may provide a method and apparatus for managing variations in a product structure for a product using a model for the product structure. A listing of the different terms related to the different illustrative embodiments and descriptions of these terms, as used herein, may be found in FIGS. 33A-33B below.

Referring now to the figures, FIG. 1 is an illustration of a product management system in the form of a block diagram, depicted in accordance with an illustrative embodiment. In these illustrative examples, product management system 100 may be configured to manage and visually present information about product 102. As used herein, a "product", such as product 102, may be any item that has been produced by labor or effort or any item that results from an act or process.

Product 102 may be selected from one of tangible product 104 and intangible product 106. As used herein, a "tangible product", such as tangible product 104, may be any physical object that can be perceived by touch. For example, tangible product 104 may take the form of, without limitation, a mobile platform, a stationary platform, a vehicle, a house, an electromechanical system, an engine, a robotic machine, a tool, a computer system, an appliance, a manmade structure, a building, a piece of furniture, a writing instrument, a container, an aircraft, or some other suitable type of tangible object. In one illustrative example, product 102 is tangible product 104, which may be an aircraft comprising at least 100,000 components.

As used herein, an "intangible product", such as intangible product 106, may be any item that can be perceived only indirectly and not by touch. For example, intangible product 106 may take the form of, without limitation, a business organizational product, a power point presentation, a logical systems design, a build plan, an assembly sequence, a manufacturing plan, a simulation model, a functional design, a computer-aided design (CAD) model, a policy, a handbook, a dance routine, or some other suitable type of intangible item.

In these illustrative examples, product 102 may comprise components 108. Components 108 may be the different items that, together, form product 102. Components 108 may include tangible components or intangible components, depending on the implementation. In some illustrative examples, components 108 for tangible product 104 may include both tangible and intangible components. Of course, components 108 for intangible product 106 may include only intangible components in these illustrative examples.

Each component in components 108 may be described as either a leaf component or an assembly component. As used herein, a "leaf component" may be a component that does not have any sub-components. In other words, a leaf component may be a primary constituent of product 102 that is not made up of other components. In some cases, product 102 may be a leaf component. In other words, product 102 may be a single component that is indivisible and does not have any sub-components.

An "assembly component", as used herein, may be made up of two or more sub-components. Product 102 may be considered an assembly component in these examples. In some cases, a sub-component of an assembly component may be a leaf component or another assembly component. Further, an assembly component that is part of another assembly component may be referred to as a sub-assembly component.

As depicted, product 102 may have product structure 112. In these illustrative examples, product structure 112 may be a logical hierarchical decomposition of product 102 with respect to components 108 that make up product 102. In other words, product structure 112 may describe the relationships between components 108 as well as the sub-components that make up assembly components in components 108.

In some cases, product structure 112 may be the logical hierarchical decomposition of a design for product 102 with respect to components 108 that make up product 102. Further, product structure 112 may capture a standard configuration for product 102 and components 108 in product 102. In some illustrative examples, product structure 112 may be referred to as a bill of materials (BOM).

The logical hierarchical decomposition of product 102 in product structure 112 may be based on a selected level of abstraction for describing components 108 that make up product 102. For example, components 108 that make up product 102 may be organized in product structure 112 according to one of a selected level of detail, a selected domain for components 108, or some other suitable level of abstraction for describing components 108 that make up product 102.

Product management system 100 may be configured to manage product structure 112 for product 102. In particular, data manager 116 in product management system 100 may manage product structure 112 of product 102. Data manager 116 may be implemented using hardware, software, or a combination of the two.

For example, data manager 116 may be implemented in computer system 118. Computer system 118 may comprise one or more computers. When more than one computer is present in computer system 118, these computers may be in communication with each other. An example of one manner in which computer system 118 may be implemented is described in FIG. 34 below.

In these illustrative examples, data manager 116 in product management system 100 may manage product structure 112 for product 102 using model 114. Model 114 may be a representation of product structure 112 in a form that is substantially comprehensive and yet comprehensible. Further, model 114 may be configured to represent variations in product structure 112 that may result in different variants of product 102. Data manager 116 may manage variations in product structure 112 for product 102 using model 114.

As depicted, model 114 may include objects 120 belonging to classes 122. Objects 120 may represent components 108 and/or types of components 108 that make up product 102. An object in objects 120 that belongs to a particular class in classes 122 may be of the type of that particular class. In other words, an object belonging to a particular class may share the same attributes as the attributes for that particular class.

In object-oriented programming, an object may be referred to as an "instance" of a class. However, in these illustrative examples, the word "instance" and "instantiation" are used differently. As used herein, an "instance" or an "instantiation" of an item may mean a usage of that item in model 114. For example, an instantiation of an object, such as one of objects 120, may be a usage of that object in model 114.

In these illustrative examples, classes 122 include master classes 124 and configuration classes 126. Objects 120 in model 114 may include group of master objects 128 belonging to master classes 124 and group of configuration objects 130 belonging to configuration classes 126. As used herein, a "group of" items means one or more items. For example, group of master objects 128 may mean one or more master objects.

As depicted, master classes 124 may include definition class 132, usage class 134, and occurrence class 136. An object belonging to definition class 132 may be referred to as a definition object. An object belonging to usage class 134 may be referred to as a usage object. An object belonging to occurrence class 136 may be referred to as an occurrence object. In this manner, a definition object, a usage object, and an occurrence object are examples of master objects.

Group of master objects 128 may include any number of objects belonging to definition class 132, usage class 134, and/or occurrence class 136. Examples of implementations for definition objects, usage objects, and occurrence objects in group of master objects 128 are described in greater detail in FIGS. 2-5 below.

In these illustrative examples, a configuration object belonging to one of configuration classes 126 may correspond to a master object belonging to one of master classes 124. In particular, the configuration object may represent a configuration for the component in product 102 represented by the corresponding master object.

As used herein, a "configuration" for a component may be a particular implementation for that component. For example, a configuration for a component in product 102 may be a variation in product structure 112 for product 102 or may be associated with a particular variation in product structure 112 for product 102.

Different configurations of the same component may, for example, without limitation, have different features, have different properties, have different shapes, comprise different materials, have different attachments, and/or have other differing characteristics. In these examples, a configuration object may belong to only one master object. However, more than one configuration object may belong to the same master object.

Configuration classes 126 may include definition configuration class 138, usage configuration class 140, and occurrence configuration class 142. An object belonging to definition configuration class 138 may be referred to as a definition configuration object. An object belonging to usage configuration class 140 may be referred to as a usage configuration object. An object belonging to occurrence configuration class 142 may be referred to as an occurrence configuration object. In this manner, a definition configuration object, a usage configuration object, and an occurrence configuration object are examples of configuration objects.

Group of configuration objects 130 may include any number of objects belonging to definition configuration class 138, usage configuration class 140, and occurrence configuration class 142. Examples of implementations for definition configuration objects, usage configuration objects, and occurrence configuration objects in group of configuration objects 130 are described in greater detail in FIGS. 6-9 below.

In these illustrative examples, group of master objects 128 may be organized into primary hierarchical organization 144 in model 114. For example, without limitation, group of master objects 128 may be related to each other in model 114 such that group of master objects 128 have primary hierarchical organization 144 with respect to product 102.

Primary hierarchical organization 144 may comprise main structure 146 and number of associated structures 148. As used herein, a "number of" items means one or more items. For example, number of associated structures 148 may mean one or more associated structures.

Main structure 146 and each associated structure in number of associated structures 148 may be hierarchical structures. As used herein, a "hierarchical structure" may be a representation of an arrangement of items in which the items are represented as being above, below, or at the same level as one another. Typically, a hierarchical structure may be organized into a tree structure comprising parent objects and child objects.

In these illustrative examples, first objects that are in a level above second objects may be parent objects of the second objects. The second objects may be child objects of the parent objects. In these illustrative examples, each child object may have only one parent object in a particular hierarchical structure. However, in some cases, an object may be part of two different hierarchical structures and have two different parent objects in these different hierarchical structures. These different hierarchical structures may be considered part of a multi-tree structure in some illustrative examples.

A hierarchical structure may have a root object. As used herein, a "root object" may be the object at the topmost level in a hierarchical structure. Further, in these illustrative examples, a hierarchical structure may have substructures. As used herein, a "substructure" may comprise a particular object and any child objects related to that particular object. Child objects related to a particular object may include child objects of the particular object, child objects of the child objects of the particular object, and so on. The substructure may not include the parent objects of the particular object.

Main structure 146 may represent the hierarchical decomposition of product 102 with respect to components 108 using a plurality of hierarchical levels. Product 102 may be represented in model 114 by the root object of main structure 146 in primary hierarchical organization 144.

One or more of the master objects in main structure 146 may be associated with an associated structure in number of associated structures 148. An associated structure in number of associated structures 148 may represent the hierarchical decomposition of a particular component in components 108 for product 102 using one or more hierarchical levels. This particular component may be represented by the root object of the associated structure.

Each associated structure in number of associated structures 148 may be implemented in a manner similar to main structure 146. Further, in these illustrative examples, an associated structure in number of associated structures 148 may be considered a main structure for a primary hierarchical organization when the component represented by the root object of the associated structure is considered to be a product.

A master object in main structure 146 that is associated with an associated structure in number of associated structures 148 of primary hierarchical organization 144 may represent an instance of the component in components 108 for product 102 represented by the root object of the associated structure. An instance of this component may be a usage of the component in a specific manner in product 102.

When the root object of the associated structure is instantiated as the master object in main structure 146, all other objects within the associated structure may be also instantiated in main structure 146. In particular, when the root object of the associated structure is instantiated as a usage object in main structure 146, all other objects within the associated structure may also be instantiated as occurrence objects that are child objects related to the usage object in main structure 146. In this manner, a portion of the master objects in main structure 146 may represent or instantiate the associated structure. This representation or instantiation of the associated structure may be referred to as a substructure of main structure 146.

In these illustrative examples, an associated structure in number of associated structures 148 may be associated with one or more master objects in main structure 146 of primary hierarchical organization 144. Further, an associated structure may also be considered the main structure of a primary hierarchical organization for a product represented by the root object of the associated structure.

Further, group of configuration objects 130 may be organized into number of secondary hierarchical organizations 150 in model 114. Each of number of secondary hierarchical organizations 150 may be associated with primary hierarchical organization 144. In some cases, a secondary hierarchical organization may be referred to as being "nested within" primary hierarchical organization 144. Each of number of secondary hierarchical organizations 150 may be configured to represent a particular configuration or variant of product 102 in model 114.

Further, a number of configuration objects in a secondary hierarchical organization may represent a number of variations in product structure 112 for product 102. These variations may include, for example, without limitation, a variation in a placement of a component, a variation in a size of a component, a variation in a feature of a component, an optional feature for a component, and/or other suitable types of variations.

Secondary hierarchical organization 152 may be an example of one of number of secondary hierarchical organizations 150. Secondary hierarchical organization 152 may be implemented in a manner similar to primary hierarchical organization 144.

For example, secondary hierarchical organization 152 may comprise main structure 154 and number of associated structures 156. Main structure 154 and number of associated structures 156 for secondary hierarchical organization 152 may be implemented in a manner similar to main structure 146 and number of associated structures 148, respectively, for primary hierarchical organization 144. Main structure 154 and each associated structure in number of associated structures 156 may be hierarchical associated structures.

Main structure 154 of secondary hierarchical organization 152 may be implemented similarly to main structure 146 of primary hierarchical organization 144. Number of associated structures 156 in secondary hierarchical organization 152 may be implemented similarly to number of associated structures 148 in primary hierarchical organization 144.

In these illustrative examples, main structure 154 of secondary hierarchical organization 152 may represent the hierarchical decomposition of a particular configuration for product 102 using a plurality of hierarchical levels. Main structure 154 may include a main structure for each configuration for product 102. An associated structure in number of associated structures 156 in secondary hierarchical organization 152 may represent the hierarchical decomposition of a particular configuration for a component in components 108 for product 102 using a number of hierarchical levels.

Primary hierarchical organization 144 and number of secondary hierarchical organizations 150 may be used to represent product structure 112 for product 102 and variations in product structure 112 for product 102 in a manner that reduces redundancy in model 114 and increases the amount of information that may be represented in model 114. Further, primary hierarchical organization 144 and number of secondary hierarchical organizations 150 may allow model 114 to maintain a desired level of specificity with respect to the hierarchical decomposition of components 108 in product structure 112 without increasing the amount of data that needs to be stored more than is desirable.

In particular, primary hierarchical organization 144 may provide a base architecture or template from which all variations in product structure 112 for product 102 and/or all product design data may be captured and shared between variants of product 102. Each variant of product 102 may be represented using a secondary hierarchical organization.

For example, when a new variant of product 102 is to be represented in model 114, secondary hierarchical organization 152 may be added to model 114 and nested within primary hierarchical organization 144 to represent this new variant. This action is taken instead of creating a new primary hierarchical organization for this variant.

The number of configuration objects added to model 114 to form secondary hierarchical organization 152 may be less than the number of master objects that may need to be duplicated to represent the new variant in model 114 using a new primary hierarchical organization. For example, secondary hierarchical organization 152 may share a same group of configuration objects with another secondary hierarchical organization in number of secondary hierarchical organizations 150.

In this manner, at least two secondary hierarchical organizations in number of secondary hierarchical organizations 150 may share a same group of configuration objects. Further, any number of configuration objects in group of configuration objects 130 may be shared between different second hierarchical organizations in number of secondary hierarchical organizations 150. Consequently, relating the different variations in product structure 112 for product 102 to each other and to a standard configuration for product 102 may be easier and require less data by using number of secondary hierarchical organizations 150 relative to using multiple primary hierarchical organizations.

In these illustrative examples, product management system 100 may include visualizer 158 in addition to data manager 116. As depicted, visualizer 158 may be implemented in computer system 118. Visualizer 158 may be configured to visually present the information about product structure 112 represented in model 114. In particular, visualizer 158 may visually present information about product structure 112 for product 102, as represented in model 114, in a manner that may be easily understood by a user.

Visualizer 158 may visually present this information about product structure 112 for product 102 in graphical user interface 160. Graphical user interface 160 may be configured for display on display system 162. Further, graphical user interface 160 may be configured to receive user input 164 through number of user input devices 166. In this manner, a user may interact with graphical user interface 160 by entering user input 164 through number of user input devices 166.

Number of user input devices 166 may include any device configured to allow a user to interact with graphical user interface 160. Number of user input devices 166 may include, for example, without limitation, at least one of a keyboard, a mouse, a joystick, a touch screen, a touchpad, a pen, a pointer, a microphone, and some other suitable type of user input device.

Graphical user interface 160 may allow a user to make modifications to model 114 to modify product structure 112 for product 102. For example, without limitation, graphical user interface 160 may allow a user to add and remove variations to and from product structure 112, add and remove one or more components to and from product structure 112, add and remove one or more relationships between components in product structure 112, and/or modify product structure 112 in some other suitable manner by modifying model 114.

In this manner, product management system 100 may be used to manage model 114 for product structure 112 for product 102 as well as visually present information about product structure 112 in graphical user interface 160. Further, a user may be able to interact with graphical user interface 160 to modify model 114 to indicate variations in product structure 112 for product 102.

The illustration of product management system 100 in FIG. 1 is not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

In some illustrative examples, data manager 116 and visualizer 158 may be implemented in two different computer systems. Visualizer 158 may be in a location remote to data manager 116. In other illustrative examples, data manager 116 and visualizer 158 may be implemented as part of the same module within computer system 118.

FIGS. 2-9 are illustrations of the different types of objects that may be used in a model in the form of block diagrams as depicted in accordance with an illustrative embodiment. In particular, FIGS. 2-5 are illustrations of the different types of master objects that may be present in group of master objects 128 in model 114 in FIG. 1 in the form of block diagrams. FIGS. 6-9 are illustrations of the different types of configuration objects that may be present in group of configuration objects 130 in model 114 in FIG. 1 in the form of block diagrams.

Referring now to FIGS. 2-5, FIG. 2 is an illustration of a reusable definition object in the form of a block diagram as depicted in accordance with an illustrative embodiment. In these illustrative examples, reusable definition object 200 may be one example of a definition object that belongs to definition class 132 of master classes 124 in FIG. 1. Any reusable definition object described herein may be implemented in a manner similar to reusable definition object 200.

Reusable definition object 200 may represent a leaf component or an assembly component in components 108 for product 102 in FIG. 1. In one illustrative example, reusable definition object 200 may represent product 102 in model 114 in FIG. 1.

As depicted, reusable definition object 200 may not have any parent objects. In other words, reusable definition object 200 may not be the child object of any other master objects in primary hierarchical organization 144 in FIG. 1. Consequently, reusable definition object 200 may be referred to as a root object and, in particular a root definition object.

In these illustrative examples, reusable definition object 200 may be the root object of main structure 146 in primary hierarchical organization 144 or the root object of an associated structure in number of associated structures 148 in primary hierarchical organization 144 in FIG. 1. In other words, reusable definition object 200 may be the object at the topmost level of main structure 146 or the object at the topmost level of an associated structure in number of associated structures 148.

Reusable definition objects, such as reusable definition object 200, may not be used in model 114 at any level below the topmost level in main structure 146 or the topmost level in an associated structure in number of associated structures 148. In this manner, only one reusable definition object may be present in main structure 146 of primary hierarchical organization 144 in FIG. 1. Further, only one reusable definition object may be present in an associated structure in number of associated structures 148 of primary hierarchical organization 144.

However, reusable definition object 200 may represent a component in components 108 for product 102 that may be used any number of times in product 102. More specifically, reusable definition object 200 may represent a type of component in which multiple components of this type may be used in product 102.

In these illustrative examples, a usage of the component represented by reusable definition object 200 may be represented in primary hierarchical organization 144 as a usage of reusable definition object 200. Each usage of reusable definition object 200 may be referred to as an "instantiation" or "instance" of reusable definition object 200 in these illustrative examples. Each instantiation of reusable definition object 200 may take the form of a usage object belonging to usage class 134 of master classes 124 in FIG. 1.

As one illustrative example, when product 102 is a wing for an aircraft, reusable definition object 200 may represent a particular type of fastener configured for use in the wing. Multiple fasteners of this particular type may be used in the wing. Reusable definition object 200 may be instantiated in model 114 as many times as the number of times that a fastener of that particular type is used in the wing.

In these illustrative examples, reusable definition object 200 may be a parent object for set of child objects 202. Set of child objects 202 may include n child objects. As used herein, a "set of" items means zero or more items. For example, set of child objects 202 may be zero, one, two, or some other number of child objects. In this manner, in some cases, set of child objects 202 may be an empty set or a null set.

When set of child objects 202 for reusable definition object 200 is an empty set, reusable definition object 200 may represent a leaf component in components 108 for product 102. In other words, reusable definition object 200 may represent an indivisible component within product 102. When set of child objects 202 for reusable definition object 200 includes one or more child objects, reusable definition object 200 may represent an assembly component in components 108.

In these illustrative examples, when set of child objects 202 is a non-empty set, set of child objects 202 may include one or more in-place definition objects and/or one or more usage objects. In-place definition object 204 and usage object 206 are examples of child objects that may be in set of child objects 202. In-place definition objects are described in greater detail in FIG. 3 below. Further, usage objects are described in greater detail in FIG. 4 below.

Figure 3:
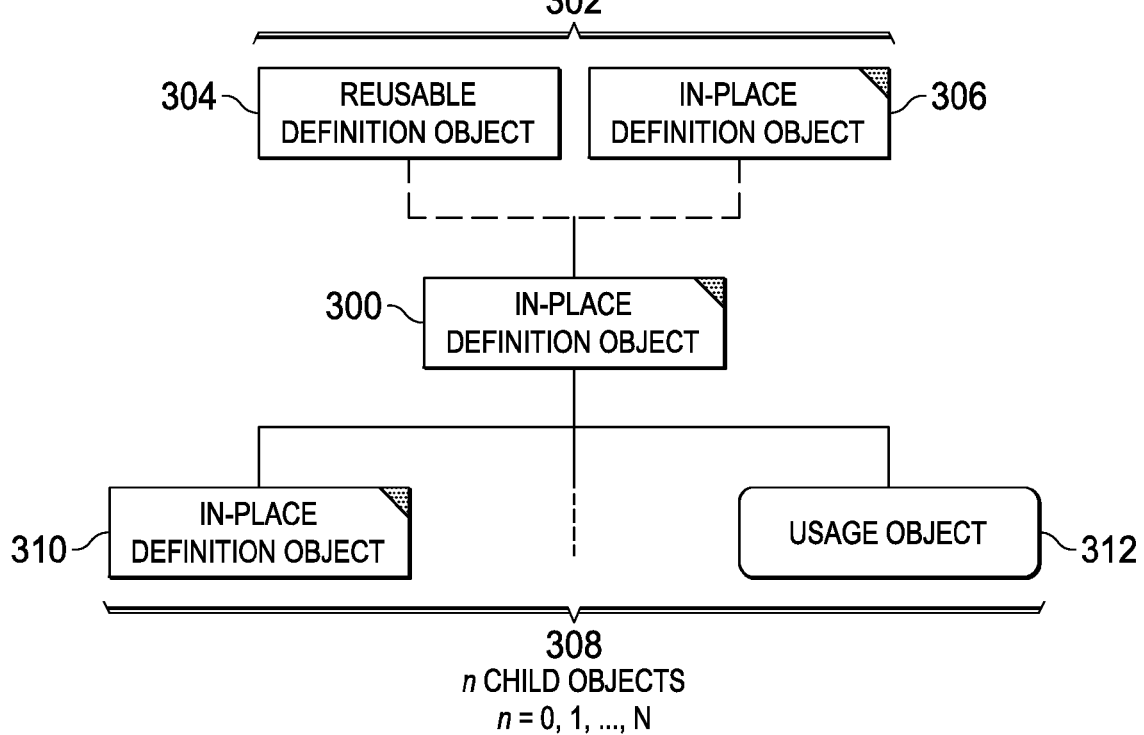
FIG. 3 is an illustration of an in-place definition object in the form of a block diagram in accordance with an illustrative embodiment.

FIG. 3 is an illustration of an in-place definition object in the form of a block diagram as depicted in accordance with an illustrative embodiment. In these illustrative examples, in-place definition object 300 may be one example of a definition object that belongs to definition class 132 of master classes 124 in FIG. 1.

Any in-place definition object described herein may be implemented in a manner similar to in-place definition object 300. Further, an in-place definition object that is a child object of a reusable definition object, such as reusable definition object 200 in FIG. 2, may be implemented in a manner similar to in-place definition object 300.

In-place definition object 300 may be part of primary hierarchical organization 144 in FIG. 1. The component represented by in-place definition object 300 may be a leaf component or an assembly component.

As depicted in these examples, in-place definition object 300 may be a child object of one of potential parent objects 302. Potential parent objects 302 may be definition objects belonging to definition class 132 of master classes 124. For example, potential parent objects 302 for in-place definition object 300 may include reusable definition object 304 and in-place definition object 306.

In these illustrative examples, in-place definition object 300 may be used only once as a child object of a definition object. In-place definition object 300 may not be instantiated as the child object of any other objects other than this definition object. In other words, in-place definition object 300 may be a child object specific to that definition object.

In this manner, in-place definition object 300 may represent a component in product 102 that is only used once in an assembly component in product 102 in FIG. 1. In other words, in-place definition object 300 may represent a component that is specific to an assembly component in product 102 and that may not be used in any other assembly component for product 102.

As one illustrative example, reusable definition object 304 may be the parent object of in-place definition object 300. Reusable definition object 304 may represent product 102. Product 102 may be, for example, a fuselage of an aircraft. In-place definition object 300 may represent a skin panel for the fuselage of the aircraft that has a particular label indicating that the skin panel is for a particular location of the fuselage.

Additionally, in-place definition object 300 may be a parent object for set of child objects 308. Set of child objects 308 may include n child objects. When set of child objects 308 is a non-empty set, set of child objects 308 may include one or more in-place definition objects and/or one or more usage objects. In-place definition object 310 and usage object 312 are examples of child objects that may be in set of child objects 308. Usage objects are described in greater detail in FIG. 4 below.

Figure 4:
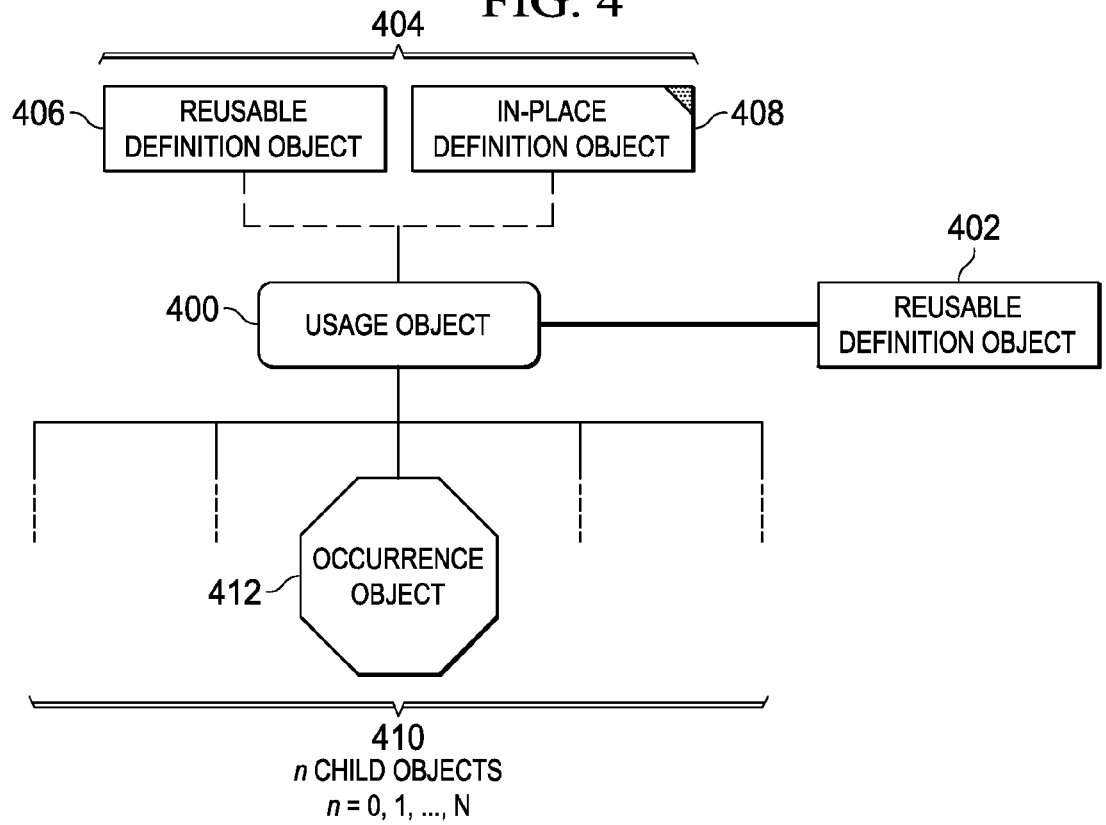
FIG. 4 is an illustration of a usage object in the form of a block diagram in accordance with an illustrative embodiment.

FIG. 4 is an illustration of a usage object in the form of a block diagram as depicted in accordance with an illustrative embodiment. In this illustrative example, usage object 400 may be an example of one implementation for a usage object belonging to usage class 134 of master classes 124 in FIG. 1. Any usage object described herein may be implemented in a manner similar to usage object 400.

A usage object that is a child object of a reusable definition object, such as reusable definition object 200, or an in-place definition object, such as in-place definition object 300, may be implemented in a manner similar to usage object 400. Usage object 400 may be part of primary hierarchical organization 144 in FIG. 1.

Usage object 400 may be an instantiation of a corresponding reusable definition object. For example, usage object 400 may be an instantiation of reusable definition object 402. In this manner, usage object 400 is a usage of the component represented by reusable definition object 402 in product 102 in FIG. 1.

As depicted, usage object 400 may be the child object of one of potential parent objects 404. Potential parent objects 404 for usage object 400 include reusable definition object 406 and in-place definition object 408.

When the child object of reusable definition object 406 or in-place definition object 408 needs to represent a component that is represented by reusable definition object 402, usage object 400 is used as the child object instead of reusable definition object 402. In this manner, reusable definition object 402 may be instantiated multiple times as usage objects without tying reusable definition object 402 to a particular hierarchical structure.

As depicted, usage object 400 may have set of child objects 410. Set of child objects 410 may include n objects. In particular, set of child objects 410 may include any number of occurrence objects belonging to occurrence class 136 of master classes 124 in FIG. 1.

When reusable definition object 402 represents an assembly component, reusable definition object 402 may be a root object of a hierarchical structure for that assembly component. When usage object 400 is created as an instantiation of reusable definition object 402, all child objects of reusable definition object 402 are instantiated as occurrence objects that become child objects of usage object 400.

In this manner, when reusable definition object 402 represents a leaf component, set of child objects 410 may be an empty set. When reusable definition object 402 represents an assembly component, set of child objects 410 may include one or more occurrence objects. Occurrence object 412 may be an example of an occurrence object in set of child objects 410. Occurrence objects are described in greater detail in FIG. 5 below.

FIG. 5 is an illustration of an occurrence object in the form of a block diagram as depicted in accordance with an illustrative embodiment. In this illustrative example, occurrence object 500 may be an example of one implementation for an occurrence object belonging to occurrence class 136 of master classes 124 in FIG. 1. Any occurrence object described herein may be implemented in a manner similar to occurrence object 500.

An occurrence object that is a child object of a usage object, such as usage object 400 in FIG. 4, may be implemented in a manner similar to occurrence object 500. Occurrence object 500 may be part of primary hierarchical organization 144 in FIG. 1.

Occurrence object 500 may be an instantiation of one of potential objects 502. Potential objects 502 include in-place definition object 504, usage object 506, and occurrence object 508. The particular object in potential objects 502 instantiated by occurrence object 500 may depend on which of potential parent objects 510 is the parent object of occurrence object 500.

For example, potential parent objects 510 include usage object 512 and occurrence object 514. When usage object 512 is the parent object of occurrence object 500, occurrence object 500 may be the instantiation of a child object of the reusable definition object instantiated by usage object 512. For example, when usage object 512 is the parent object of occurrence object 500, occurrence object 500 may be an instantiation of in-place definition object 504 or usage object 506.

Further, when occurrence object 514 is the parent object of occurrence object 500, occurrence object 500 may be the instantiation of a child object of the object instantiated by occurrence object 514. In particular, when occurrence object 514 is the parent object of occurrence object 500 and occurrence object 514 is the child object of a usage object, occurrence object 500 may be the instantiation of a child object of an in-place definition object or the instantiation of a child object of a usage object.

Occurrence object 500 may be the instantiation of occurrence object 508. For example, when occurrence object 514 is an instantiation of a usage object, occurrence object 500 may be an instantiation of the occurrence object that is a child object of this usage object.

In these illustrative examples, occurrence object 500 may have set of child objects 516. Set of child objects 516 may include n child objects. In particular, set of child objects 516 may include any number of occurrence objects. The number of occurrence objects in set of child objects 516 may be equal to the number of children of the object in potential objects 502 instantiated by occurrence object 500. Occurrence object 518 may be an example of an occurrence object in set of child objects 516.

Referring now to FIGS. 6-9, FIG. 6 is an illustration of a reusable definition configuration object in the form of a block diagram as depicted in accordance with an illustrative embodiment. In these illustrative examples, reusable definition configuration object 600 may be one example of a definition configuration object that belongs to definition configuration class 138 of configuration classes 126 in FIG. 1. Any reusable definition configuration object described herein may be implemented in a manner similar to reusable definition configuration object 600.

Reusable definition configuration object 600 corresponds to a reusable definition object, such as, for example, reusable definition object 601. Reusable definition configuration object 600 may represent a configuration for the component represented by reusable definition object 601.

In this manner, reusable definition configuration object 600 may correspond to only one reusable definition object. However, any number of reusable definition configuration objects may correspond to the same reusable definition object. In other words, the component represented by reusable definition object 601 may have multiple configurations, which may be represented by multiple reusable definition configuration objects.

As depicted, reusable definition configuration object 600 may not have any parent objects. In other words, reusable definition configuration object 600 may not be the child object of any other configuration objects in model 114 in FIG. 1. Consequently, reusable definition configuration object 600 may be referred to as a root configuration object and, in particular, a root definition configuration object.

Reusable definition configuration object 600 may be part of a secondary hierarchical organization in number of secondary hierarchical organizations 150, such as secondary hierarchical organization 152, in FIG. 1. For example, reusable definition configuration object 600 may be the root configuration object of main structure 154 in secondary hierarchical organization 152 or the root configuration object of an associated structure in number of associated structures 156 in secondary hierarchical organization 152 in FIG. 1.

In other words, reusable definition configuration object 600 may be the configuration object at the topmost level of main structure 154 or the configuration object at the topmost level of an associated structure in number of associated structures 156. Only one reusable definition configuration object may be present in main structure 154 of secondary hierarchical organization 152 in FIG. 1. Further, only one reusable definition configuration object may be present in each associated structure in number of associated structures 156 of secondary hierarchical organization 152.

However, reusable definition configuration object 600 may represent a configuration for a component that may be used any number of times in product 102 in FIG. 1. In these illustrative examples, a usage of the configuration represented by reusable definition configuration object 600 may be represented as an instantiation of reusable definition configuration object 600 in secondary hierarchical organization 152. Each instantiation of reusable definition configuration object 600 may take the form of a usage configuration object belonging to usage configuration class 140 of configuration classes 126 in FIG. 1.

As one illustrative example, when reusable definition object 601 represents a family of hydraulic pumps, reusable definition configuration object 600 may represent one configuration or member for this family of pumps. This configuration may be, for example, a heavy-duty pump versus a light-duty pump.

In these illustrative examples, reusable definition configuration object 600 may be a parent object for set of child objects 602. Set of child objects 602 may include n child objects. In particular, when reusable definition object 601 has one or more child objects, reusable definition configuration object 600 may have one or more corresponding child objects. In this manner, each child object of reusable definition object 601 may have a corresponding child object in set of child objects 602 for reusable definition configuration object 600.

For example, when a child object of reusable definition object 601 is an in-place definition object, set of child objects 602 may include an in-place definition configuration object, such as in-place definition configuration object 604. When a child object of reusable definition object 601 is a usage object, set of child objects 602 may include a usage configuration object, such as usage configuration object 606.

In-place definition configuration objects are described in greater detail in FIG. 7 below. Additionally, usage configuration objects are described in greater detail in FIG. 8 below.

Figure 7:
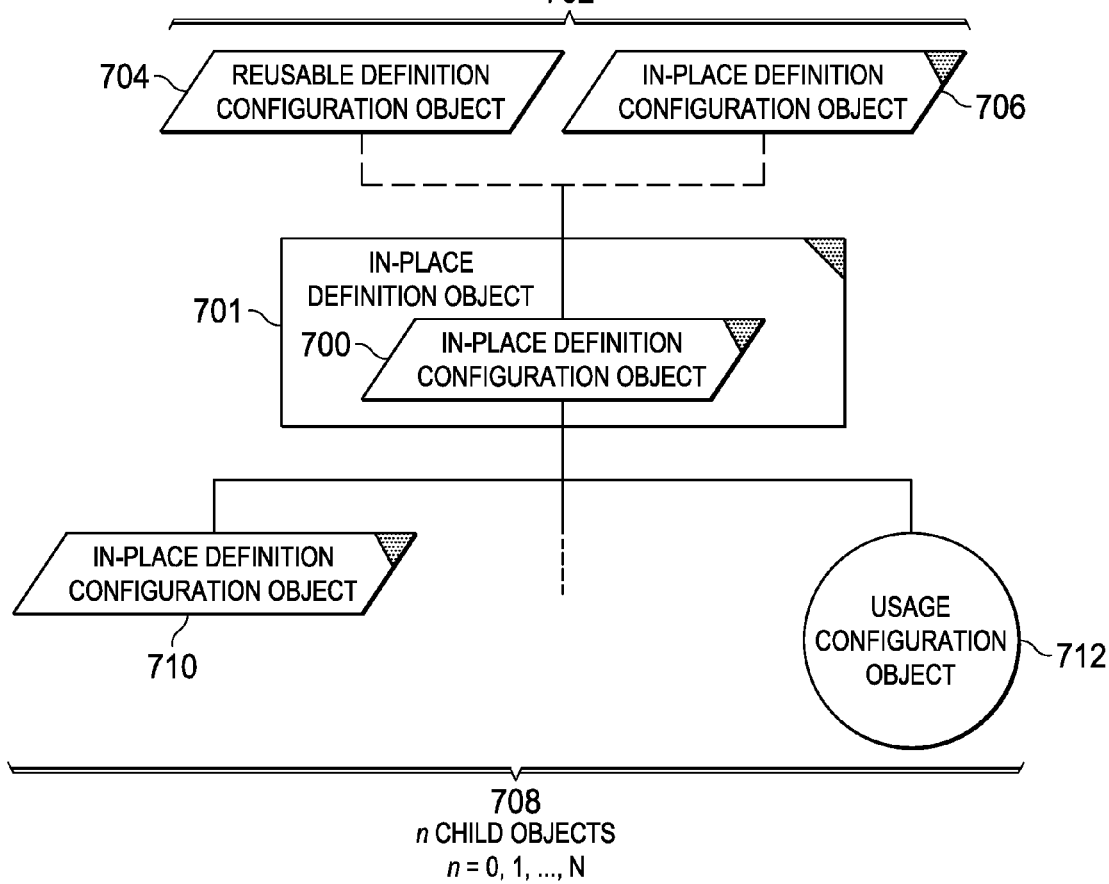
FIG. 7 is an illustration of an in-place definition configuration object in the form of a block diagram in accordance with an illustrative embodiment.

FIG. 7 is an illustration of an in-place definition configuration object in the form of a block diagram as depicted in accordance with an illustrative embodiment. In these illustrative examples, in-place definition configuration object 700 may be one example of a definition configuration object that belongs to definition configuration class 138 of configuration classes 126 in FIG. 1.

Any in-place definition configuration object described herein may be implemented in a manner similar to in-place definition configuration object 700. An in-place definition configuration object that is a child object of a reusable definition configuration object, such as reusable definition configuration object 600 in FIG. 6, may be implemented in a manner similar to in-place definition configuration object 700.

Further, in-place definition configuration object 700 may be part of a secondary hierarchical organization in number of secondary hierarchical organizations 150, such as secondary hierarchical organization 152, in FIG. 1. In-place definition configuration object 700 may correspond to an in-place definition object, such as in-place definition object 701. For example, in-place definition configuration object 700 may represent the configuration for a component represented by in-place definition object 701.

In these illustrative examples, in-place definition configuration object 700 corresponds to only one in-place definition object. However, any number of in-place definition configuration objects may correspond to the same in-place definition object.

As depicted in these examples, in-place definition configuration object 700 may be a child object of one or more configuration objects in potential parent objects 702. Potential parent objects 702 for in-place definition configuration object 700 may include any number of definition configuration objects belonging to definition configuration class 138 of configuration classes 126 in FIG. 1.

For example, potential parent objects 702 for in-place definition configuration object 700 may include reusable definition configuration object 704 and in-place definition configuration object 706. In one illustrative example, in-place definition configuration object 700 may have two parent objects that are both reusable definition configuration objects corresponding to the same reusable definition object. In this manner, these two reusable definition configuration objects may share in-place definition configuration object 700 as a child object.

Further, as depicted, in-place definition configuration object 700 may be a parent object for set of child objects 708. Set of child objects 708 may include n child objects. When set of child objects 708 is not a null set, set of child objects 708 may include one or more in-place definition configuration objects and/or one or more usage configuration objects. In-place definition configuration object 710 and usage configuration object 712 are examples of child objects in set of child objects 708. Usage configuration objects are described in greater detail in FIG. 8 below.

Figure 8:
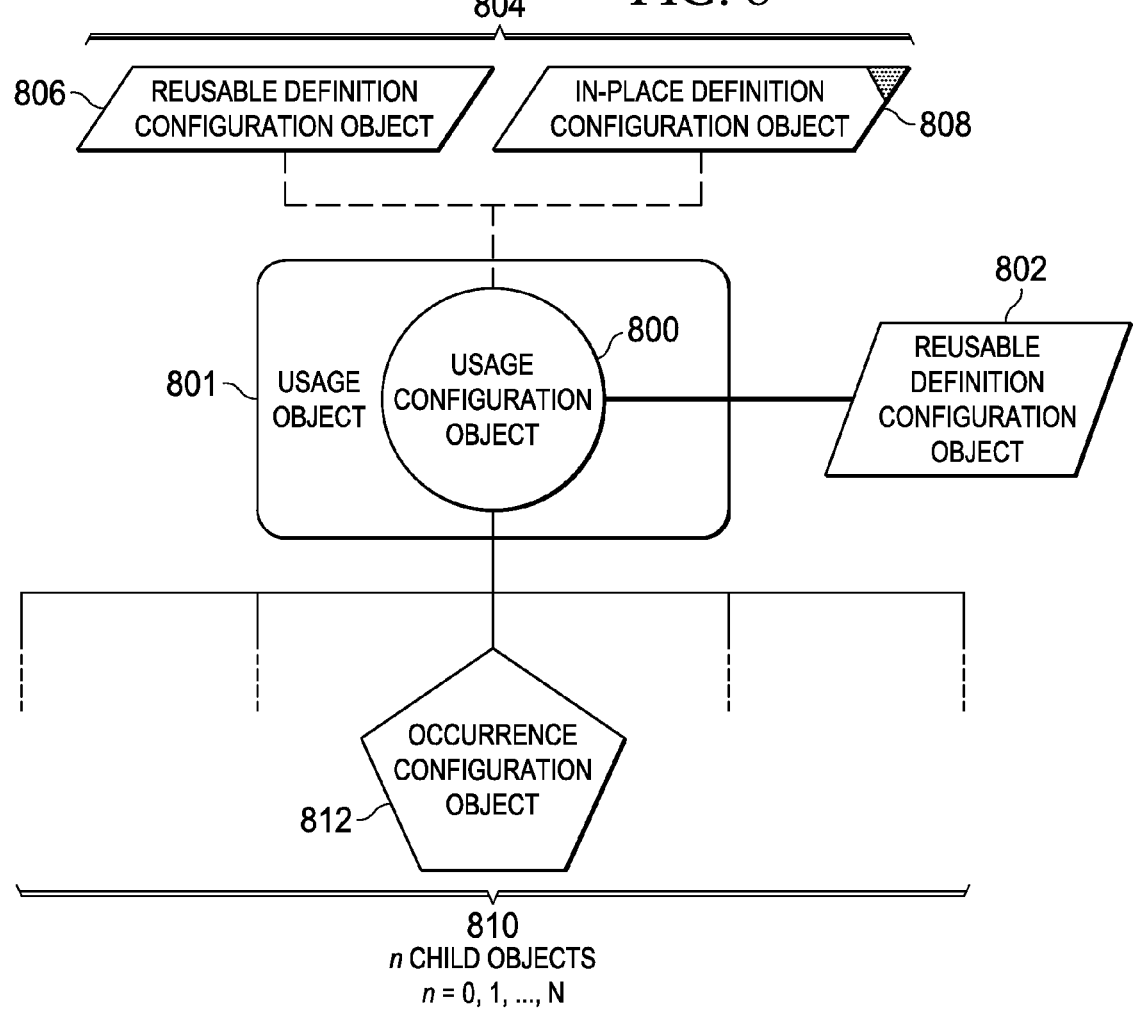
FIG. 8 is an illustration of a usage configuration object in the form of a block diagram in accordance with an illustrative embodiment.

FIG. 8 is an illustration of a usage configuration object in the form of a block diagram as depicted in accordance with an illustrative embodiment. In this illustrative example, usage configuration object 800 may be an example of one implementation for a usage configuration object belonging to usage configuration class 140 of configuration classes 126 in FIG. 1. Any usage configuration object described herein may be implemented in a manner similar to usage configuration object 800.

Figure 6:
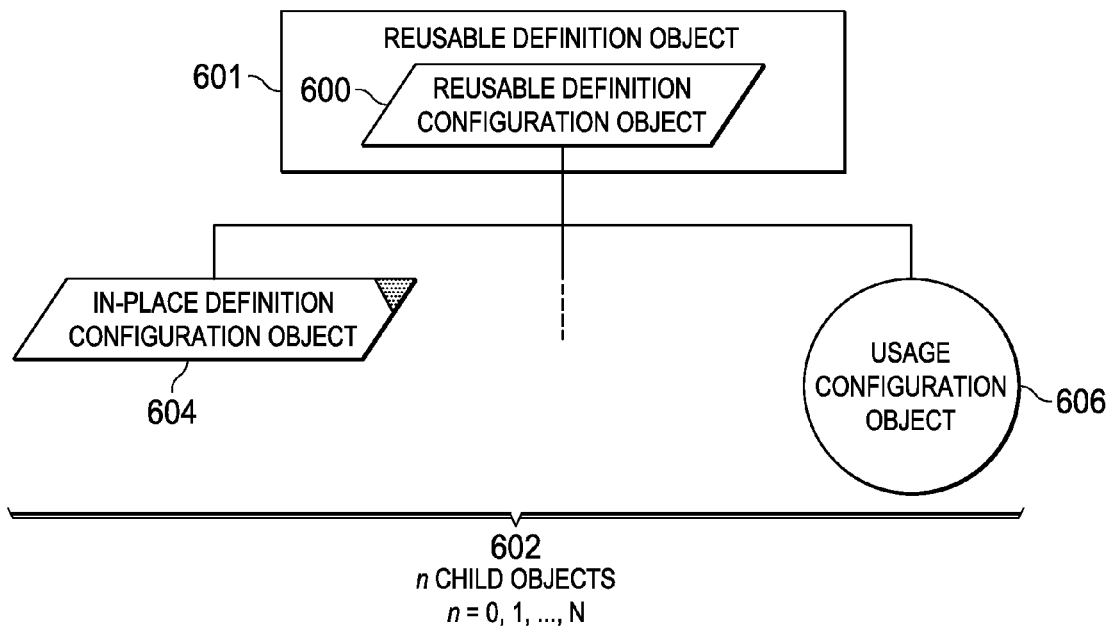
FIG. 6 is an illustration of a reusable definition configuration object in the form of a block diagram in accordance with an illustrative embodiment.

A usage configuration object that is a child object of a reusable definition configuration object, such as reusable definition configuration object 600 in FIG. 6, or a child object of an in-place definition configuration object, such as in-place definition configuration object 700 in FIG. 7, may be implemented in a manner similar to usage configuration object 800. Usage configuration object 800 may be part of a secondary hierarchical organization in number of secondary hierarchical organizations 150, such as secondary hierarchical organization 152 in FIG. 1.

Usage configuration object 800 may correspond to a usage object, such as, for example, usage object 801. Usage object 801 may be an instantiation of a corresponding reusable definition object. Consequently, usage configuration object 800 may be an instantiation of a reusable definition configuration object corresponding to the reusable definition object instantiated by usage object 801.

For example, reusable definition configuration object 802 may correspond to the reusable definition object instantiated by usage object 801. Usage configuration object 800 may be an instantiation of reusable definition configuration object 802.

As depicted, usage configuration object 800 may be the child object of one or more of potential parent objects 804. Potential parent objects 804 for usage configuration object 800 include reusable definition configuration object 806 and in-place definition configuration object 808.

In these illustrative examples, more than one parent object in potential parent objects 804 may share usage configuration object 800 when the parent objects correspond to the same definition object. For example, three reusable definition configuration objects corresponding to the same reusable definition object may share usage configuration object 800 as a child object.

As depicted, usage configuration object 800 may be the parent object for set of child objects 810. Set of child objects 810 may include n child objects. In particular, set of child objects 810 may include any number of occurrence configuration objects belonging to occurrence configuration class 142 of configuration classes 126 in FIG. 1.

In these illustrative examples, when usage object 801 has one or more child objects, usage configuration object 800 may have one or more corresponding child objects. In other words, each child object of usage object 801 may have a corresponding child object in set of child objects 810 for usage configuration object 800.

In this manner, all child objects in set of child objects 810 may be occurrence configuration objects. Occurrence configuration object 812 is an example of an occurrence configuration object in set of child objects 810. Occurrence configuration objects are described in greater detail in FIG. 9 below.

Figure 9:
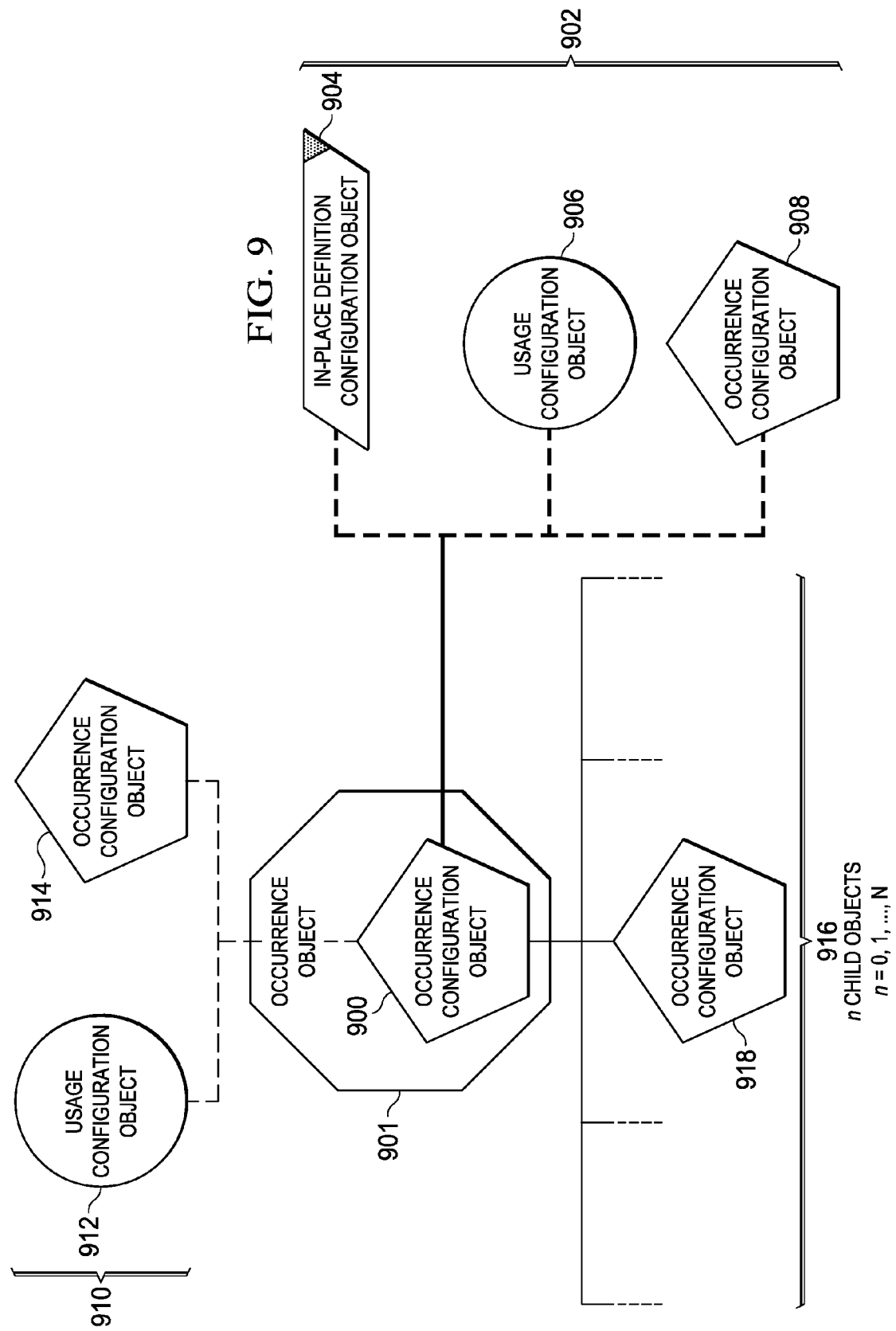
FIG. 9 is an illustration of an occurrence configuration object in the form of a block diagram in accordance with an illustrative embodiment.

FIG. 9 is an illustration of an occurrence configuration object in the form of a block diagram as depicted in accordance with an illustrative embodiment. In this illustrative example, occurrence configuration object 900 may be an example of one implementation for an occurrence configuration object belonging to occurrence configuration class 142 of configuration classes 126 in FIG. 1. Any occurrence configuration object described herein may be implemented in a manner similar to occurrence configuration object 900.

An occurrence configuration object that is a child object of a usage configuration object, such as usage configuration object 800 in FIG. 8, may be implemented in a manner similar to occurrence configuration object 900. Occurrence configuration object 812 in FIG. 8 may be part of a secondary hierarchical organization in number of secondary hierarchical organizations 150, such as secondary hierarchical organization 152, in FIG. 1.

As depicted, occurrence configuration object 900 may correspond to an occurrence object, such as occurrence object 901. Occurrence object 901 may be an instantiation of a child object of a usage object. Consequently, occurrence configuration object 900 may be an instantiation of a configuration object corresponding to a child object of the usage object instantiated by occurrence object 901.

For example, occurrence configuration object 900 may be an instantiation of one of potential configuration objects 902. Potential configuration objects 902 include in-place definition configuration object 904, usage configuration object 906, and occurrence configuration object 908.

As depicted, occurrence configuration object 900 may be the child object of one or more of potential parent objects 910. Potential parent objects 910 for occurrence configuration object 900 may include usage configuration object 912 and occurrence configuration object 914.

In these illustrative examples, more than one parent object in potential parent objects 910 may share occurrence configuration object 900 when the parent objects correspond to the same usage object or the same occurrence object. For example, three usage configuration objects corresponding to the same usage object may share occurrence configuration object 900 as a child object.

As depicted, occurrence configuration object 900 may be the parent object for set of child objects 916. Set of child objects 916 may include n child objects. The number of child objects in set of child objects 916 may equal and correspond to the number of child objects of the object in potential configuration objects 902 instantiated by occurrence configuration object 900. In particular, set of child objects 916 may include any number of occurrence configuration objects belonging to occurrence configuration class 142 of configuration classes 126 in FIG. 1.

In these illustrative examples, when occurrence object 901 has one or more child objects, occurrence configuration object 900 may have one or more corresponding child objects. In other words, each child object of occurrence object 901 may have a corresponding child object in set of child objects 916 for occurrence configuration object 900.

In this manner, all child objects in set of child objects 916 may be occurrence configuration objects. Occurrence configuration object 918 is an example of an occurrence configuration object in set of child objects 916.

Figure 2:
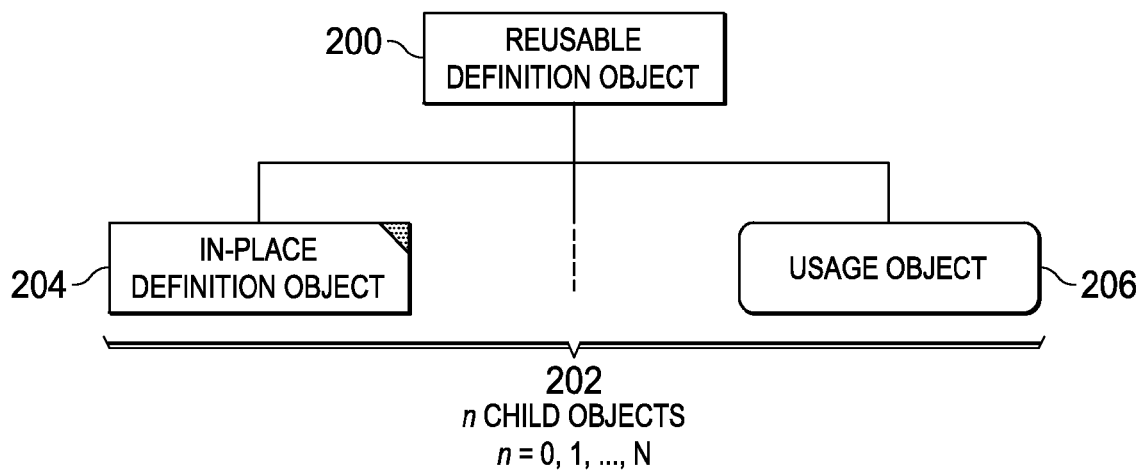
FIG. 2 is an illustration of a reusable definition object in the form of a block diagram in accordance with an illustrative embodiment.

The illustrations of reusable definition object 200 in FIG. 2, in-place definition configuration object 300 in FIG. 3, usage object 400 in FIG. 4, occurrence object 500 in FIG. 5, reusable definition configuration object 600 in FIG. 6, in-place definition configuration object 700 in FIG. 7, usage configuration object 800 in FIG. 8, and occurrence configuration object 900 in FIG. 9 are not meant to imply physical or architectural limitations to the manner in which an illustrative embodiment may be implemented. Other components in addition to or in place of the ones illustrated may be used. Some components may be optional.

Figure 10:
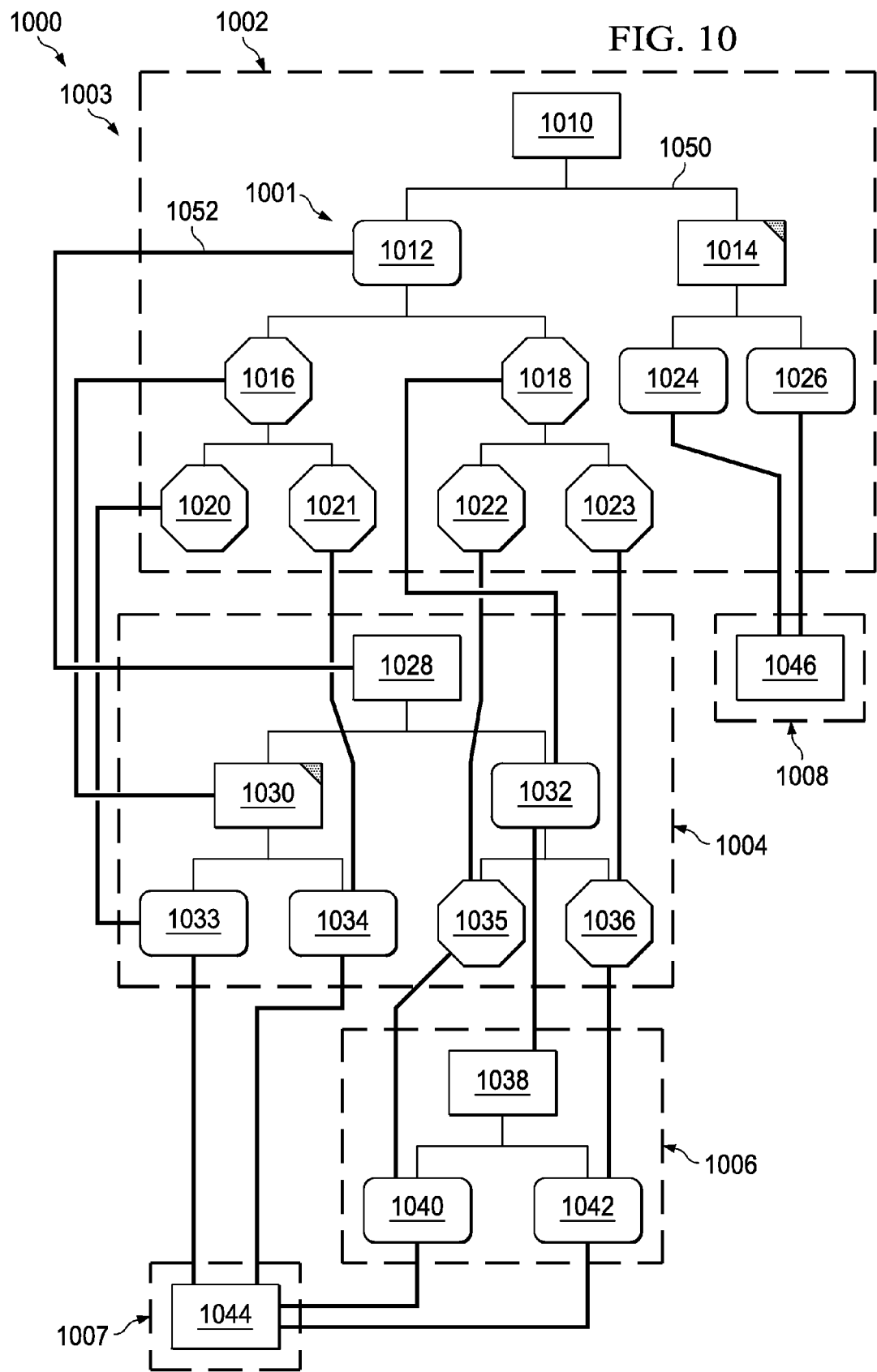
FIG. 10 is an illustration of a primary hierarchical organization in accordance with an illustrative embodiment.

FIG. 10 is an illustration of a primary hierarchical organization as depicted in accordance with an illustrative embodiment. In this illustrative example, primary hierarchical organization 1000 is an example of one implementation of primary hierarchical organization 144 in FIG. 1.

Primary hierarchical organization 1000 is formed by master objects 1001. Master objects 1001 are examples of objects in group of master objects 128 belonging to master classes 124 in FIG. 1. Primary hierarchical organization 1000 with master objects 1001 may be a part of model 1003. Model 1003 may be an example of one implementation for model 114 in FIG. 1.

As depicted, primary hierarchical organization 1000 includes main structure 1002, associated structure 1004, associated structure 1006, associated structure 1007, and associated structure 1008. Main structure 1002 may be an example of one implementation for main structure 146 in primary hierarchical organization 144 in FIG. 1. Associated structure 1004, associated structure 1006, associated structure 1007, and associated structure 1008 may be examples of one implementation for number of associated structures 148 in primary hierarchical organization 144 in FIG. 1.

In this illustrative example, main structure 1002 may include reusable definition object 1010, usage object 1012, in-place definition object 1014, occurrence object 1016, occurrence object 1018, occurrence object 1020, occurrence object 1021, occurrence object 1022, occurrence object 1023, usage object 1024, and usage object 1026. Reusable definition object 1010 may be the root object of main structure 1002.

Reusable definition object 1010 may represent a product, such as product 102 in FIG. 1. In this illustrative example, product 102 is an assembly component. As depicted, reusable definition object 1010 may be the parent object of usage object 1012 and in-place definition object 1014.

In this illustrative example, usage object 1012 may be an instantiation of reusable definition object 1028. Reusable definition object 1028 may represent an assembly component for the product represented by reusable definition object 1010. Reusable definition object 1028 may be the root object of associated structure 1004.

Associated structure 1004 may be separate from main structure 1002. Associated structure 1004 may include reusable definition object 1028, in-place definition object 1030, usage object 1032, usage object 1033, usage object 1034, occurrence object 1035, and occurrence object 1036.

As depicted, reusable definition object 1028 may be the parent object of in-place definition object 1030 and usage object 1032. Usage object 1032 may be an instantiation of reusable definition object 1038. Reusable definition object 1038 may represent an assembly component in the product represented by reusable definition object 1010.

Reusable definition object 1038 may be the root object of associated structure 1006. Associated structure 1006 may be separate from associated structure 1004. Associated structure 1006 may include reusable definition object 1038, usage object 1040, and usage object 1042.

Both usage object 1040 and usage object 1042 may be child objects of reusable definition object 1038. Further, both usage object 1040 and usage object 1042 may be instantiations of reusable definition object 1044. Reusable definition object 1044 is the root object of associated structure 1007.

Associated structure 1007 may be separate from associated structure 1006. As depicted, associated structure 1007 may only comprise one hierarchical level in this illustrative example. In other words, reusable definition object 1044 may represent a leaf component for the product represented by reusable definition object 1010.

When reusable definition object 1038 in associated structure 1006 is instantiated as usage object 1032 in associated structure 1004, all objects in associated structure 1006 under reusable definition object 1038 may be instantiated as occurrence objects under usage object 1032 in associated structure 1004. For example, when usage object 1032 is created, usage object 1040 may be instantiated as occurrence object 1035, and usage object 1042 may be instantiated as occurrence object 1036.

Further, in this illustrative example, in-place definition object 1030 may be the parent object of usage object 1033 and usage object 1034. Both usage object 1033 and usage object 1034 may be instantiations of reusable definition object 1044.

When usage object 1012 in main structure 1002 is created, all objects within associated structure 1004 below reusable definition object 1028 may be instantiated as occurrence objects under usage object 1012. For example, usage object 1012 may be the parent object of occurrence object 1016 and occurrence object 1018.

In-place definition object 1030 may be instantiated as occurrence object 1016. Occurrence object 1016 may be the parent object of occurrence object 1020 and occurrence object 1021. Occurrence object 1020 may be the instantiation of usage object 1033. Occurrence object 1021 may be the instantiation of usage object 1034.

Further, usage object 1032 may be instantiated as occurrence object 1018 under usage object 1012. Occurrence object 1018 may be the parent object of occurrence object 1022, which may be the instantiation of occurrence object 1035, and occurrence object 1023, which may be the instantiation of occurrence object 1036.

In this illustrative example, in-place definition object 1014 may be the parent object of usage object 1024 and usage object 1026. Both usage object 1024 and usage object 1026 may be instantiations of reusable definition object 1046. Reusable definition object 1046 may be the root object of associated structure 1008. As depicted, associated structure 1008 comprises only one hierarchical level. In this manner, reusable definition object 1046 may represent a leaf component for the product represented by reusable definition object 1010.

In these illustrative examples, the different master objects that form primary hierarchical organization 1000 are connected to each other by primary structural links 1050. In particular, the components belonging to a particular hierarchical structure are connected to each other in that hierarchical structure by one or more primary structural links 1050.

As used herein, a "structural link" may be a link between two objects that indicates that one of the objects is the child object of the other object. A "primary structural link" may be a link between two master objects in a primary hierarchical organization. In these illustrative examples, a primary structural link may not connect a master object in one hierarchical structure with another master object in another hierarchical structure within a primary hierarchical organization.

Further, primary instance links 1052 may also be used in primary hierarchical organization 1000. As used herein, an "instance link" may be a link between two objects that indicates that one object is the instantiation of the other object. A "primary instance link" may be a link between two master objects in a primary hierarchical organization.

Typically, a primary instance link may begin at a usage object or an occurrence object and end at the master object being instantiated by the usage object or the occurrence object. A primary instance link may cross from one hierarchical structure to another hierarchical structure within a primary hierarchical organization.

For example, a primary instance link may begin at a master object in a main structure and end at a master object in an associated structure. Further, the primary instance link may also indicate that the associated structure is instantiated or represented in the main structure. In this manner, the instantiation of a root object of an associated structure by a master object in the main structure, as indicated by a primary instance link, may mean that all of the objects in that associated structure are represented in the main structure. A primary instance link may not begin and end within a same hierarchical structure.

Figure 11:
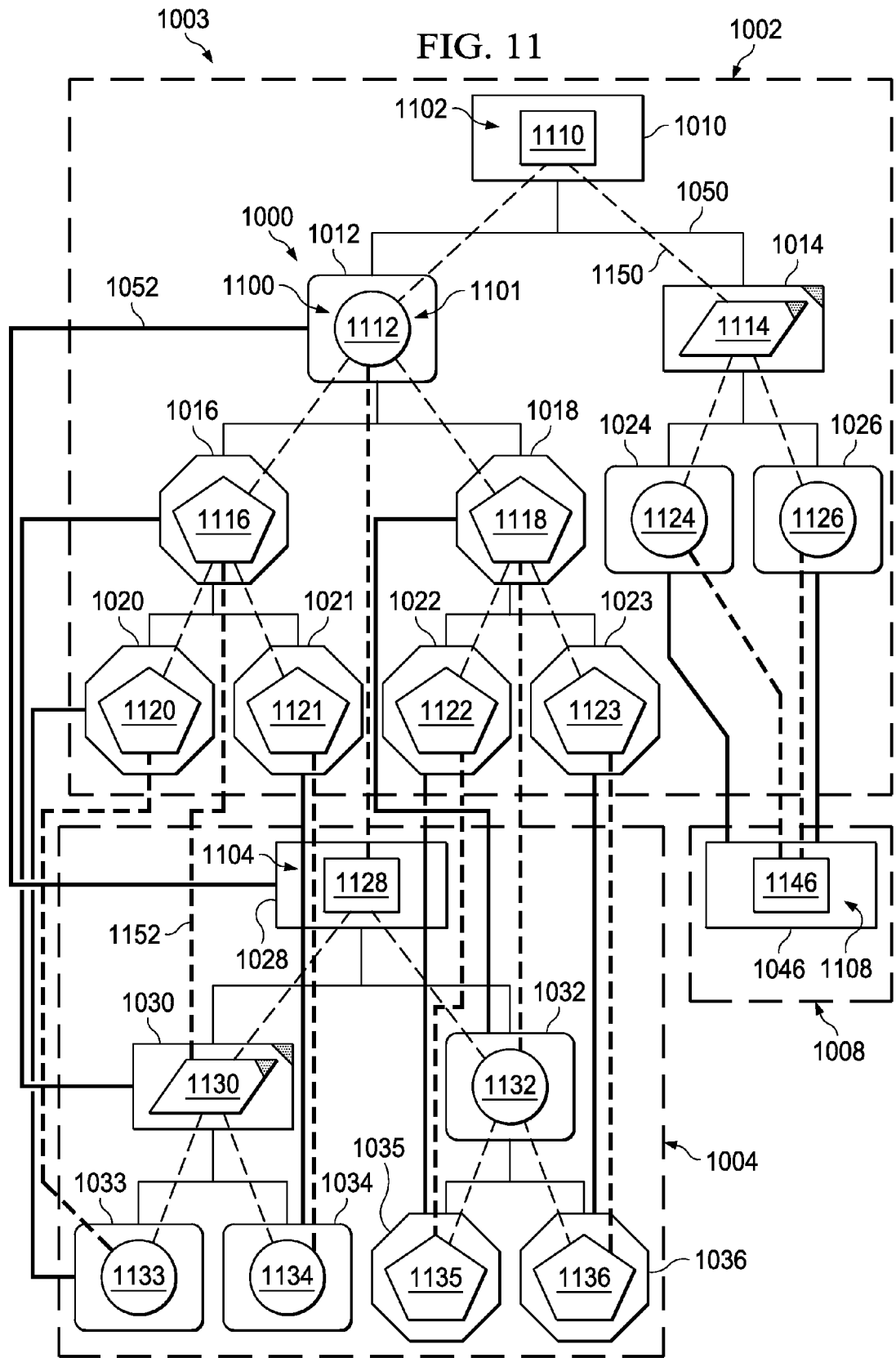
FIG. 11 is an illustration of a portion of a secondary hierarchical organization associated with a portion of a primary hierarchical organization in accordance with an illustrative embodiment.

FIG. 11 is an illustration of a portion of a secondary hierarchical organization associated with a portion of a primary hierarchical organization as depicted in accordance with an illustrative embodiment. In this illustrative example, secondary hierarchical organization 1100 may be associated with primary hierarchical organization 1000 in FIG. 10. Secondary hierarchical organization 1100 may also be part of model 1003.

Only a portion of primary hierarchical organization 1000 from FIG. 10 is depicted in this example. In particular, main structure 1002, associated structure 1004, and associated structure 1008 are depicted. Further, only a portion of secondary hierarchical organization 1100 is depicted in this example.

In this illustrative example, secondary hierarchical organization 1100 may be formed by configuration objects 1101. Configuration objects 1101 may be examples of configuration objects in group of configuration objects 130 belonging to configuration classes 126 in FIG. 1. Each of configuration objects 1101 may correspond to the master object within which the configuration object is located.

As depicted, secondary hierarchical organization 1100 may include main structure 1102 and associated structure 1104. Main structure 1102 may be associated with main structure 1002 of primary hierarchical organization 1000. Associated structure 1104 may be associated with associated structure 1004 of primary hierarchical organization 1000. Associated structure 1108 may be associated with associated structure 1008 of primary hierarchical organization 1000. Additionally, secondary hierarchical organization 1100 may include an associated structure (not shown) associated with associated structure 1006 in FIG. 10 and an associated structure (not shown) associated with associated structure 1007 in FIG. 10.

In this illustrative example, main structure 1102 may include reusable definition configuration object 1110, usage configuration object 1112, in-place definition configuration object 1114, occurrence configuration object 1116, occurrence configuration object 1118, occurrence configuration object 1120, occurrence configuration object 1121, occurrence configuration object 1122, occurrence configuration object 1123, usage configuration object 1124, and usage configuration object 1126. Reusable definition configuration object 1110 may be the root object of main structure 1102.

Reusable definition configuration object 1110 may correspond to reusable definition object 1010. Reusable definition configuration object 1110 may represent a configuration for the product represented by reusable definition object 1010. As depicted, reusable definition configuration object 1110 may have usage configuration object 1112 and in-place definition configuration object 1114 as child objects.

In this illustrative example, usage configuration object 1112 may be an instantiation of reusable definition configuration object 1128 corresponding to reusable definition object 1028. Reusable definition configuration object 1128 may represent a particular configuration for the component represented by reusable definition object 1028.

Reusable definition configuration object 1128 may be the root object of associated structure 1104. Associated structure 1104 may include reusable definition configuration object 1128, in-place definition configuration object 1130, usage configuration object 1132, usage configuration object 1133, usage configuration object 1134, occurrence configuration object 1135, and occurrence configuration object 1136.

As depicted, in-place definition configuration object 1130 and usage configuration object 1132 may be the child objects of reusable definition configuration object 1128. In this manner, the particular configuration represented by reusable definition configuration object 1128 for the component represented by reusable definition object 1028 may comprise the component, represented by in-place definition object 1030, having the configuration represented by in-place definition configuration object 1130.

As depicted, usage configuration object 1133 and usage configuration object 1134 may be child objects of in-place definition configuration object 1130. Both usage configuration object 1133 and usage configuration object 1134 may be instantiations of a reusable definition configuration object (not shown) for reusable definition object 1044 in FIG. 10.

Usage configuration object 1132 may be an instantiation of a reusable definition configuration object (not shown) corresponding to reusable definition object 1038 in FIG. 10. Occurrence configuration object 1135 and occurrence configuration object 1136 may be the child objects of usage configuration object 1132. When usage configuration object 1132 is created, occurrence configuration object 1135 and occurrence configuration object 1136 may also be created.

Occurrence configuration object 1135 may be an instantiation of a usage configuration object (not shown) for usage object 1040 in FIG. 10. Occurrence configuration object 1136 may be an instantiation of a usage configuration object (not shown) for usage object 1042 in FIG. 10.

Further, when reusable definition configuration object 1128 is instantiated as usage configuration object 1112, all of the configuration objects under reusable definition configuration object 1128 within associated structure 1104 may be instantiated under usage configuration object 1112. For example, occurrence configuration object 1116 may be an instantiation of in-place definition configuration object 1130. Occurrence configuration object 1118 may be an instantiation of usage configuration object 1132.

Additionally, occurrence configuration object 1120 may be an instantiation of usage configuration object 1133. Occurrence configuration object 1121 may be an instantiation of usage configuration object 1134. Occurrence configuration object 1122 may be an instantiation of occurrence configuration object 1135. Occurrence configuration object 1123 may be an instantiation of occurrence configuration object 1136.

In this illustrative example, usage configuration object 1124 and usage configuration object 1126 may be the child objects of in-place definition configuration object 1114. Both usage configuration object 1124 and usage configuration object 1126 may be instantiations of reusable definition configuration object 1146 corresponding to reusable definition object 1046.

As depicted, the different configuration objects in secondary hierarchical organization 1100 may be connected to each other using secondary structural links 1150. As used herein, a "secondary structural link" may be a link between two configuration objects in which one of the configuration objects is the parent object of the other configuration object. In these illustrative examples, a secondary structural link may not connect a configuration object in one hierarchical structure with another configuration object in another hierarchical structure within a secondary hierarchical organization.

Further, secondary instance links 1152 may also be present in secondary hierarchical organization 1100. As used herein, a "secondary instance link" may be a link between two configuration objects in which one of the configuration objects is an instantiation of the other configuration object.

Typically, a secondary instance link may begin at a usage configuration object or an occurrence configuration object and end at the configuration object being instantiated by the usage configuration object or the occurrence configuration object. A secondary instance link may cross from one hierarchical structure to another hierarchical structure within a secondary hierarchical organization. However, a secondary instance link may not begin and end within a same hierarchical structure.

The illustrations of primary hierarchical organization 1000 in FIG. 10 and secondary hierarchical organization in FIG. 11 are not meant to imply physical or architectural limitations to the manner in which an illustrative embodiment may be implemented. Other components in addition to or in place of the ones illustrated may be used. Some components may be optional.

In some illustrative examples, one or more additional secondary hierarchical organizations may be associated with primary hierarchical organization 1000 in model 1003 in FIGS. 10 and 11. For example, when a variant for the product represented by reusable definition object 1010 is to be added to model 1003, an additional reusable definition configuration object may be added within reusable definition object 1010.

This reusable definition configuration object may be the root object for the additional secondary hierarchical organization. The additional reusable definition configuration object may share one or more of the same child objects as reusable definition configuration object 1110.

In one illustrative example, the additional reusable definition configuration object may have a new usage configuration object corresponding to usage object 1012 as a child object instead of usage configuration object 1112. In this particular example, the additional reusable definition configuration object may still have in-place definition configuration object 1114 as a child object.

The different variations that may be possible within a product structure for the product represented by reusable definition object 1010 may be represented in model 1003 using different configuration objects and various secondary structural links and secondary instance links. Model 1003 may allow different variants of the product represented by reusable definition object 1010 to be represented in model 1003 without more redundant data than desired.

Figure 12:
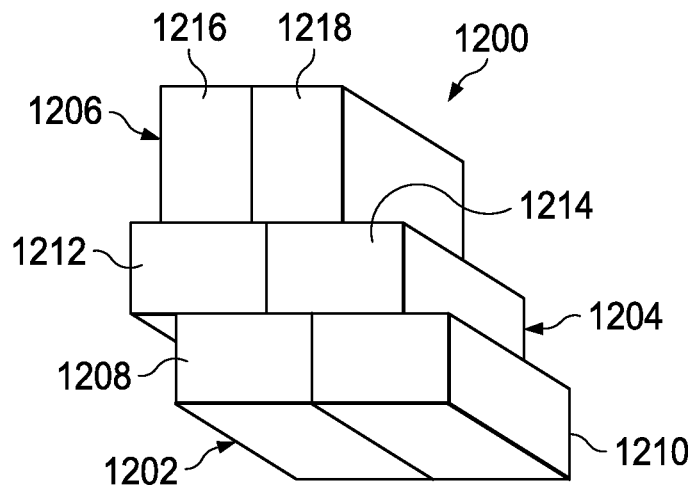
FIG. 12 is an illustration of a six-brick assembly in accordance with an illustrative embodiment.

FIG. 12 is an illustration of a six-brick assembly as depicted in accordance with an illustrative embodiment. Six-brick assembly 1200 may be an example of one implementation for product 102 in FIG. 1. In this illustrative example, six-brick assembly 1200 is an example of one implementation for tangible product 104 in FIG. 1. As depicted in FIG. 12, six-brick assembly 1200 may be made up of six physical bricks. The illustrative embodiment shown in FIGS. 12-14 may be used to demonstrate the illustrative embodiments described with respect to FIGS. 1-9. In other words, the illustrative embodiment shown in FIGS. 12-14 illustrates one example of how to use the representation schemes described herein to represent a relatively simple assembly of physical objects in the form of a model.

Figure 13:
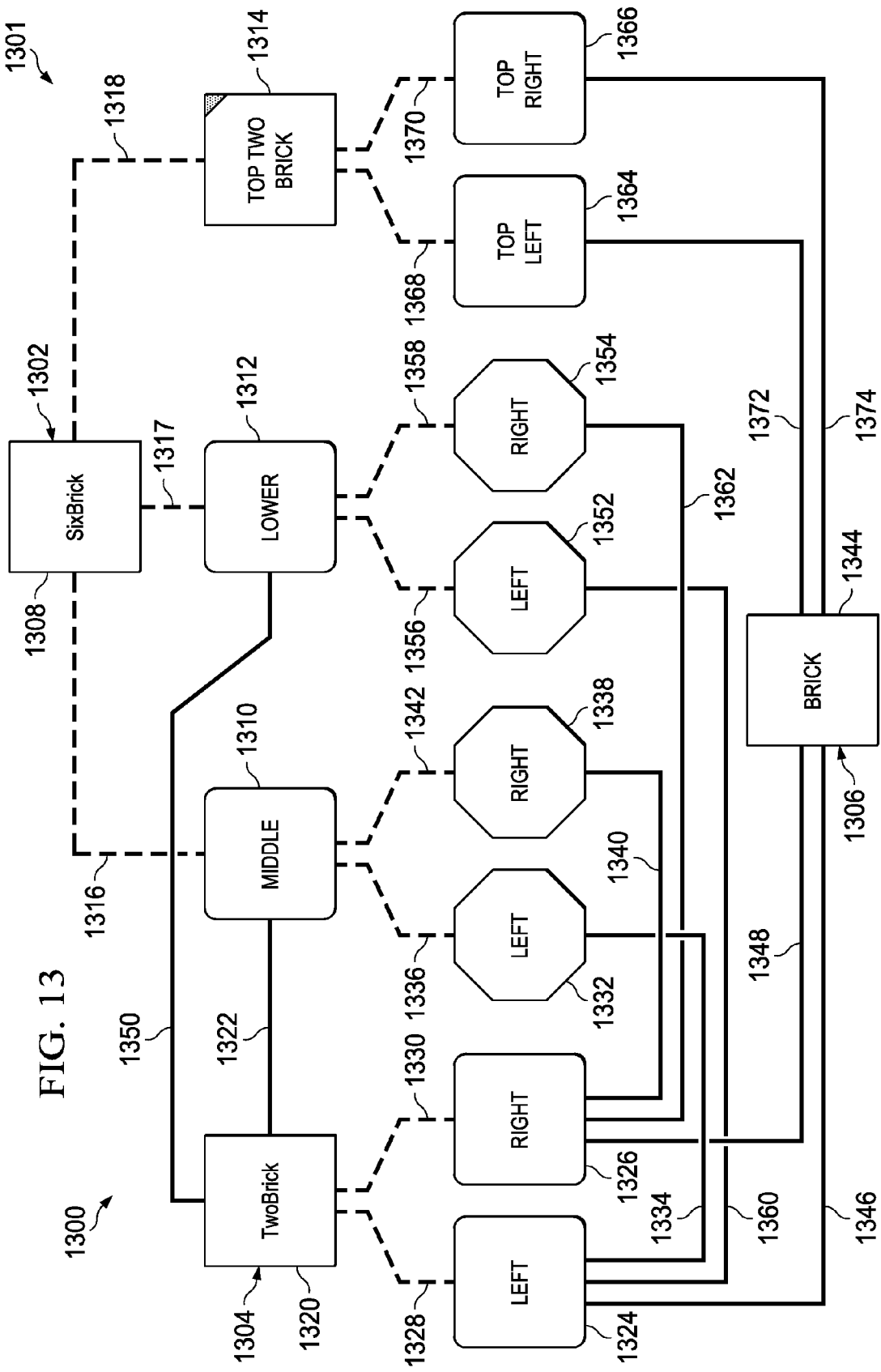
FIG. 13 is an illustration of a model of a six-brick assembly in accordance with an illustrative embodiment.
Figure 14:
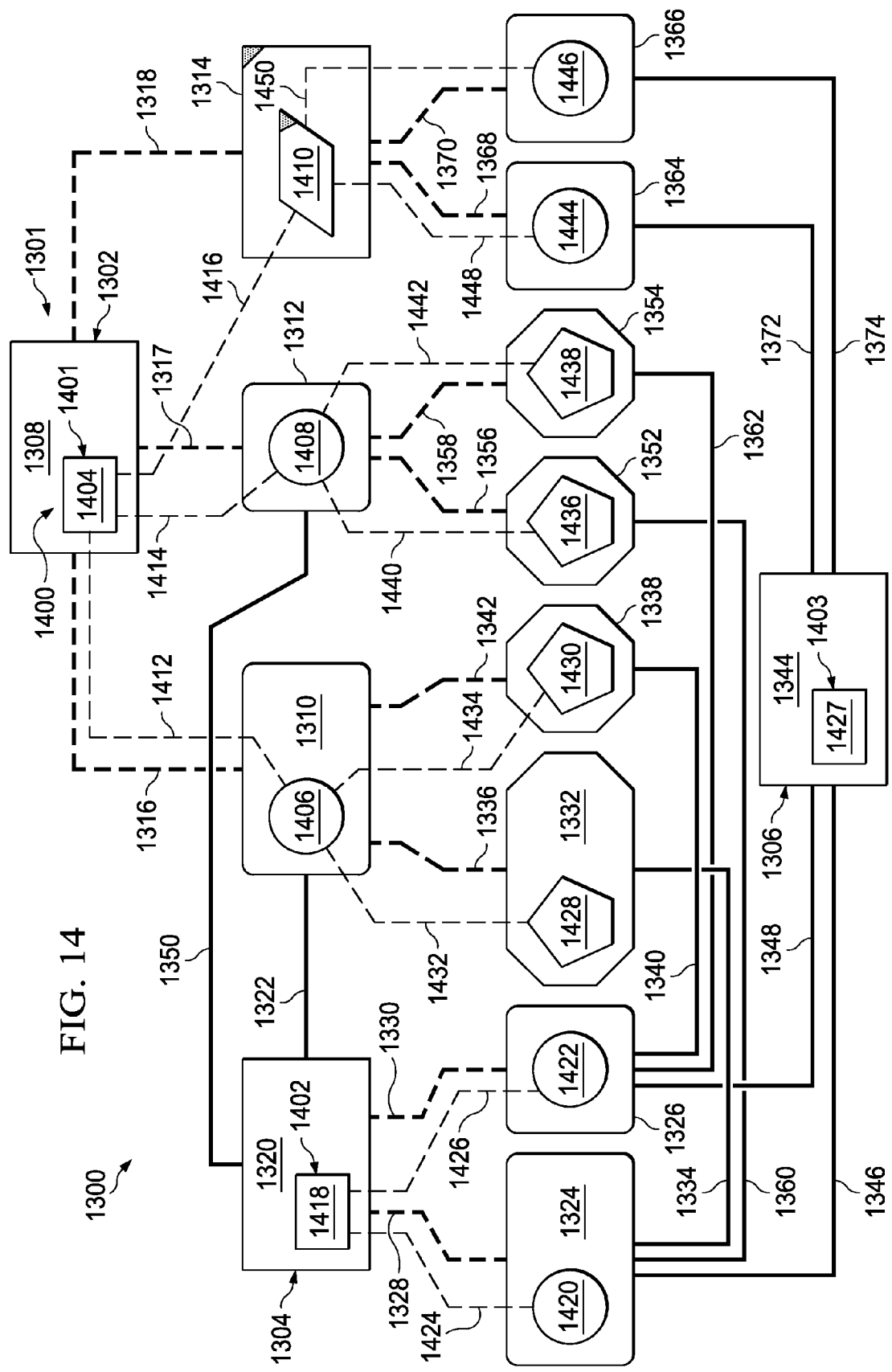
FIG. 14 is an illustration of a model of a six-brick assembly in accordance with an illustrative embodiment.

While the illustrative embodiments described in FIGS. 12-14 may appear to represent six-brick assembly 1200 in a more complex manner than a simple description of the six bricks shown, the illustrative embodiments may minimize the amount of data needed to store all possible variations of six-brick assembly 1200. For example, if the size or position of any given brick in six-brick assembly 1200 changes, then the illustrative embodiments allow for the minimum amount of data needed to store all possible variations of six-brick assembly 1200.

If six-brick assembly 1200 were to be replaced by an aircraft model comprising 500,000 components, each of which may vary in different individual aircraft, then the illustrative embodiments may provide a very substantial savings in both storage space for storing all such representations and also save processing overhead used to process such different representations. The illustrative embodiments shown in FIGS. 12-14 do not serve to limit the claimed invention.

In this illustrative example, six-brick assembly 1200 may comprise lower two-brick assembly 1202, middle two-brick assembly 1204, and top two-brick assembly 1206. Lower two-brick assembly 1202 may comprise brick 1208 and brick 1210. Middle two-brick assembly 1204 may comprise brick 1212 and brick 1214. Top two-brick assembly 1206 may comprise brick 1216 and brick 1218. Bricks 1208, 1210, 1212, 1214, 1216, and 1218 may be different usages of a particular type of brick.

FIG. 13 is an illustration of a model of a six-brick assembly as depicted in accordance with an illustrative embodiment. Model 1300 may be an example of one manner in which a product structure for six-brick assembly 1200 in FIG. 12 may be modeled. Model 1300 may be an example of one implementation for model 114 in FIG. 1.

As depicted, model 1300 comprises primary hierarchical organization 1301. Primary hierarchical organization 1301 may include main structure 1302, associated structure 1304, and associated structure 1306. As depicted, reusable definition object 1308 may represent six-brick assembly 1200 in FIG. 12. Usage object 1310, usage object 1312, and in-place definition object 1314 may be child objects of reusable definition object 1308, as indicated by primary structural link 1316, primary structural link 1317, and primary structural link 1318, respectively.

Usage object 1310 may be an instantiation of reusable definition object 1320, as indicated by primary instance link 1322. Reusable definition object 1320 may represent a two-brick assembly.

In this illustrative example, usage object 1324 and usage object 1326 may be the child objects of reusable definition object 1320, as indicated by primary structural link 1328 and primary structural link 1330, respectively. When usage object 1310 is created in model 1300 to instantiate reusable definition object 1320, usage object 1324 may be instantiated as occurrence object 1332, as indicated by primary instance link 1334. Occurrence object 1332 may be a child object of usage object 1310, as indicated by primary structural link 1336. Occurrence object 1332 may represent brick 1212 in middle two-brick assembly 1204 in FIG. 12.

Further, usage object 1326 may be instantiated as occurrence object 1338, as indicated by primary instance link 1340. Occurrence object 1338 may be a child object of usage object 1310, as indicated by primary structural link 1342. Occurrence object 1338 may represent brick 1214 in middle two-brick assembly 1204 in FIG. 12. In this manner, all child objects of reusable definition object 1320 may be instantiated as occurrence objects that are child objects of usage object 1310 when usage object 1310 is created.

Usage object 1324 and usage object 1326 may both be instantiations of reusable definition object 1344, as indicated by primary instance link 1346 and primary instance link 1348, respectively. Reusable definition object 1344 may represent a brick. Usage object 1324 may represent a left brick in a two-brick assembly and usage object 1326 may represent a right brick in a two-brick assembly. Further, usage object 1310 may represent middle two-brick assembly 1204 in FIG. 2.

Similarly, usage object 1312 may also be an instantiation of reusable definition object 1320, as indicated by primary instance link 1350. Usage object 1312 may represent lower two-brick assembly 1202 in FIG. 2. As depicted, occurrence object 1352 and occurrence object 1354 may be child objects of usage object 1312, as indicated by primary structural link 1356 and primary structural link 1358, respectively.

Occurrence object 1352 may be an instantiation of usage object 1324, as indicated by primary instance link 1360. Further, occurrence object 1352 may represent brick 1208 in lower two-brick assembly 1202 in FIG. 12. Occurrence object 1354 may be an instantiation of usage object 1326, as indicated by primary instance link 1362. Further, occurrence object 1354 may represent brick 1210 in lower two-brick assembly 1202 in FIG. 12.

In this illustrative example, in-place definition object 1314 may represent top two-brick assembly 1206 in FIG. 12. Usage object 1364 and usage object 1366 may be child objects of in-place definition object 1314, as indicated by primary structural link 1368 and primary structural link 1370, respectively.

Both usage object 1364 and usage object 1366 may be instantiations of reusable definition object 1344, as indicated by primary instance link 1372 and primary instance link 1374, respectively. Usage object 1364 may represent brick 1216 in top two-brick assembly 1206 in FIG. 12. Usage object 1366 may represent brick 1218 in top two-brick assembly 1206 in FIG. 12.

In this manner, associated structure 1306 may comprise reusable definition object 1344. Associated structure 1304 may comprise reusable definition object 1320, usage object 1324, and usage object 1326. Further, main structure 1302 may include reusable definition object 1308, usage object 1310, usage object 1312, in-place definition object 1314, occurrence object 1332, occurrence object 1338, occurrence object 1352, occurrence object 1354, usage object 1364, and usage object 1366.

FIG. 14 is an illustration of a model of a six-brick assembly as depicted in accordance with an illustrative embodiment. In this illustrative example, secondary hierarchical organization 1400 has been added to model 1300. Secondary hierarchical organization 1400 may be associated with primary hierarchical organization 1301.

Secondary hierarchical organization 1400 may be added to represent a standard configuration for six-brick assembly 1200 in FIG. 12. As one illustrative example, secondary hierarchical organization 1400 may represent the standard configuration for six-brick assembly 1200 in which none of the bricks in six-brick assembly 1200 in FIG. 12 have any holes.

In this illustrative example, an initial secondary hierarchical organization, such as secondary hierarchical organization 1400, that is to be associated with primary hierarchical organization 1301 may be created in a manner such that secondary hierarchical organization 1400 comprises at least one configuration object associated with each master object in primary hierarchical organization 1301. Consequently, secondary hierarchical organization 1400 may be similar to primary hierarchical organization 1301.

Secondary hierarchical organization 1400 may include main structure 1401, associated structure 1402, and associated structure 1403. In these illustrative examples, adding and associating secondary hierarchical organization 1400 with primary hierarchical organization 1301 may include adding and associating main structure 1401 with main structure 1302, associated structure 1402 with associated structure 1304, and associated structure 1403 with associated structure 1306.

Reusable definition configuration object 1404 may be added to reusable definition object 1308 to represent the standard configuration for six-brick assembly 1200 in FIG. 12 in which none of the bricks have holes. Reusable definition configuration object 1404 may be the root object for main structure 1401 in secondary hierarchical organization 1400.

Usage configuration object 1406, usage configuration object 1408, and in-place definition configuration object 1410 may be the child objects of reusable definition configuration object 1404, as indicated by secondary structural link 1412, secondary structural link 1414, and secondary structural link 1416, respectively.

Usage configuration object 1406 may be an instantiation of reusable definition configuration object 1418 corresponding to reusable definition object 1320. In FIG. 14, secondary instance links that are present in model 1300 are not shown in FIG. 14. For example, in model 1300, a secondary instance link (not shown) may be present between usage configuration object 1406 and reusable definition configuration object 1418.

Usage configuration object 1420 and usage configuration object 1422 may be child objects of reusable definition configuration object 1418, as indicated by secondary structural link 1424 and secondary structural link 1426, respectively. Reusable definition configuration object 1418 may be the root object of associated structure 1402.

Further, as depicted, usage configuration object 1420 and usage configuration object 1422 may both be instantiations of reusable definition configuration object 1427. Reusable definition configuration object 1427 may be the root object of associated structure 1306. Reusable definition configuration object 1427 may be the only object in associated structure 1306.

Occurrence configuration object 1428 and occurrence configuration object 1430 may be instantiations of usage configuration object 1420 and usage configuration object 1422, respectively. Occurrence configuration object 1428 and occurrence configuration object 1430 may be child objects of usage configuration object 1406, as indicated by secondary structural link 1432 and secondary structural link 1434, respectively.

Usage configuration object 1408 may also be an instantiation of reusable definition configuration object 1418. Occurrence configuration object 1436 and occurrence configuration object 1438 may be child objects of usage configuration object 1408, as indicated by secondary structural link 1440 and secondary structural link 1442, respectively. Further, occurrence configuration object 1436 and occurrence configuration object 1438 may be instantiations of usage configuration object 1420 and usage configuration object 1422, respectively. Additionally, usage configuration object 1444 and usage configuration object 1446 may be child objects of in-place definition configuration object 1410, as indicated by secondary structural link 1448 and secondary structural link 1450, respectfully.

In this manner, associated structure 1403 may comprise reusable definition configuration object 1427. Associated structure 1402 may comprise reusable definition configuration object 1418, usage configuration object 1420, and usage configuration object 1422. Further, main structure 1401 may comprise reusable definition configuration object 1404, usage configuration object 1406, usage configuration object 1408, in-place definition configuration object 1410, occurrence configuration object 1428, occurrence configuration object 1430, occurrence configuration object 1436, occurrence configuration object 1438, usage configuration object 1444, and usage configuration object 1446.

In this manner, secondary hierarchical organization 1400 in model 1300 may represent the logical decomposition of the product structure for the standard configuration for six-brick assembly 1200 in FIG. 12. With secondary hierarchical organization 1400 in place, additional secondary hierarchical organizations may be added to model 1300 to represent variants of six-brick assembly 1200 that vary from this standard configuration.

Figure 15:
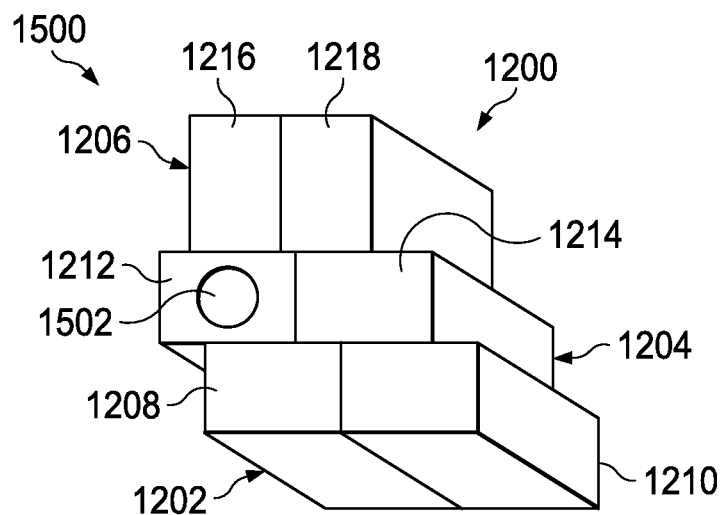
FIG. 15 is an illustration of a variant of a six-brick assembly in accordance with an illustrative embodiment.

FIG. 15 is an illustration of a variant of a six-brick assembly as depicted in accordance with an illustrative embodiment. In FIG. 15, variant 1500 of six-brick assembly 1200 may be depicted. Variant 1500 of six-brick assembly 1200 in FIG. 15 may differ from six-brick assembly 1200 in FIG. 12 by having hole 1502 in brick 1212 in middle two-brick assembly 1204.

Figure 16:
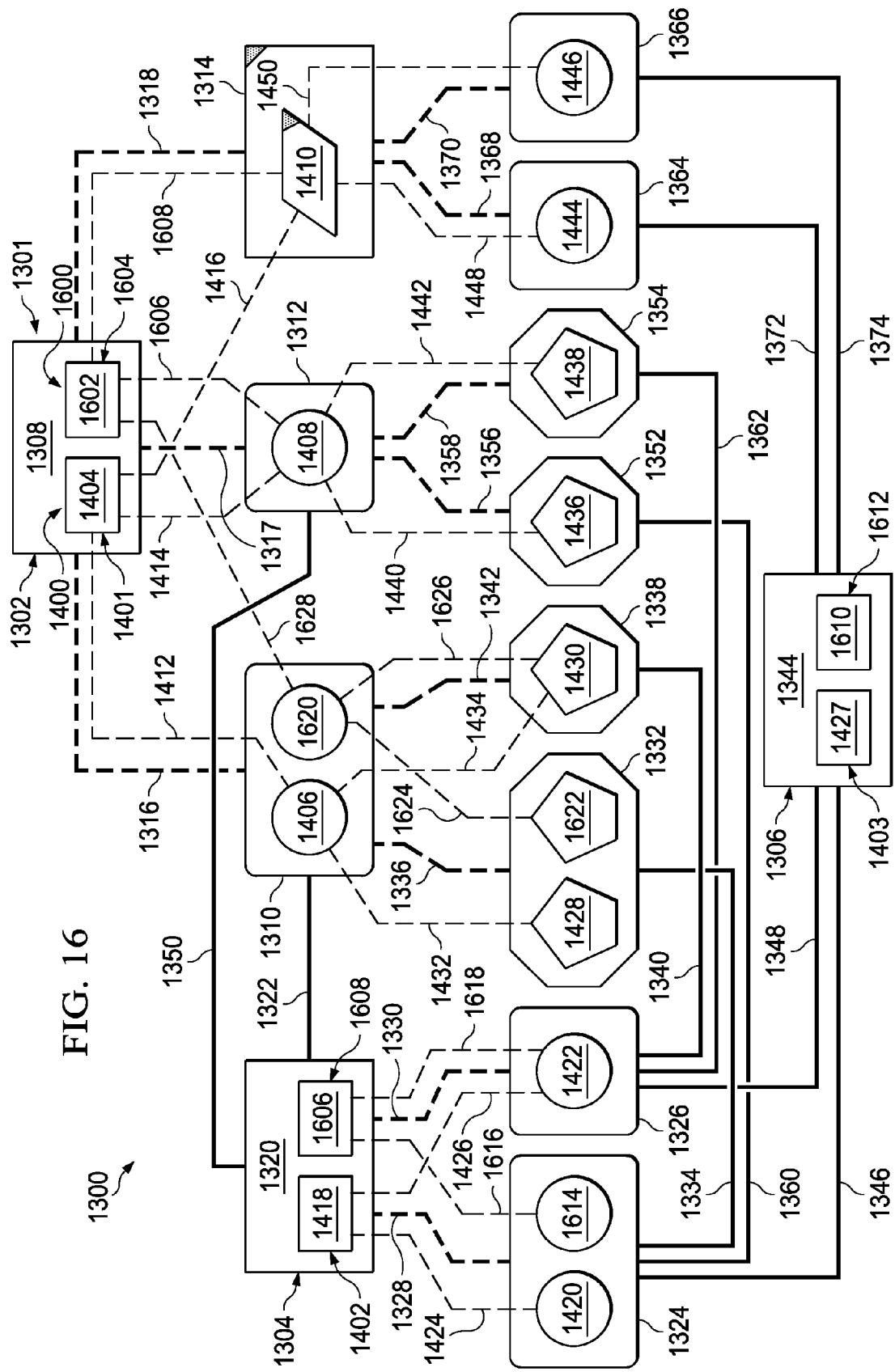
FIG. 16 is an illustration of a model of a six-brick assembly in accordance with an illustrative embodiment.

FIG. 16 is an illustration of a model for a six-brick assembly as depicted in accordance with an illustrative embodiment. In this illustrative example, a representation of variant 1500 of six-brick assembly 1200 in FIG. 15 may be added to model 1300. In particular, secondary hierarchical organization 1600 may be added to model 1300.

Adding an additional secondary hierarchical organization, such as secondary hierarchical organization 1600, to model 1300 after an initial secondary hierarchical organization, such as secondary hierarchical organization 1400, has already been created may not require adding an additional configuration object to each master object in primary hierarchical organization 1301. Instead, secondary hierarchical organization 1600 may be created such that secondary hierarchical organization 1600 shares a number of configuration objects with secondary hierarchical organization 1400. Thus, data storage space and processing power used in representing both secondary hierarchical organization 1600 and primary hierarchical organization 1301 may be conserved.

In this illustrative example, adding a representation of variant 1500 of six-brick assembly 1200 in FIG. 15 to model 1300 may include adding reusable definition configuration object 1602 to reusable definition object 1308 to represent variant 1500 of six-brick assembly 1200 having hole 1502 in FIG. 15. Reusable definition configuration object 1602 may be the root object of main structure 1604 for secondary hierarchical organization 1600.

Adding a representation of variant 1500 of six-brick assembly 1200 to model 1300 may also include adding reusable definition configuration object 1606 to reusable definition object 1320 to represent hole 1502 in middle two-brick assembly 1204. Reusable definition configuration object 1606 may be the root object of associated structure 1608 for secondary hierarchical organization 1600.

Further, adding a representation of variant 1500 of six-brick assembly 1200 to model 1300 may include adding reusable definition configuration object 1610 to reusable definition object 1344 to represent hole 1502 in brick 1212 in FIG. 15. Reusable definition configuration object 1610 may be the root object of associated structure 1612 for secondary hierarchical organization 1600. Associated structure 1612 may only comprise reusable definition configuration object 1610.

Usage configuration object 1614 may be an instantiation of reusable definition configuration object 1610. In FIG. 16, secondary instance links present in model 1300 may not be shown. Usage configuration object 1614 may be added to usage object 1324 as the child object of reusable definition configuration object 1606, as indicated by secondary structural link 1616.

Further, secondary structural link 1618 may indicate that reusable definition configuration object 1606 shares usage configuration object 1422 with reusable definition configuration object 1418 as a child object. In this manner, associated structure 1608 may comprise reusable definition configuration object 1606, usage configuration object 1614, and usage configuration object 1422.

Usage configuration object 1620 may be added to usage object 1310 as an instantiation of reusable definition configuration object 1606. When usage configuration object 1620 is created, occurrence configuration object 1622 may be added to occurrence object 1332 as an instantiation of usage configuration object 1614.

Usage configuration object 1620 may be the parent object of occurrence configuration object 1622, as indicated by secondary structural link 1624. Further, secondary structural link 1626 may indicate that usage configuration object 1620 shares occurrence configuration object 1430 with usage configuration object 1406 as a child object.

Usage configuration object 1620 may be the child object of reusable definition configuration object 1602, as indicated by secondary structural link 1628. Further, reusable definition configuration object 1602 may share usage configuration object 1408 and in-place definition configuration object 1410 with reusable definition configuration object 1404 as child objects.

In this manner, main structure 1604 may comprise reusable definition configuration object 1602, usage configuration object 1620, usage configuration object 1408, in-place definition configuration object 1410, occurrence configuration object 1428, occurrence configuration object 1622, occurrence configuration object 1430, occurrence configuration object 1436, occurrence configuration object 1438, usage configuration object 1444, and usage configuration object 1446. Hole 1502 in brick 1212 of middle two-brick assembly 1204 in six-brick assembly 1200 may be represented by occurrence configuration object 1622 in main structure 1604.

The illustrations of six-brick assembly 1200 in FIG. 12, variant 1500 of six-brick assembly 1200 in FIG. 15, and model 1300 in FIGS. 13, 14, and 16 are not meant to imply physical or architectural limitations to the manner in which an illustrative embodiment may be implemented. Other components in addition to or in place of the ones illustrated may be used. Some components may be optional.

FIGS. 17-31 are illustrations of graphical user interfaces that provide examples of how to display, in a compact manner, hierarchical organization schemes described with respect to FIGS. 1-16. Thus, FIGS. 17-31 should be viewed as a whole as well as individually.

Figure 17:
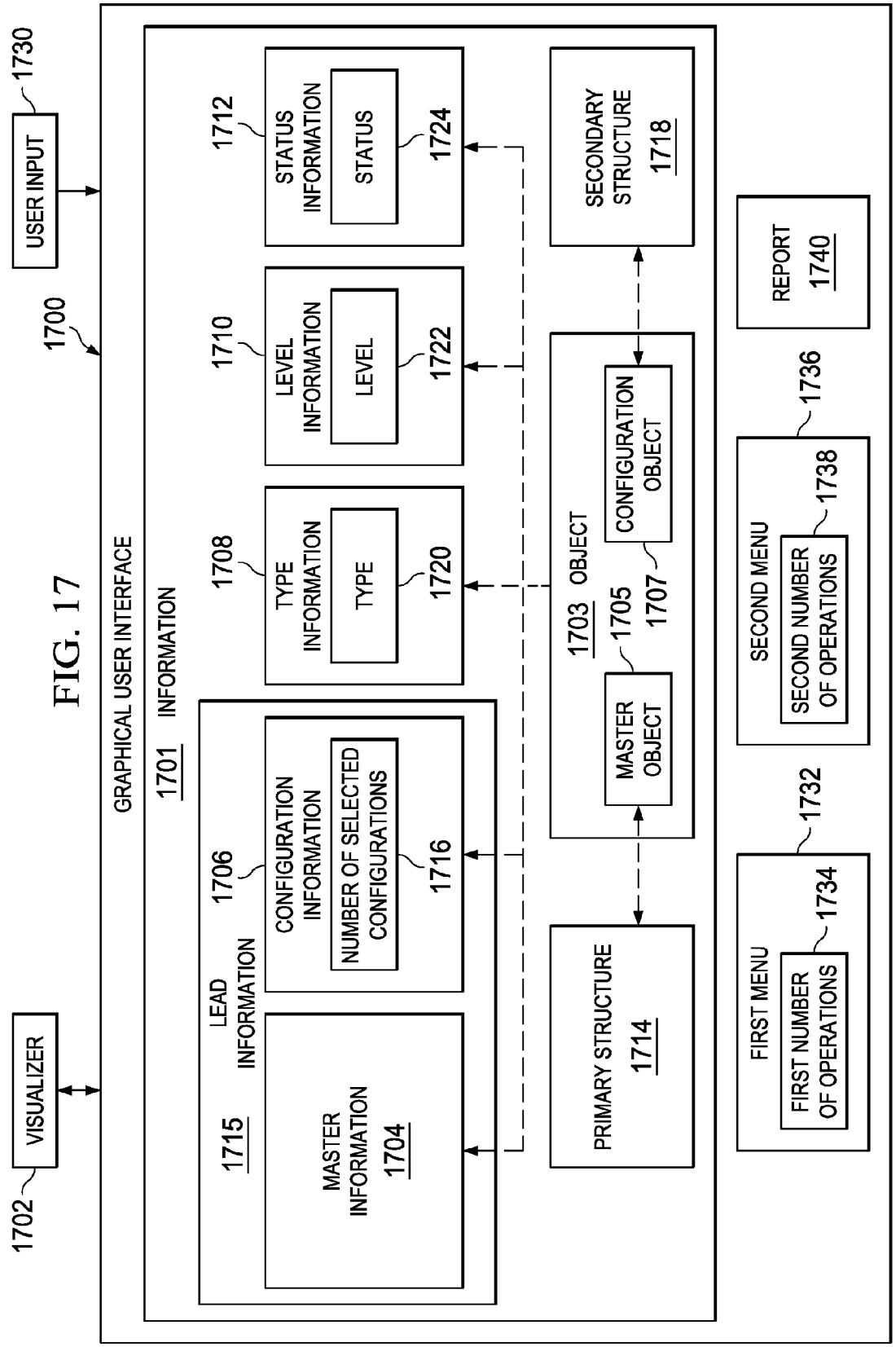
FIG. 17 is an illustration of a graphical user interface in the form of a block diagram in accordance with an illustrative embodiment.

FIG. 17 is an illustration of a graphical user interface in the form of a block diagram as depicted in accordance with an illustrative embodiment. In this illustrative example, graphical user interface 1700 may be an example of one implementation for graphical user interface 160 in FIG. 1.

Visualizer 1702 may be configured to visually present the information in a model, such as, for example, model 114 in FIG. 1, in graphical user interface 1700. Visualizer 1702 may be an example of one implementation of visualizer 158 in FIG. 1. In these illustrative examples, visualizer 1702 may visually present information 1701 about object 1703. Object 1703 may be selected from one of master object 1705 and configuration object 1707. Master object 1705 may be an example of one of group of master objects 128 in FIG. 1. Configuration object 1707 may be an example of one of group of configuration objects 130 in FIG. 1.

Information 1701 may include at least one of master information 1704, configuration information 1706, type information 1708, level information 1710, and status information 1712 about object 1703. Of course, in other illustrative examples, information 1701 may include other types of information.

In these illustrative examples, when object 1703 is master object 1705, master information 1704 may identify master object 1705 and all of the child objects related to master object 1705. In other words, master information 1704 may identify master object 1705 and all of the master objects in primary substructure 1714 of which master object 1705 is at the topmost level. Primary substructure 1714 may be a substructure in the primary hierarchical organization in which master object 1705 belongs.

Further, in these illustrative examples, when object 1703 is master object 1705, master information 1704 may be presented in a hierarchical manner in a single column in graphical user interface 1700. Each master object in primary substructure 1714 may be presented on a different row in this column.

Visualizer 1702 may visually present each object as identified in master information 1704 with an indentation corresponding to a level for the object in primary substructure 1714. For example, master object 1705 may not be indented, because master object 1705 is at the topmost level in primary substructure 1714. Child objects of master object 1705 may be indented with respect to master object 1705 to indicate that these child objects are at a level below master object 1705 in primary substructure 1714.

When object 1703 is master object 1705, configuration information 1706 about object 1703 may include information for number of selected configurations 1716 for master object 1705. Number of selected configurations 1716 may be one or more of the different possible configurations for master object 1705. Any number of configurations for master object 1705 may be selected for display in graphical user interface 1700.

In these illustrative examples, information about each selected configuration in number of selected configurations 1716 may be presented in a different column in graphical user interface 1700. Each row in the information for a selected configuration may identify the configuration object for that selected configuration corresponding to the master object in that same row in master information 1704.

Further, when object 1703 is configuration object 1707, configuration information 1706 may identify information about the particular configuration represented by configuration object 1707. For example, configuration information 1706 may identify configuration object 1707 and all of the child objects related to configuration object 1707. In particular, configuration information 1706 may include all of the configuration objects in secondary substructure 1718 of which configuration object 1707 is at the topmost level. Secondary substructure 1718 may be a substructure in the secondary hierarchical organization in which configuration object 1707 belongs.

Further, in these illustrative examples, when object 1703 is configuration object 1707, configuration information 1706 may be presented in a hierarchical manner in a single column in graphical user interface 1700. Each configuration object in secondary substructure 1718 may be presented on a different row in this column. Further, each configuration object may be indented in a manner corresponding to the level of the configuration object in secondary substructure 1718.

When object 1703 is configuration object 1707, master information 1704 may identify the master object corresponding to configuration object 1707. Further, master information 1704 may identify the master object corresponding to each configuration object identified in configuration information 1706 for configuration object 1707. Each row in master information 1704 may identify the master object corresponding to the configuration object in that same row in configuration information 1706.

In these illustrative examples, lead information 1715 about object 1703 in graphical user interface 1700 may be the information displayed in a first column in graphical user interface 1700. When object 1703 is master object 1705, master information 1704 may be displayed as lead information 1715. When object 1703 is configuration object 1707, configuration information 1706 may be displayed as lead information 1715. Object 1703 may be identified in the first row in lead information 1715.

In these illustrative examples, type information 1708 about object 1703 may identify type 1720 for each object identified in lead information 1715 about object 1703. In these illustrative examples, type 1720 for an object in a particular row in lead information 1715 may be the same for all objects in that same row in graphical user interface 1700. In other words, all master objects and configuration objects in a same row may be of a same type.

Type 1720 for an object may include the class to which the object belongs. For example, when the object is a master object, type 1720 may identify whether the master object belongs to a reusable definition class, a usage class, or an occurrence class. When the object is a configuration object, type 1720 may identify whether the configuration object belongs to a reusable definition configuration class, a usage configuration class, or an occurrence configuration class.

Additionally, in some illustrative examples, type 1720 may identify a subclass of the class for the object. In other illustrative examples, type 1720 may also identify whether the component represented by the object is a mechanical component, an electrical component, an optical component, a logical component, a theoretical component, or some other suitable type or class of component.

Level information 1710 about object 1703 may identify level 1722 for each object identified in lead information 1715 about object 1703. In these illustrative examples, level 1722 for an object in a particular row in lead information 1715 may be the same for all objects in that same row in graphical user interface 1700. In other words, all master objects and configuration objects in a same row may be part of the same level.

Level 1722 for an object may be the level of the object in a hierarchical structure. For example, when the object is a master object, level 1722 may be the level of the master object in a main structure of the primary hierarchical organization to which the object belongs. When the object is a configuration object, level 1722 may be the level of the configuration object in a main structure of the secondary hierarchical organization to which the object belongs. When an object is a root object of the main structure of a hierarchical organization, level 1722 may be zero.

In these illustrative examples, status information 1712 about object 1703 may be displayed when object 1703 is master object 1705. Status information 1712 may identify status 1724 for each master object identified in master information 1704 about master object 1705.

In these illustrative examples, status 1724 for a selected master object in a selected row in master information 1704 may indicate whether any differences are present between the configuration objects corresponding to number of selected configurations 1716 in that same selected row. When object 1703 is a reusable definition object or a reusable definition configuration object, status 1724 may be "top" indicating that the object is the topmost level in the hierarchical structure.

In other words, status 1724 may indicate whether any of the configuration objects in the selected row corresponding to the selected master object in that selected row are different from each other. If any differences are present, status 1724 may be, for example, "modified". If no differences are present, status 1724 may be, for example, "same". Status 1724 may not be based on the comparison of configuration objects corresponding to the master object that is not for one of number of selected configurations 1716.

Additionally, graphical user interface 1700 may be configured to receive user input 1730. User input 1730 may be received through, for example, number of user input devices 166 in FIG. 1. In one illustrative example, user input 1730 may be, for example, a selection of one of the objects identified in master information 1704. In response to this type of user input 1730, visualizer 1702 may visually present first menu 1732 in graphical user interface 1700.

First menu 1732 may list first number of operations 1734. First number of operations 1734 may be selected from a group comprising an information operation, an edit operation, a delete operation, a create configuration operation, a delete configuration operation, a create usage operation, a create in-place definition operation, a new browser operation, a rename operation, a save operation, and/or some other suitable type of operation.

In another illustrative example, user input 1730 may be a selection of one of the objects identified in configuration information 1706 for a selected configuration in number of selected configurations 1716. In response to this type of user input 1730, visualizer 1702 may visually present second menu 1736 in graphical user interface 1700.

Second menu 1736 may list second number of operations 1738. Second number of operations 1738 may be selected from a group comprising a create new configuration operation, an add usage configuration operation, an add definition configuration operation, a remove configuration operation, and/or some other suitable type of operation.

In some illustrative examples, visualizer 1702 may be configured to visually present report 1740 in graphical user interface 1700. Report 1740 may be generated by, for example, data manager 116 in FIG. 1. Report 1740 may compare the different variations in a product structure for the product represented by the model. For example, report 1740 may compare the different variations in product structure 112 for product 102 represented by model 114 in FIG. 1. Report 1740 may comprise at least one of a table, a spreadsheet, a slide presentation, a graph, a chart, a text report, a number of images, a video, an animated report, and some other suitable type of report.

The illustration of graphical user interface 1700 in FIG. 17 is not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

FIGS. 18-31 are illustrations of a graphical user interface as depicted in accordance with an illustrative embodiment. The different types of information that may be visually presented in a graphical user interface for different types of objects in model 1300 in FIG. 16 are depicted in FIGS. 18-31. In particular, different portions of the information in model 1300 in FIG. 16 are visually presented in graphical user interface 1800 described in FIGS. 18-31 below.

Figure 18:
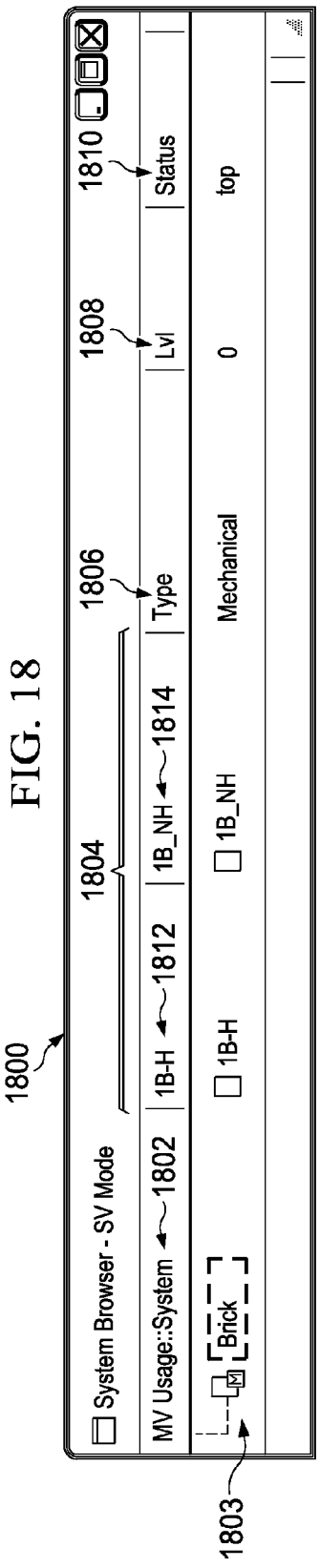
FIG. 18 is an illustration of a graphical user interface in accordance with an illustrative embodiment.

FIG. 18 is an illustration of a graphical user interface as depicted in accordance with an illustrative embodiment. In this illustrative example, graphical user interface 1800 may be an example of one implementation for graphical user interface 160 in FIG. 1. In particular, graphical user interface 1800 may be an example of one implementation for graphical user interface 1700 in FIG. 17.

As depicted, graphical user interface 1800 may visually present master information 1802, configuration information 1804, type information 1806, level information 1808, and status information 1810 about an object. These different types of information are displayed as columns of information in graphical user interface 1800.

In this illustrative example, the object is reusable definition object 1344 in model 1300 in FIG. 16. In these examples, reusable definition object 1344 belongs to associated structure 1306 in primary hierarchical organization 1301 in FIG. 16.

Reusable definition object 1344 is a master object. Consequently, master information 1802 is the lead information displayed in the first column in graphical user interface 1800. Reusable definition object 1344 may not have any child objects. Consequently, only row 1803 may be present for identifying information about reusable definition object 1344.

Master information 1802 may be an example of one implementation for master information 1704 in FIG. 17. The master object in row 1803 of master information 1802 may identify reusable definition object 1344 in FIG. 16.

Configuration information 1804 may be an example of one implementation for configuration information 1706 in FIG. 17. Configuration information 1804 includes information about selected configuration 1812 and selected configuration 1814 for reusable definition object 1344.

The configuration object displayed for selected configuration 1812 in row 1803 may identify reusable definition configuration object 1610 corresponding to reusable definition object 1344 in FIG. 16. The configuration object displayed for selected configuration 1814 may identify reusable definition configuration object 1427 corresponding to reusable definition object 1344 in FIG. 16.

In this manner, a configuration object in a same row as a master object means that the configuration object corresponds to that master object. The configuration object for selected configuration 1812 and the configuration object for selected configuration 1814 may belong to two different hierarchical structures for one or more secondary hierarchical organizations even though these configuration objects correspond to the same master object.

Type information 1806 may be an example of one implementation for type information 1708 in FIG. 17. As depicted, the type displayed in row 1803 of type information 1806 may identify a type for reusable definition object 1344. In particular, this type may identify that a brick represented by reusable definition object 1344 is a mechanical component. The configuration objects identified in row 1803 of selected configuration 1812 and selected configuration 1814 may have the same type as the type of reusable definition object 1344.

Level information 1808 may be an example of one implementation for level information 1710 in FIG. 17. The level displayed in row 1803 of level information 1808 may identify a level for reusable definition object 1344. In particular, the level of "zero" may identify that reusable definition object 1344 is the root object of the hierarchical structure to which reusable definition object 1344 belongs.

The configuration objects identified in row 1803 of selected configuration 1812 and selected configuration 1814 may be at the same level as the level of reusable definition object 1344. In the different illustrative examples, a master object and the one or more configuration objects corresponding to that master object on a same row as the master object may have the same type and may be at the same level in the same hierarchical structure.

Status information 1810 may be an example of one implementation for status information 1712 in FIG. 17. The status displayed in row 1803 of status information 1810 may identify that the configuration objects in row 1803 are root objects. In these illustrative examples, the status for a root object of a hierarchical structure, such as reusable definition object 1344, may be, for example, "top" to indicate that the root object is the topmost level in a hierarchical structure. A status of "modified" may not be needed, because at least one difference is expected between different configurations for the root object.

Figure 19:
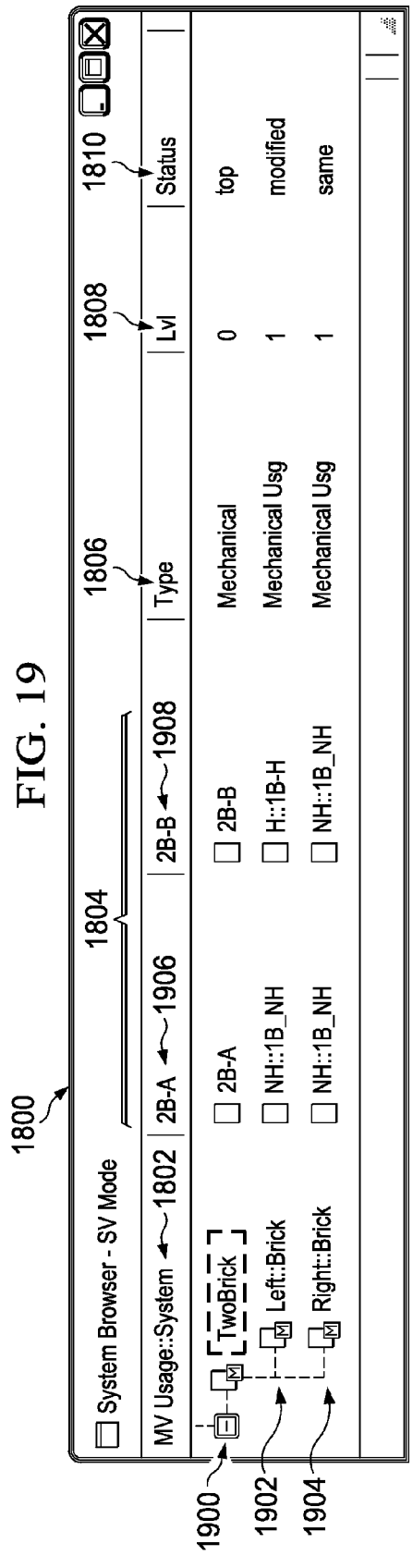

In FIG. 19, graphical user interface 1800 may visually present master information 1802, configuration information 1804, type information 1806, level information 1808, and status information 1810 about reusable definition object 1320 in model 1300 in FIG. 16. Displayed in a first column is a tree structure associated with primary hierarchical organization and master information 1802. Reusable definition object 1320 may be the root object of associated structure 1304 in FIG. 16. Master information 1802 may be the lead information displayed in the first column in graphical user interface 1800 in this depicted example.

As depicted, information about reusable definition object 1320 may be displayed in row 1900, row 1902, and row 1904. The master object identified in row 1900 of master information 1802 may identify reusable definition object 1320 in FIG. 16. Further, the master objects identified in row 1902 and row 1904 of master information 1802 may identify the child objects of reusable definition object 1320.

Configuration information 1804 may include information for selected configuration 1906 and selected configuration 1908. The configuration objects identified for selected configuration 1906 may correspond to the master objects identified in master information 1802. Similarly, the configuration objects identified for selected configuration 1908 may correspond to the master objects identified in master information 1802.

Type information 1806 may identify the type for each master object identified in master information 1802. The master object identified in row 1900 of master information 1802 may be identified as a definition object representing a mechanical component. The master objects identified in row 1902 and row 1904 of master information 1802 may be identified as usage objects representing mechanical components.

Level information 1808 may identify the level for each master object identified in master information 1802. The master object identified in row 1900 of master information 1802 may be at a zero level indicating that the master object is the root object of a hierarchical structure. Further, the master objects identified in row 1902 and row 1904 of master information 1802 may be identified as being at a first level in a hierarchical structure indicating that these master objects are child objects of the root object.

Status information 1810 may identify the status for each master object identified in master information 1802. The status in row 1900 of status information 1810 may indicate that the objects in row 1900 are the root objects of their corresponding hierarchical structures. The status in row 1902 of status information 1810 may indicate that at least one difference is present between the configuration objects for selected configuration 1906 and selected configuration 1908 corresponding to the master object in row 1902 of master information 1802.

Similarly, the status in row 1904 of status information 1810 may indicate that the configuration objects for selected configuration 1906 and selected configuration 1908 corresponding to the master object in row 1902 of master information 1802 are the same.

Figure 20:
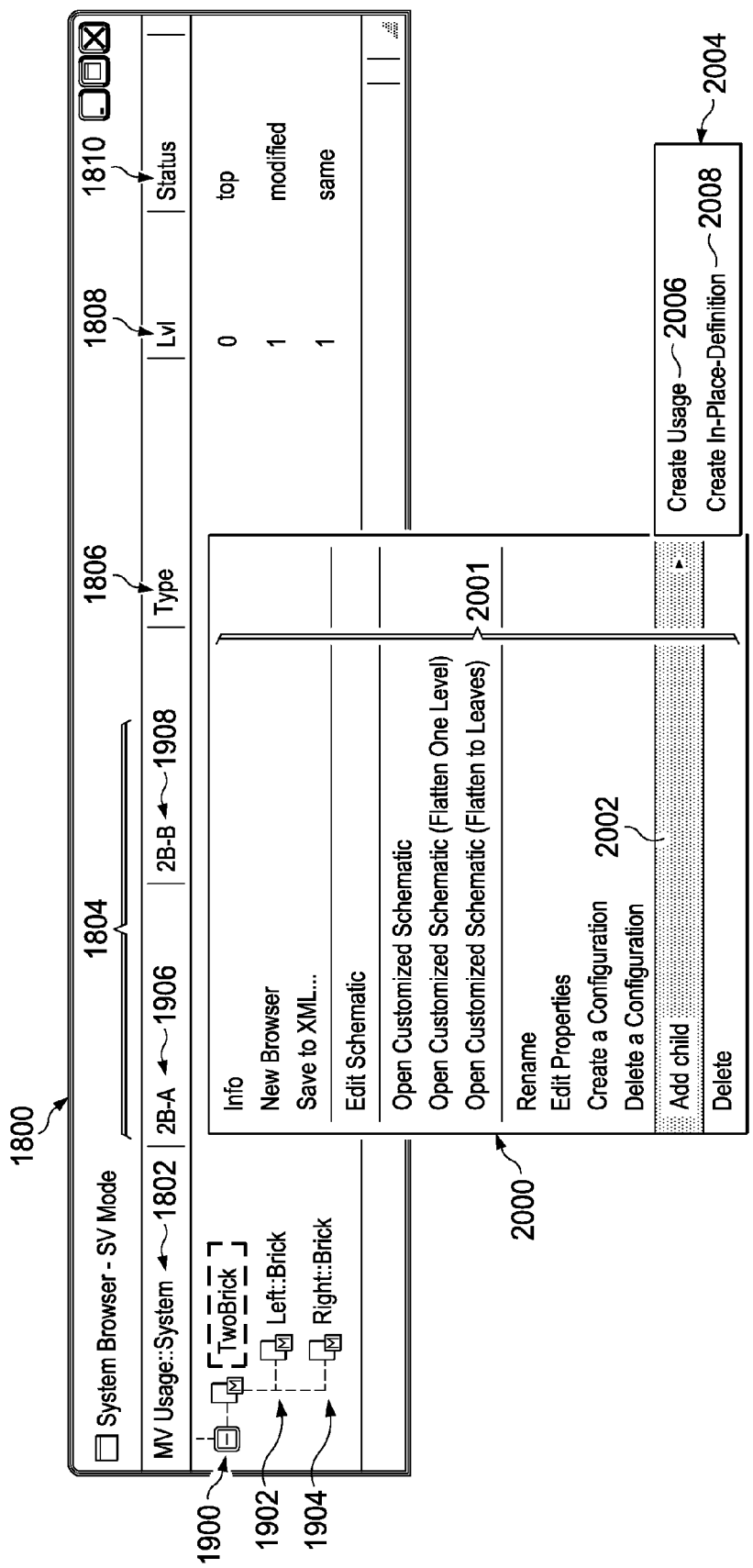

Referring now to FIG. 20, user input selecting the master object in row 1900 of master information 1802 in FIG. 19 may be received. In response to this user input, menu 2000 may be presented in graphical user interface 1800. Menu 2000 may be an example of one implementation for first menu 1732 in FIG. 17. As depicted, menu 2000 may list operations 2001.

A user may select, for example, operation 2002. Operation 2002 may be an operation to add a child object to reusable definition object 1320 in model 1300 in FIG. 16 identified by the master object in row 1900 of master information 1802 in FIG. 19. When user input selecting operation 2002 is received, menu 2004 may be presented in graphical user interface 1800.

Menu 2004 may list operation 2006 and operation 2008. Operation 2006 may be an operation to create a usage object that is to be a child object of reusable definition object 1320 in model 1300 in FIG. 16. Operation 2008 may be an operation to create an in-place definition object as a child object of reusable definition object 1320 in model 1300 in FIG. 16.

Figure 21:
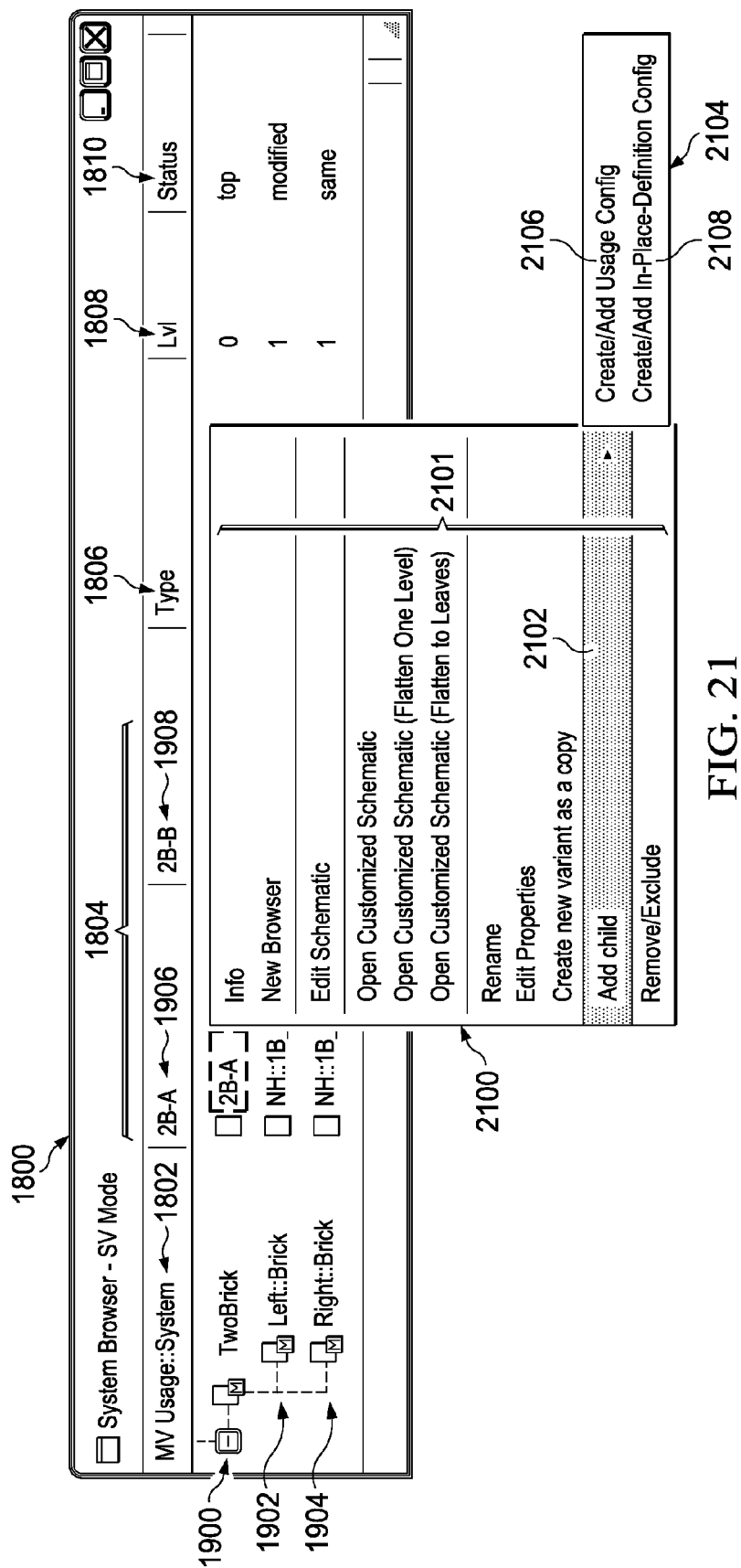

Referring now to FIG. 21, user input selecting the configuration object in row 1900 for selected configuration 1906 in FIG. 19 may be received. In response to this user input, menu 2100 may be presented in graphical user interface 1800. Menu 2100 may be an example of one implementation for second menu 1736 in FIG. 17. As depicted, menu 2100 may list operations 2101.

A user may select, for example, operation 2102. Operation 2102 may be an operation to add a child object to reusable definition configuration object 1418 in model 1300 in FIG. 16. When user input selecting operation 2102 is received, menu 2104 may be presented in graphical user interface 1800.

Menu 2104 may list operation 2106 and operation 2108. Operation 2106 may be an operation to create or add a usage configuration object that is to be a child object of reusable definition configuration object 1418 in model 1300 in FIG. 16. Operation 2108 may be an operation to create or add an in-place definition configuration object as a child object of reusable definition configuration object 1418 in model 1300.

Figure 22:
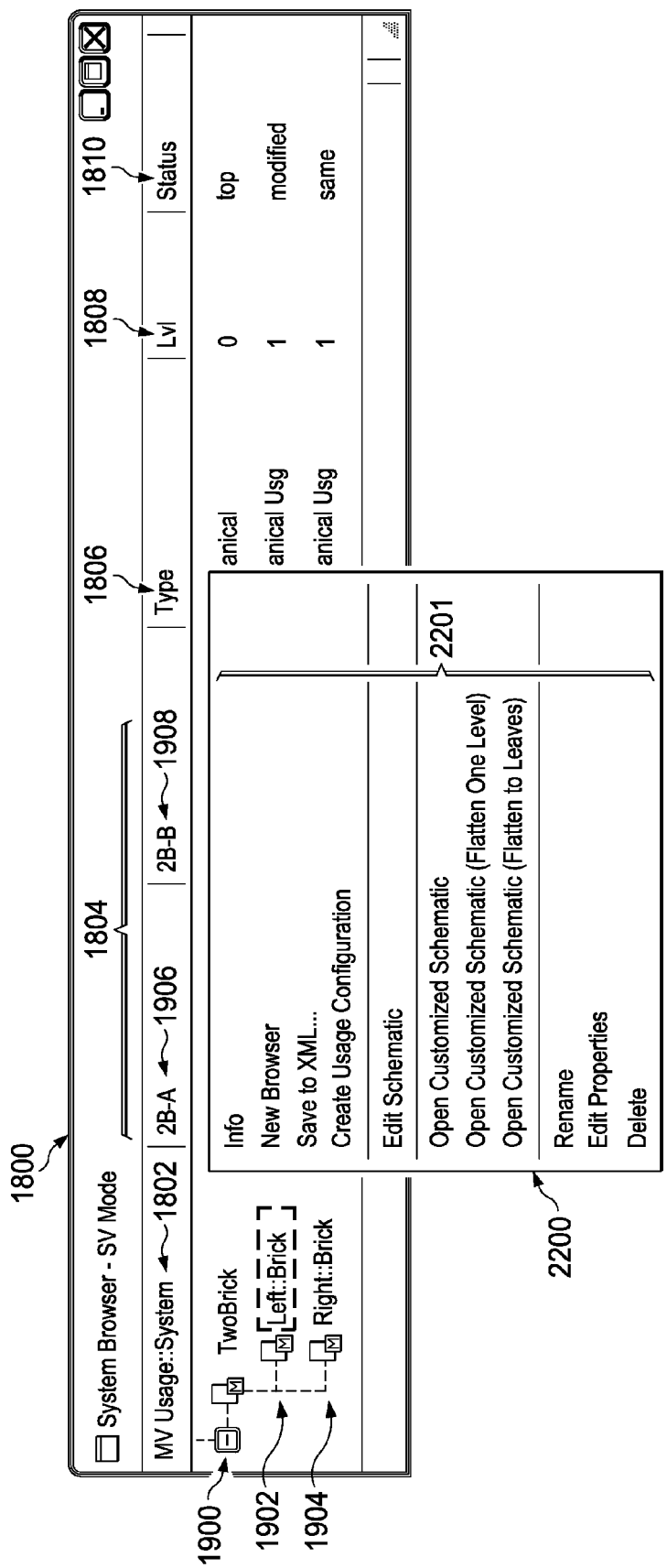

Turning now to FIG. 22, user input selecting the master object identified in row 1902 of master information 1802 in FIG. 19 may be received. In response to receiving this selection, menu 2200 may be presented in graphical user interface 1800. Menu 2200 may list operations 2201.

Figure 23:
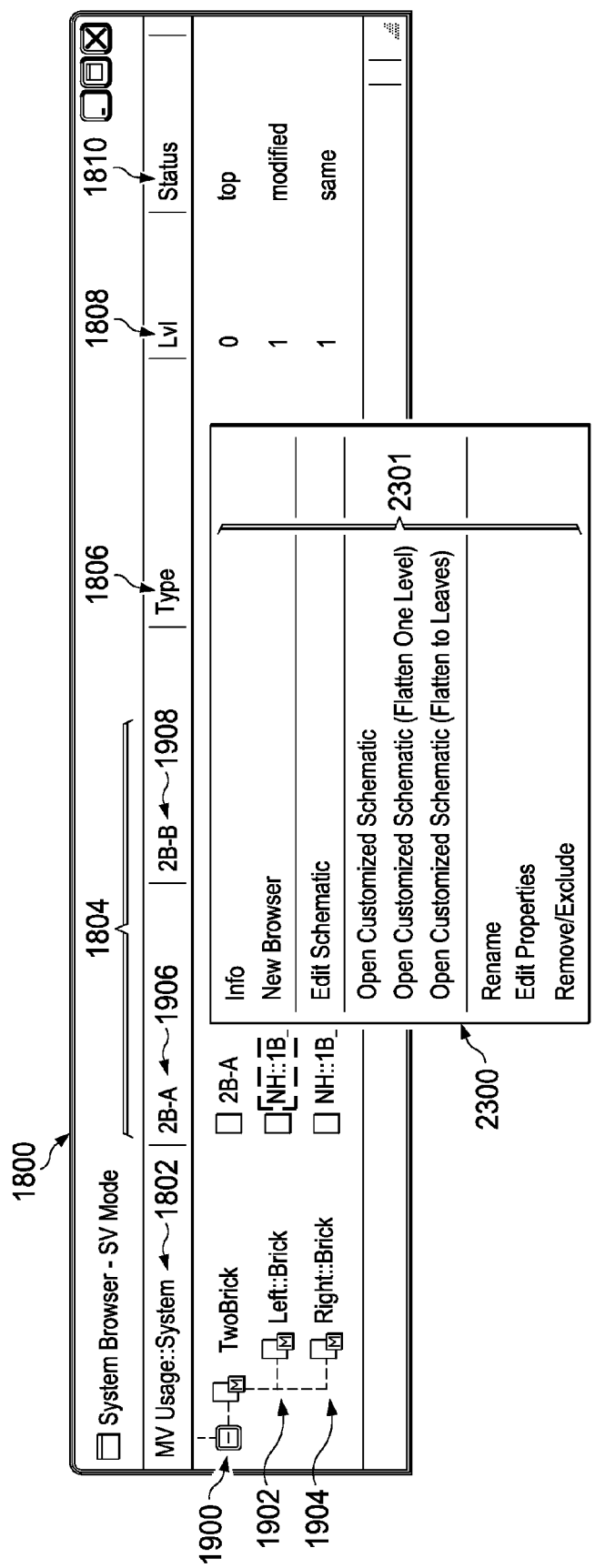

In FIG. 23, user input selecting the configuration object in row 1902 for selected configuration 1906 in FIG. 19 may be received. In response to receiving this selection, menu 2300 may be presented in graphical user interface 1800. Menu 2300 may list operations 2301.

Figure 24:
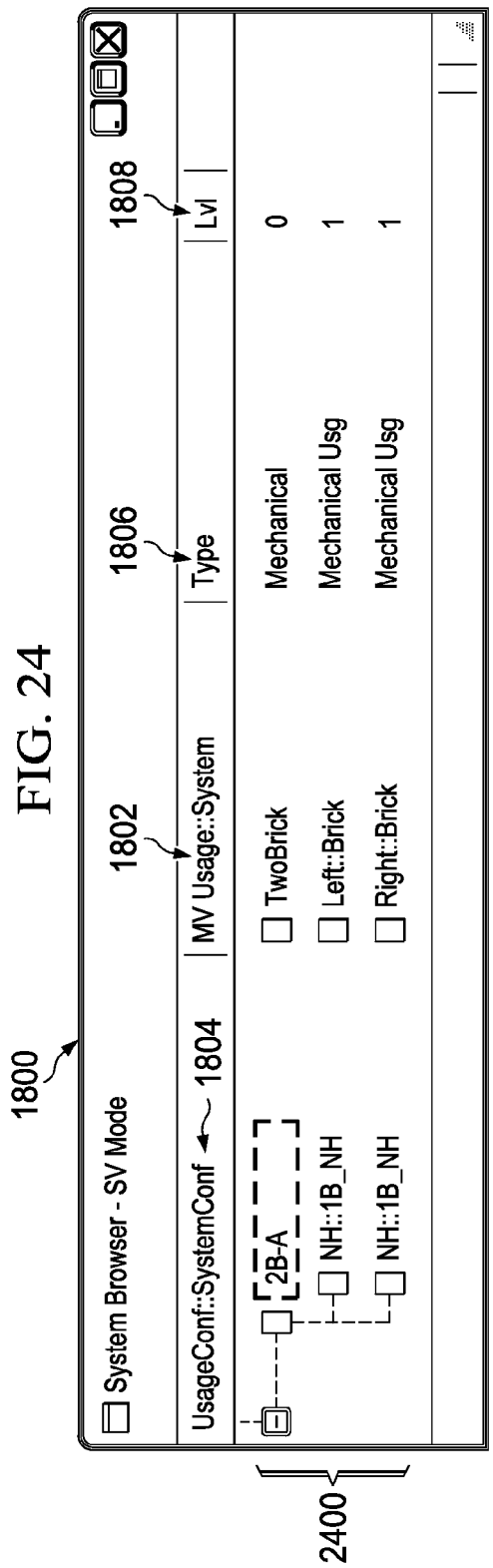

Referring now to FIG. 24, the display of information in graphical user interface 1800 in FIG. 19 may be adjusted to present information with respect to reusable definition configuration object 1418 instead of reusable definition object 1320 in model 1300 in FIG. 16. Reusable definition configuration object 1418 may be a configuration for reusable definition object 1320 in FIG. 16.

Information 2400 may be displayed for reusable definition configuration object 1418. Information 2400 may include configuration information 1804, master information 1802, type information 1806, and level information 1808 for reusable definition configuration object 1418. Configuration information 1804 is the lead information displayed in graphical user interface 1800 in this illustrative example. As depicted, status information is not displayed in this example.

Figure 25:
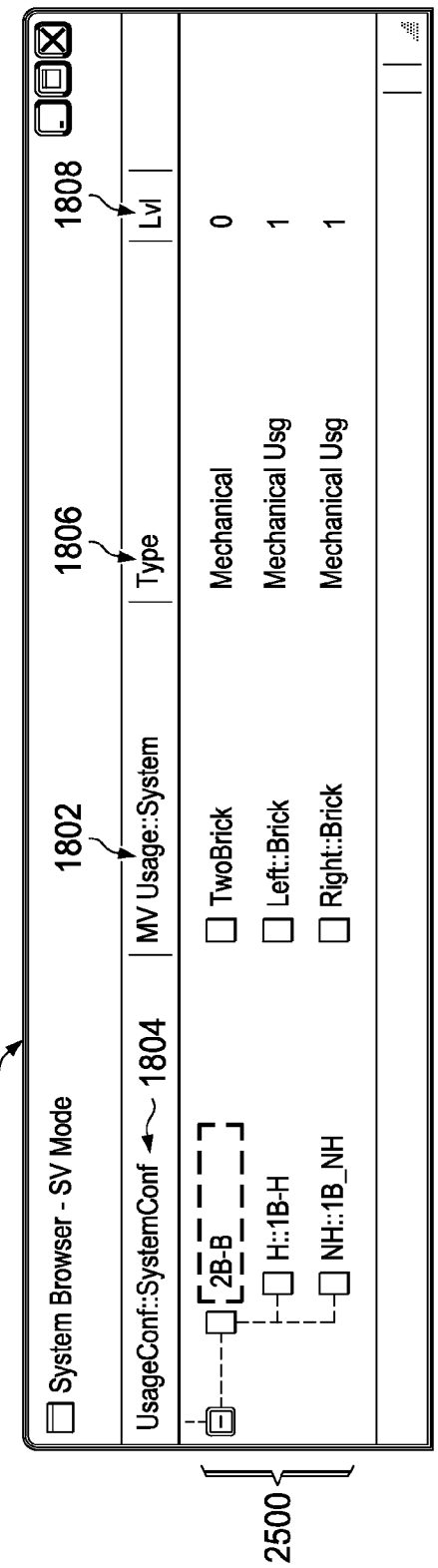

In FIG. 25, information 2500, similar to information 2400 presented in graphical user interface 1800 in FIG. 24, may be presented in graphical user interface 1800 in FIG. 25 for reusable definition configuration object 1606 in FIG. 16. Reusable definition configuration object 1606 may be a different configuration for reusable definition object 1320 as compared to reusable definition configuration object 1418 in FIG. 16.

Figure 26:
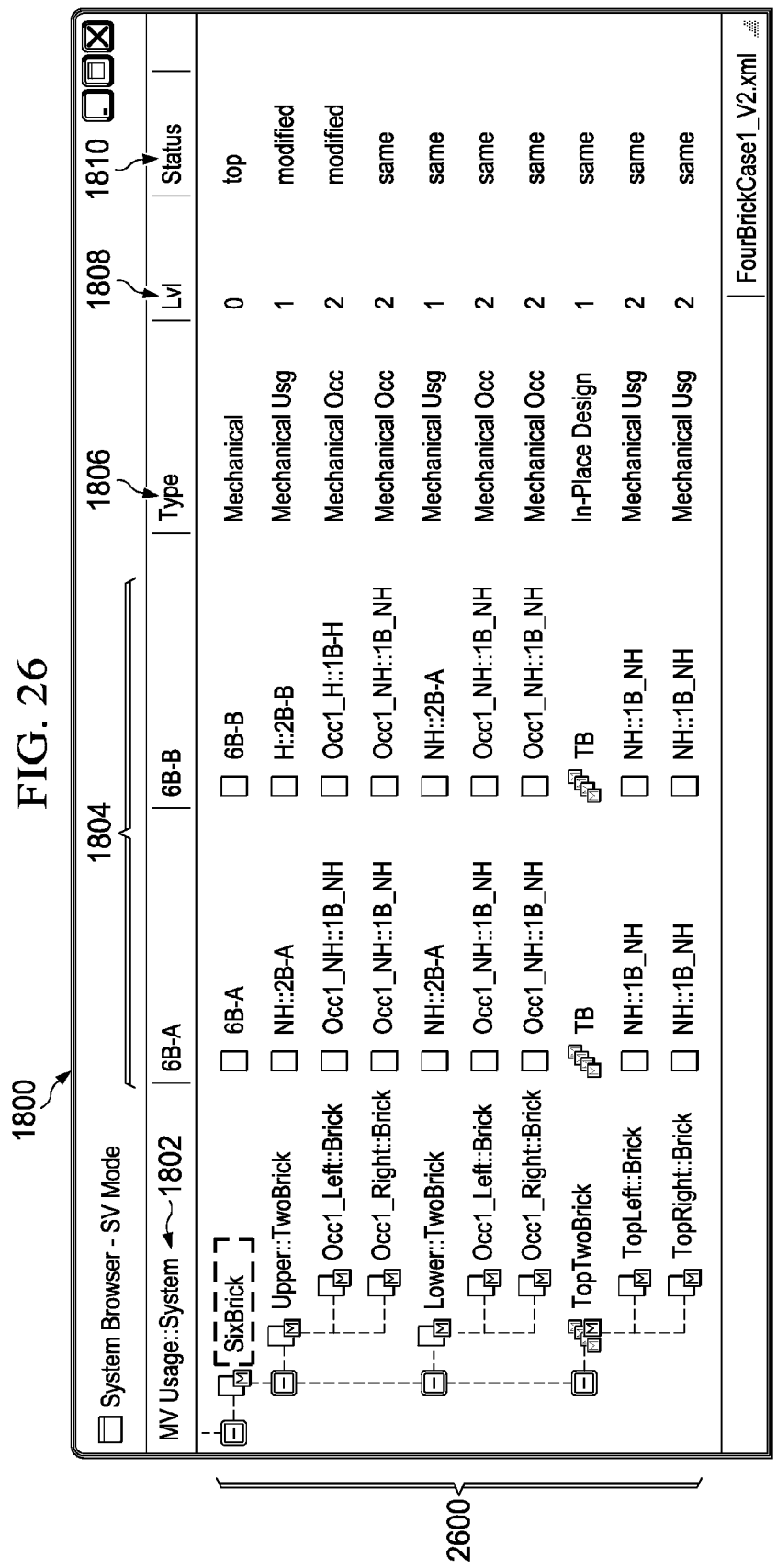

Turning now to FIG. 26, graphical user interface 1800 may visually present information 2600 for reusable definition object 1308 in model 1300 in FIG. 16. In this manner, the variations in the product structure between six-brick assembly 1200 in FIG. 12 and variant 1500 of six-brick assembly 1200 in FIG. 15 may be clearly presented to a user.

Figure 27:
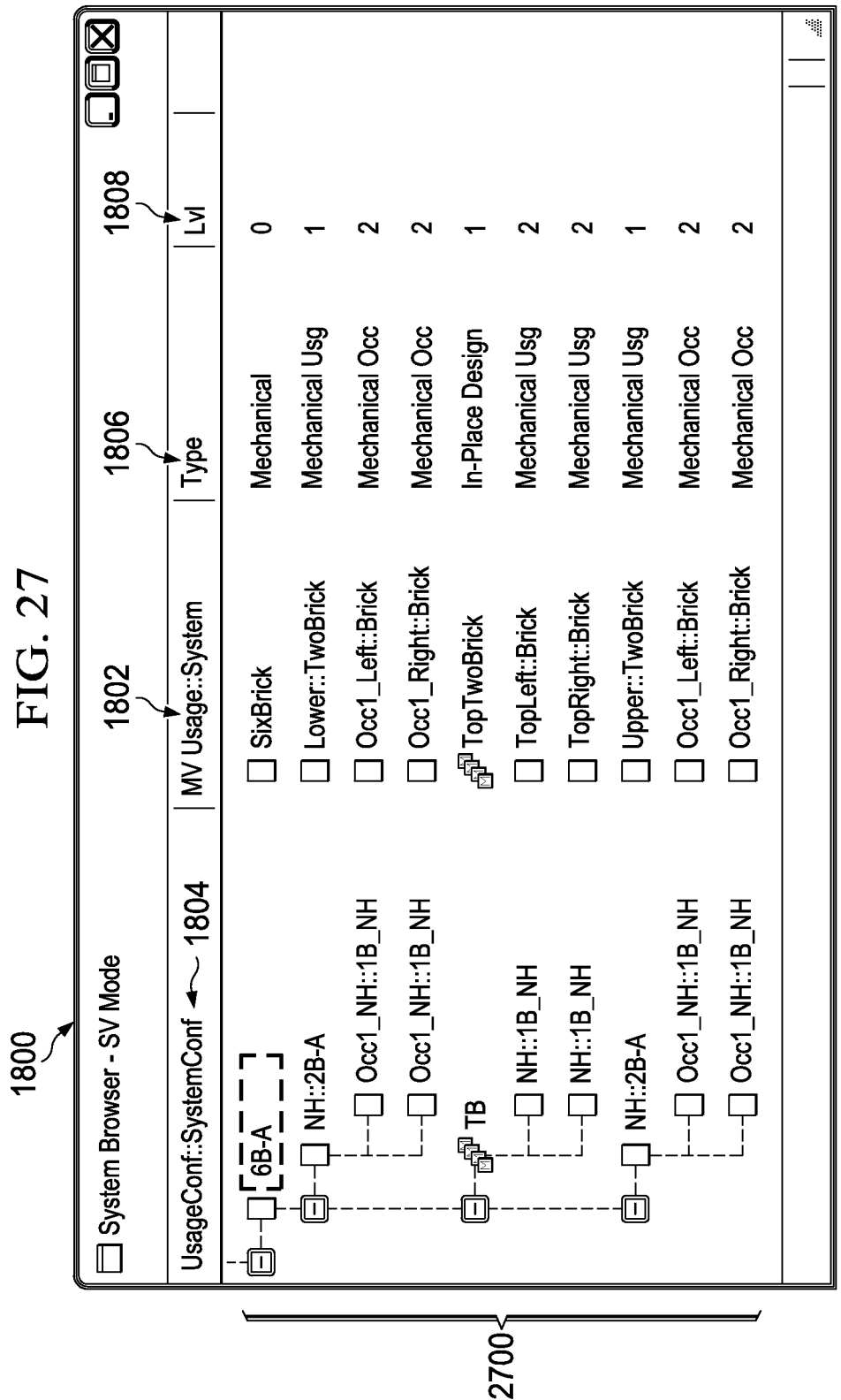

In FIG. 27, graphical user interface 1800 may visually present information 2700 for reusable definition configuration object 1404 in model 1300 in FIG. 16. Reusable definition configuration object 1404 may be one configuration for reusable definition object 1308 in FIG. 16.

Figure 28:
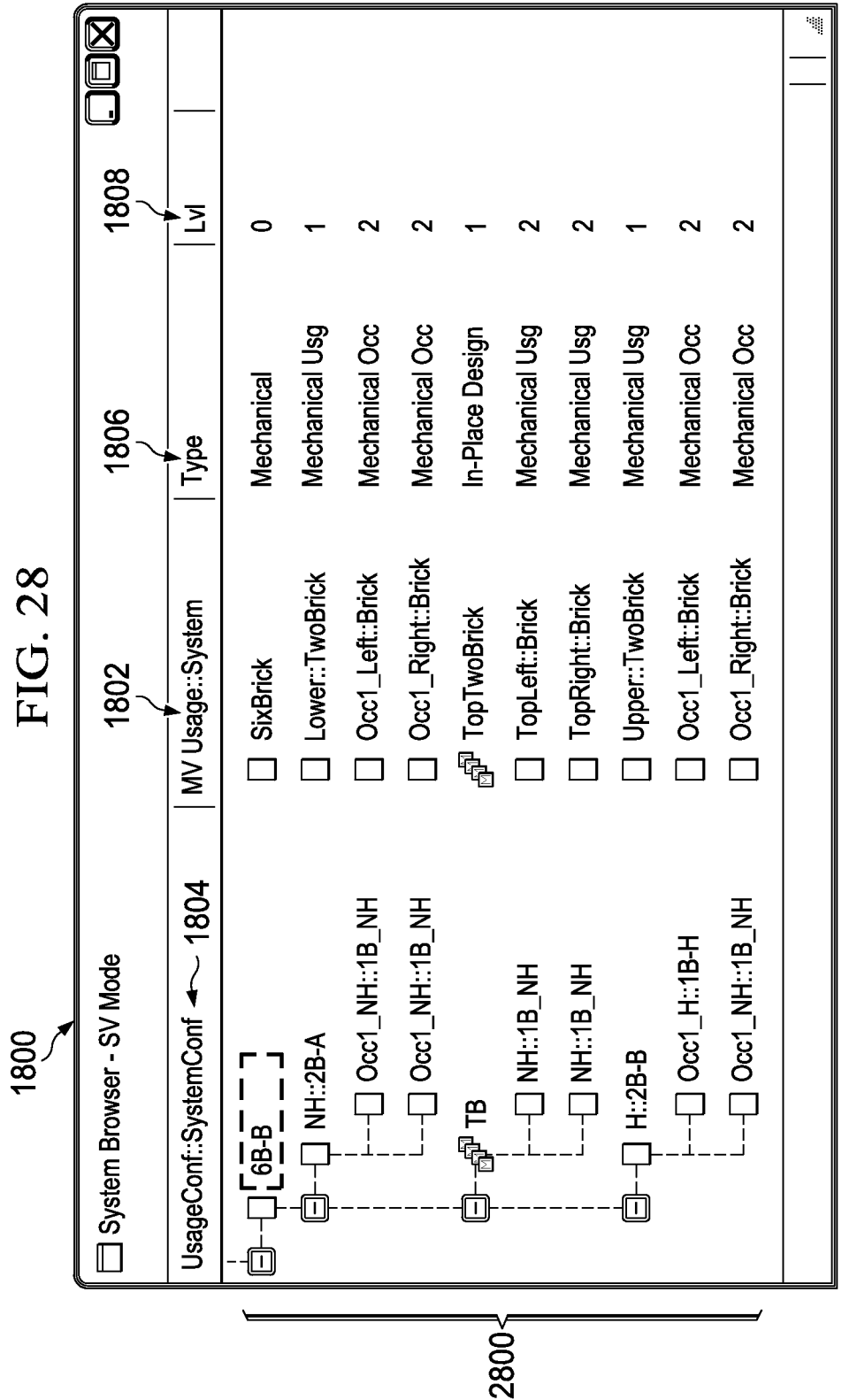

In FIG. 28, graphical user interface 1800 may visually present information 2800 for reusable definition configuration object 1602 in model 1300 in FIG. 16. Reusable definition configuration object 1602 may be one configuration for reusable definition object 1308 in FIG. 16.

In FIG. 29, graphical user interface 1800 may visually present information 2900 about a reusable definition object representing a twelve-brick assembly. The reusable definition object may be the root object in a primary hierarchical organization in a model of the product structure for the twelve-brick assembly.

Figure 30:
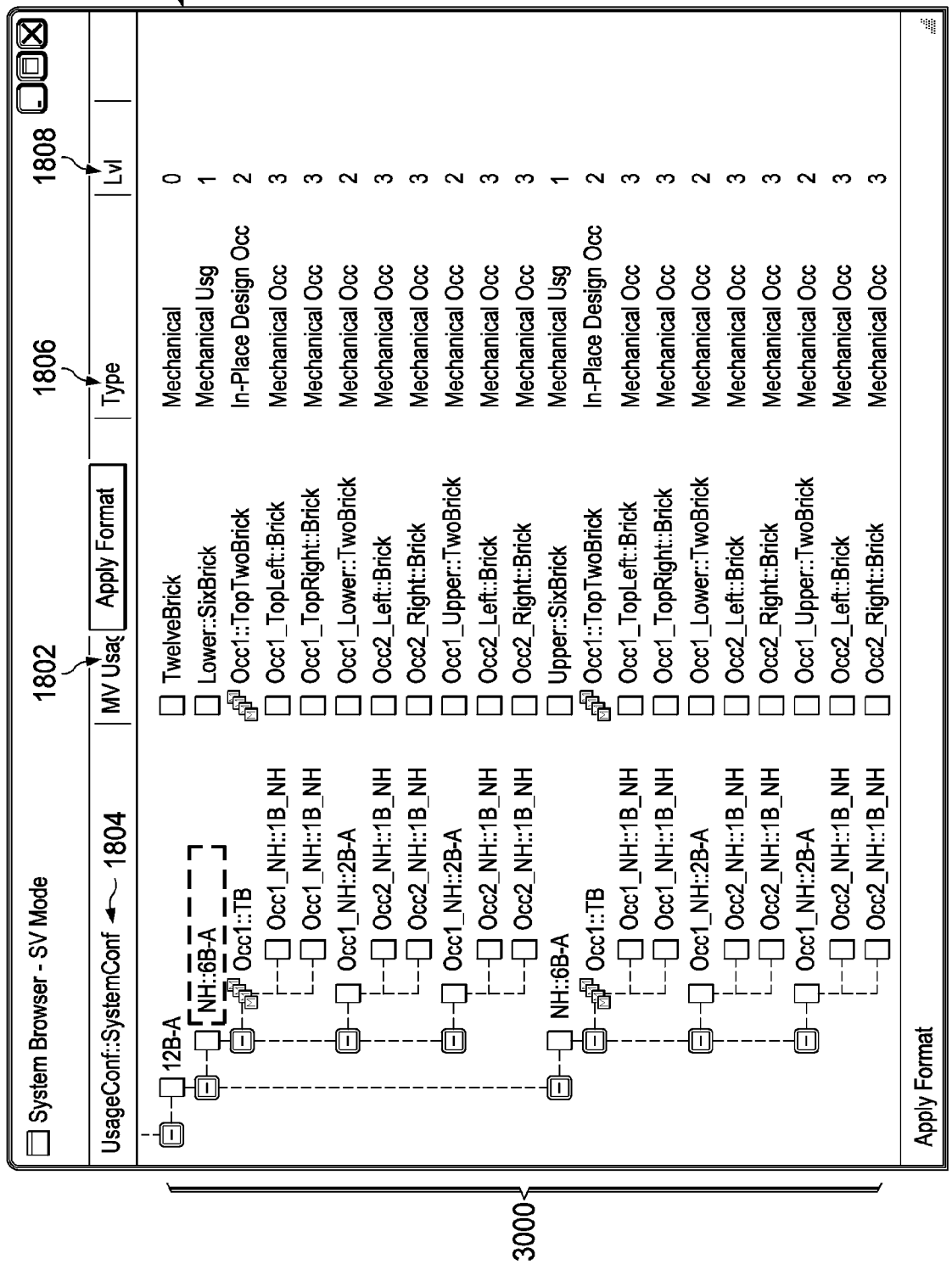

In FIG. 30, graphical user interface 1800 may visually present information 3000 about a reusable definition configuration object representing a configuration for the twelve-brick assembly. The reusable definition configuration object may correspond to the reusable definition object representing the twelve-brick assembly in the model of the product structure for the twelve-brick assembly.

In FIG. 31, graphical user interface 1800 may visually present information 3100 about another reusable definition configuration object representing another configuration for the twelve-brick assembly. This reusable definition configuration object may also correspond to the reusable definition object representing the twelve-brick assembly in the model of the product structure for the twelve-brick assembly.

The illustrations of graphical user interface 1800 in FIGS. 18-31 are not meant to imply physical or architectural limitations to the manner in which an illustrative embodiment may be implemented. Other components in addition to or in place of the ones illustrated may be used. Some components may be optional.

Further, the different components shown in FIGS. 18-31 may be combined with components in FIGS. 1 and/or 17, used with components in FIG. 1 and/or 17, or a combination of the two. Additionally, some of the components in FIGS. 18-31 may be illustrative examples of how components shown in block form in FIGS. 1 and/or 17 may actually be implemented.

Figure 32:
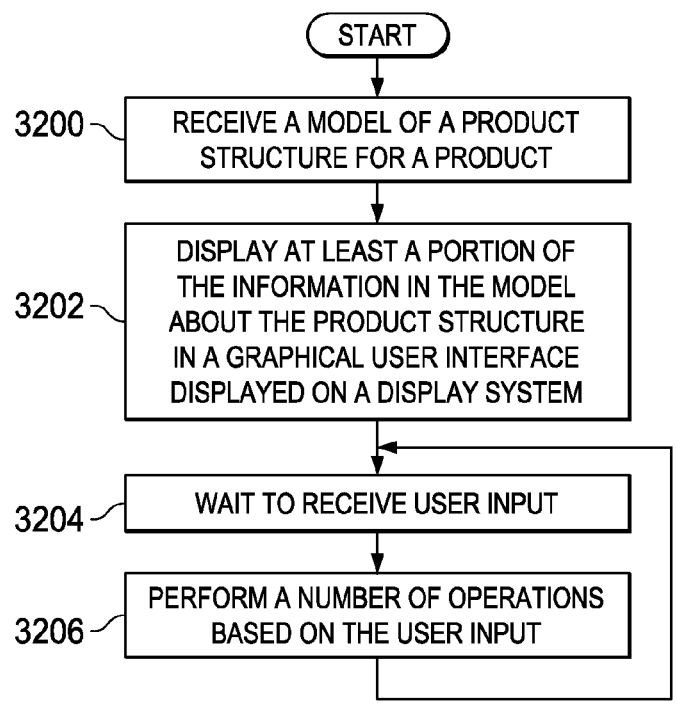
FIG. 32 is an illustration of a process for managing variations in a product structure for a product in the form of a flowchart in accordance with an illustrative embodiment.

FIG. 32 is an illustration of a process for managing variations in a product structure for a product in the form of a flowchart as depicted in accordance with an illustrative embodiment. The process described in FIG. 32 may be implemented using data manager 116 and visualizer 158 in FIG. 1. Further, the process may also be implemented using visualizer 1702 and graphical user interface 1700 in FIG. 17.

Additionally, the process illustrated in FIG. 32 may be implemented using one or more processors, possibly in a networked or distributed environment, such as, but not limited to, data processing system 3400 in FIG. 34 below. As used herein, the terms "data manager" and "visualizer" are not limited to data manager 116 or visualizer 158 in FIG. 1 or visualizer 1702 in FIG. 17 but may also include any processor or set of processors used together with a computer readable medium in order to effectuate the operations described herein. The process illustrated in FIG. 32 may be implemented using software, hardware, or a combination thereof.

The process may begin with receiving a model of a product structure for a product (operation 3200). The model received in operation 3200 may be, for example, model 114 in FIG. 1. This model may capture variations that may be possible in the product structure for the product.

Thereafter, at least a portion of the information in the model about the product structure may be displayed in a graphical user interface displayed on a display system (operation 3202). Then, the process may wait to receive user input (operation 3204). In response to receiving user input, a number of operations may then be performed based on the user input (operation 3206), with the process then returning to operation 3204, as described above.

The model received in operation 3200 may include a group of master objects having a primary hierarchical organization and a group of configuration objects having a number of secondary hierarchical organizations. Each secondary hierarchical organization in the number of secondary hierarchical organizations may be associated with the primary hierarchical organization.

Further, a master object in the group of master objects may be selected from one of a definition object, a usage object, and an occurrence object. A definition object may represent one of the product, a leaf component in the product, and an assembly component in the product. A usage object may represent a usage of a corresponding definition object. An occurrence object may represent an occurrence of one of another corresponding definition object, a corresponding usage object, and a corresponding occurrence object.

A configuration object in the group of configuration objects may be selected from one of a definition configuration object, a usage configuration object, and an occurrence configuration object. The configuration object is a configuration for a corresponding master object in the group of master objects.

The information displayed in the graphical user interface in operation 3202 may include, for example, without limitation, at least one of master information, configuration information, type information, level information, and status information about one or more of the group of master objects. In some cases, at least one of master information, configuration information, type information, level information, and status information may be displayed for one or more of the group of configuration objects.

In this illustrative example, the number of operations performed in operation 3206 in response to receiving the user input may include, for example, without limitation, displaying a menu, adding a master object to the model, adding a configuration to the model, editing or deleting a master object already in the model, editing or deleting a configuration object already in the model, and/or other suitable types of operations. In this manner, different types of operations may be performed based on the user input received through the graphical user interface.

The flowchart and block diagrams in the different depicted embodiments illustrate the architecture, functionality, and operation of some possible implementations of apparatuses and methods in an illustrative embodiment. In this regard, each block in the flowchart or block diagrams may represent a module, segment, function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowchart or block diagrams.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

FIG. 33A and FIG. 33B are a table of terms and descriptions for these terms as depicted in accordance with an illustrative embodiment. In this illustrative example, table 3300 includes terms 3302 and descriptions 3304. Terms 3302 may comprise terms related to the different illustrative embodiments as described in FIGS. 1-32 above. Further, descriptions 3304 are illustrative examples of the definitions for the terms included in terms 3302 in accordance with the usage of these terms in FIGS. 1-32.

Figure 34:
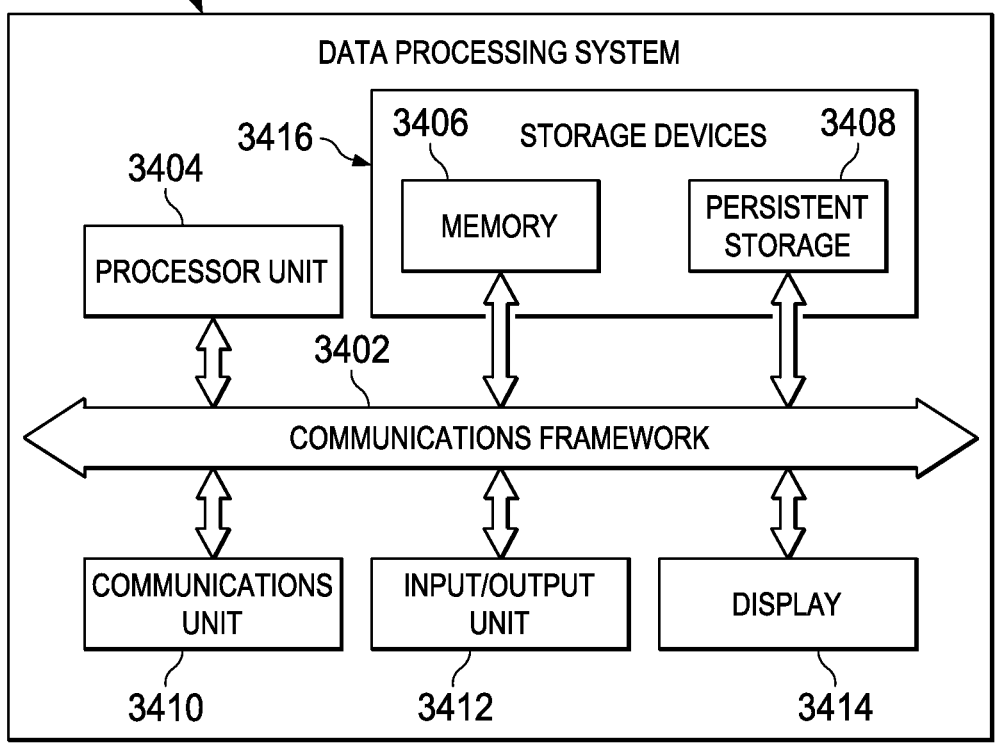
FIG. 34 is an illustration of a data processing system in accordance with an illustrative embodiment.

FIG. 34 is an illustration of a data processing system as depicted in accordance with an illustrative embodiment. In this illustrative example, data processing system 3400 may be used to implement one or more computers in computer system 118 in FIG. 1. In this illustrative example, data processing system 3400 includes communications framework 3402, which provides communications between processor unit 3404, memory 3406, persistent storage 3408, communications unit 3410, input/output (I/O) unit 3412, and display 3414.

Processor unit 3404 serves to execute instructions for software that may be loaded into memory 3406. Processor unit 3404 may be a number of processors, a multi-processor core, or some other type of processor, depending on the particular implementation. A number, as used herein with reference to an item, means one or more items. Further, processor unit 3404 may be implemented using a number of heterogeneous processor systems in which a main processor is present with secondary processors on a single chip. As another illustrative example, processor unit 3404 may be a symmetric multi-processor system containing multiple processors of the same type.

Memory 3406 and persistent storage 3408 are examples of storage devices 3416. A storage device is any piece of hardware that is capable of storing information, such as, for example, without limitation, data, program code in functional form, and/or other suitable information either on a temporary basis and/or a permanent basis. Storage devices 3416 also may be referred to as computer readable storage devices or non-transitory storage devices in these examples. Memory 3406, in these examples, may be, for example, a random access memory or any other suitable volatile or non-volatile storage device. Persistent storage 3408 may take various forms, depending on the particular implementation.

For example, persistent storage 3408 may contain one or more components or devices. For example, persistent storage 3408 may be a hard drive, a flash memory, a rewritable optical disk, a rewritable magnetic tape, or some combination of the above. The media used by persistent storage 3408 also may be removable. For example, a removable hard drive may be used for persistent storage 3408.

Communications unit 3410, in these examples, provides for communications with other data processing systems or devices. In these examples, communications unit 3410 is a network interface card. Communications unit 3410 may provide communications through the use of either or both physical and wireless communications links.

Input/output unit 3412 allows for input and output of data with other devices that may be connected to data processing system 3400. For example, input/output unit 3412 may provide a connection for user input through a keyboard, a mouse, and/or some other suitable input device. Further, input/output unit 3412 may send output to a printer. Display 3414 provides a mechanism to display information to a user.

Instructions for the operating system, applications, and/or programs may be located in storage devices 3416, which are in communication with the processor unit 3404 through communications framework 3402. In these illustrative examples, the instructions are in a functional form on persistent storage 3408. These instructions may be loaded into memory 3406 for execution by processor unit 3404. The processes of the different embodiments may be performed by processor unit 3404 using computer-implemented instructions, which may be located in a memory, such as memory 3406.

These instructions are referred to as program code, computer usable program code, or computer readable program code that may be read and executed by a processor in processor unit 3404. The program code in the different embodiments may be embodied on different physical or computer readable storage media, such as memory 3406 or persistent storage 3408.

Program code 3418 is located in a functional form on computer readable media 3420 that is selectively removable and may be loaded onto or transferred to data processing system 3400 for execution by processor unit 3404. Program code 3418 and computer readable media 3420 form computer program product 3422 in these examples. In one example, computer readable media 3420 may be computer readable storage media 3424 or computer readable signal media 3426.

Computer readable storage media 3424 may include, for example, an optical or magnetic disk that is inserted or placed into a drive or other device that is part of persistent storage 3408 for transfer onto a storage device, such as a hard drive, that is part of persistent storage 3408. Computer readable storage media 3424 also may take the form of a persistent storage, such as a hard drive, a thumb drive, or a flash memory, that is connected to data processing system 3400. In some instances, computer readable storage media 3424 may not be removable from data processing system 3400.

In these examples, computer readable storage media 3424 is a physical or tangible storage device used to store program code 3418 rather than a medium that propagates or transmits program code 3418. Computer readable storage media 3424 is also referred to as a computer readable tangible storage device or a computer readable physical storage device. In other words, computer readable storage media 3424 is a media that can be touched by a person.

Alternatively, program code 3418 may be transferred to data processing system 3400 using computer readable signal media 3426. Computer readable signal media 3426 may be, for example, a propagated data signal containing program code 3418. For example, computer readable signal media 3426 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 3418 may be downloaded over a network to persistent storage 3408 from another device or data processing system through computer readable signal media 3426 for use within data processing system 3400. For instance, program code stored in a computer readable storage medium in a server data processing system may be downloaded over a network from the server to data processing system 3400. The data processing system providing program code 3418 may be a server computer, a client computer, or some other device capable of storing and transmitting program code 3418.

The different components illustrated for data processing system 3400 are not meant to provide architectural limitations to the manner in which different embodiments may be implemented. The different illustrative embodiments may be implemented in a data processing system including components in addition to or in place of those illustrated for data processing system 3400. Other components shown in FIG. 34 can be varied from the illustrative examples shown. The different embodiments may be implemented using any hardware device or system capable of running program code. As one example, the data processing system may include organic components integrated with inorganic components and/or may be comprised entirely of organic components excluding a human being. For example, a storage device may be comprised of an organic semiconductor.

In another illustrative example, processor unit 3404 may take the form of a hardware unit that has circuits that are manufactured or configured for a particular use. This type of hardware may perform operations without needing program code to be loaded into a memory from a storage device to be configured to perform the operations.

For example, when processor unit 3404 takes the form of a hardware unit, processor unit 3404 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a field programmable logic array, a field programmable gate array, and other suitable hardware devices. With this type of implementation, program code 3418 may be omitted, because the processes for the different embodiments are implemented in a hardware unit.

In still another illustrative example, processor unit 3404 may be implemented using a combination of processors found in computers and hardware units. Processor unit 3404 may have a number of hardware units and a number of processors that are configured to run program code 3418. With this depicted example, some of the processes may be implemented in the number of hardware units, while other processes may be implemented in the number of processors.

In another example, a bus system may be used to implement communications framework 3402 and may be comprised of one or more buses, such as a system bus or an input/output bus. Of course, the bus system may be implemented using any suitable type of architecture that provides for a transfer of data between different components or devices attached to the bus system.

Additionally, a communications unit may include a number of devices that transmit data, receive data, or transmit and receive data. A communications unit may be, for example, a modem or a network adapter, two network adapters, or some combination thereof. Further, a memory may be, for example, memory 3406 or a cache, such as found in an interface and memory controller hub that may be present in communications framework 3402.

Thus, the different illustrative embodiments may provide a method and apparatus for managing variations in a product structure for a product using a model for the product structure. In one illustrative embodiment, an apparatus may comprise a data manager and a visualizer. The data manager may be configured to manage the variations in the product structure for the product using a model. The model may include a group of master objects having a primary hierarchical organization and a group of configuration objects having a number of secondary hierarchical organizations. Each secondary hierarchical organization in the number of secondary hierarchical organizations may be associated with the primary hierarchical organization.

A master object in the group of master objects may be selected from one of a definition object, a usage object, and an occurrence object. The definition object may represent one of the product, a leaf component in the product, and an assembly component in the product. The usage object may represent a usage of a corresponding definition object. The occurrence object may represent an occurrence of one of another corresponding definition object, a corresponding usage object, and a corresponding occurrence object. A configuration object in the group of configuration objects may be selected from one of a definition configuration object, a usage configuration object, and an occurrence configuration object. The configuration object may be a configuration for a corresponding master object in the group of master objects.

The visualizer may be configured to visually present information and second information for an object selected from the master object and the configuration object in a graphical user interface.

The description of the different illustrative embodiments has been presented for purposes of illustration and description and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A product management system for managing variations in a product structure for a product, the product management system comprising:
   a processor;
   a data manager, executed by the processor, to manage the variations in the product structure for the product using a model;
      wherein the model includes a group of master objects having a primary hierarchical organization and a group of configuration objects having a number of secondary hierarchical organizations;
      wherein each secondary hierarchical organization in the number of secondary hierarchical organizations is associated with the primary hierarchical organization and is configured to represent a variant of the product in which a number of configuration objects in the each secondary hierarchical organization represents a number of variations in the product structure for the product; and
   a visualizer, executed by the processor, to visually present, in a graphical user interface, information for an object selected from one of a master object in the group of master objects and a configuration object in the group of configuration objects, wherein the visualizer is further configured to:
      present the information in a row having, correspondingly, a first column, and a second column, a third column;
      display in the first column master information for the object, wherein the object comprises a reusable definition object;
      display in the second column and the third column, together, configuration information;
      display in the second column a first reusable definition configuration object information corresponding to the reusable definition object; and
      display in the third column a second reusable definition configuration object information corresponding to the reusable definition object;
   wherein the row has a fifth column, and wherein the visualizer is further configured to visually present in the fifth column level information for the reusable definition object, and wherein the level information comprises a relationship between the reusable definition object and a root object of a hierarchical structure to which the reusable definition object belongs.

2. The product management system of claim 1, wherein at least two secondary hierarchical organizations in the number of secondary hierarchical organizations share a same group of configuration objects.

3. The product management system of claim 1, wherein the object is the master object and wherein the information comprises master information identifying the master object and any child objects related to the master object and configuration information identifying a number of selected configurations for the master object.

4. The product management system of claim 1, wherein the object is the configuration object and wherein the information comprises configuration information identifying the configuration object and any child objects related to the configuration object and master information identifying master objects corresponding to the configuration object and the any child objects related to the configuration object.

5. The product management system of claim 1, wherein the row has a fourth column, and wherein the visualizer is further configured to visually present in the fourth column type information for the reusable definition object.

6. The product management system of claim 5, wherein the row has a sixth column, and wherein the visualizer is further configured to visually present in the sixth column status information for the reusable definition object, and wherein the status information comprises an expression of a comparison of the reusable definition object to the root object.

7. The product management system of claim 1 further comprising:
   a display system, in communication with the processor, and configured to display the graphical user interface, and wherein the graphical user interface is configured to receive user input.

8. The product management system of claim 7, wherein the visualizer is further configured to visually present a menu in the graphical user interface in response to receiving the user input selecting the master object in the first column in which the menu lists a number of operations selected from a group comprising an information operation, an edit operation, a delete operation, a create configuration operation, a delete configuration operation, a create usage operation, a create in-place definition operation, a new browser operation, a rename operation, and a save operation.

9. The product management system of claim 7, wherein the visualizer is further configured to visually present a menu in the graphical user interface in response to receiving the user input selecting the configuration object in the second column in which the menu lists a number of operations selected from a group comprising a create new configuration operation, an add usage configuration operation, an add definition configuration operation, and a remove configuration operation.

10. The product management system of claim 7 further comprising:

a number of user input devices, in communication with the processor, and configured to interact with the graphical user interface, wherein a user enters the user input using the number of user input devices.

11. The product management system of claim 1, wherein the data manager is further configured to generate a report comparing the variations in the model of the product and wherein the visualizer is further configured to visually present the report in the graphical user interface.

12. The product management system of claim 1, wherein the data manager is configured to represent a variant of the product in the model by creating a new secondary hierarchical organization in the model that is associated with the primary hierarchical organization, wherein the variant of the product comprises a number of variations to the product structure for the product.

13. An apparatus for managing variations in a product structure for a product, the apparatus comprising:
   a processor;
   a data manager, executed by the processor, to manage the variations in the product structure for the product using a model;
      wherein the model includes a group of master objects having a primary hierarchical organization and a group of configuration objects having a number of secondary hierarchical organizations associated with the primary hierarchical organization;
      wherein a master object in the group of master objects is selected from one of a definition object, a usage object, and an occurrence object;
      wherein a configuration object in the group of configuration objects is selected from one of a definition configuration object, a usage configuration object, and an occurrence configuration object, wherein the configuration object is a configuration corresponding to the master object of the group of master objects; and
   a visualizer, executed by the processor, to visually present information for an object selected from one of the master object and the configuration object in a graphical user interface, wherein the visualizer is further configured to:
      present the information in a row having, correspondingly, a first column, and a second column, a third column;
      display in the first column master information for the object, wherein the object comprises a reusable definition object;
      display in the second column and the third column, together, configuration information;
      display in the second column a first reusable definition configuration object information corresponding to the reusable definition object; and
      display in the third column a second reusable definition configuration object information corresponding to the reusable definition object;
      wherein the row has a fifth column, and wherein the visualizer is further configured to visually present in the fifth column level information for the reusable definition object, and wherein the level information comprises a relationship between the reusable definition object and a root object of a hierarchical structure to which the reusable definition object belongs.

14. The apparatus of claim 13, wherein the object is the master object and wherein the information comprises at least one of master information identifying the master object and any child objects related to the master object, configuration information identifying a number of selected configurations for the master object, type information for the master object, level information for the master object, and status information for the master object.

15. The apparatus of claim 13, wherein the object is the configuration object and wherein the information comprises at least one of configuration information identifying the configuration object and any child objects related to the configuration object, master information identifying master objects corresponding to the configuration object and the any child objects related to the configuration object, type information for the configuration object, and level information for the configuration object.

16. A computer-implemented method for managing variations in a product structure for a product, the method comprising:
   receiving, at a processor, a model of the product structure for the product;
      wherein the model includes a group of master objects having a primary hierarchical organization and a group of configuration objects having a number of secondary hierarchical organizations;
      wherein each secondary hierarchical organization in the number of secondary hierarchical organizations is associated with the primary hierarchical organization and is configured to represent a variant of the product in which a number of configuration objects in the each secondary hierarchical organization represents a number of variations in the product structure for the product; and
   displaying, using the processor in conjunction with a display system, information for an object selected from one of a master object in the group of master objects and a configuration object in the group of configuration objects in a graphical user interface on the display system, wherein displaying further includes:
      presenting the information in a row having, correspondingly, a first column, and a second column, a third column;
      displaying in the first column master information for the object, wherein the object comprises a reusable definition object;
      displaying in the second column and the third column, together, configuration information;
      displaying in the second column a first reusable definition configuration object information corresponding to the reusable definition object; and
      displaying in the third column a second reusable definition configuration object information corresponding to the reusable definition object;
      wherein the row has a fifth column, and wherein the visualizer is further configured to visually present in the fifth column level information for the reusable definition object, and wherein the level information comprises a relationship between the reusable definition object and a root object of a hierarchical structure to which the reusable definition object belongs.

17. The computer-implemented method of claim 16, wherein the step of displaying the information for the object comprises:
   displaying, using the processor in conjunction with the display system, the information in the graphical user interface, wherein the information includes master information for the object and configuration information for the object.

18. The computer-implemented method of claim 16, wherein the object comprises the master object, wherein displaying the first reusable definition configuration object information comprises displaying a first symbolic representation that indicates a first relationship of the first reusable definition configuration object to the master object, and wherein displaying the second reusable definition configuration object information comprises displaying a second symbolic representation that indicates a second relationship of the second reusable definition configuration object to the master object.

19. The product management system of claim 1, wherein the visualizer is further configured to:
   display in the first column a tree structure associated with the primary hierarchical organization and the master information.

* * * * *